United States Patent [19]
Ohno

[11] Patent Number: 6,100,134
[45] Date of Patent: *Aug. 8, 2000

[54] METHOD OF FABRICATING SEMICONDUCTOR DEVICE

[75] Inventor: Yoshikazu Ohno, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/841,783

[22] Filed: May 5, 1997

[30] Foreign Application Priority Data

Dec. 26, 1996 [JP] Japan ..................... 8-347509

[51] Int. Cl.$^7$ .............................................. H01L 21/8234
[52] U.S. Cl. ......................... 438/253; 438/238; 438/239; 438/254; 438/256; 438/229
[58] Field of Search ..................................... 438/238, 239, 438/253–256, 381, 396–399, 624, 954, 229–233, 299, 305, 364, 309

[56] References Cited

U.S. PATENT DOCUMENTS

| | | | |
|---|---|---|---|
| 5,063,176 | 11/1991 | Lee et al. ................................ | 437/195 |
| 5,206,187 | 4/1993 | Doan et al. . | |
| 5,439,835 | 8/1995 | Gonzalez . | |
| 5,482,894 | 1/1996 | Havemann . | |
| 5,489,546 | 2/1996 | Ahmad et al. ............................ | 437/57 |
| 5,501,998 | 3/1996 | Chen ....................................... | 437/52 |
| 5,578,524 | 11/1996 | Fukase et al. . | |
| 5,770,498 | 6/1998 | Becker .................................... | 438/239 |

FOREIGN PATENT DOCUMENTS

| | | |
|---|---|---|
| 7-235594 | 9/1995 | Japan . |
| 8-46173 | 2/1996 | Japan . |

OTHER PUBLICATIONS

IEEE Cat., No. 87, 1987 Symposium on VLSI Technology—Digest on Technical Papers, pp. 93–94, K. H. Kusters, et al., "A High Density 4MBIT DRAM Process Using a Fully Overlapping Bitline Contact (FoBIC) Trench Cell".

Primary Examiner—Matthew Smith
Assistant Examiner—Belur V. Keshavan
Attorney, Agent, or Firm—Oblon, Spivak, McClelland, Maier & Neustadt, P.C.

[57] ABSTRACT

A method of fabricating a semiconductor device is disclosed for connecting a bit line to a semiconductor substrate in a self-aligned fashion in non-contacting relation to a word line and precluding a crystal defect in the semiconductor substrate which might induce a leakage current. An isolation insulative film (2), gate oxide films (3), gate electrodes (4) (word lines), and insulative films (5) are formed on a semiconductor (e.g., Si) substrate (1) in sequential order, and sidewalls (6a to 6f) are formed while substrate protective oxide films (6g to 6i) are formed so that the semiconductor substrate (1) is not exposed. Source/drain regions (261 to 263) are formed, and an insulative film (7) made of $Si_3N_4$, SiON and the like is deposited. Then, an interlayer insulative film (8) is formed over the top surface. The insulative film (7) has an etching rate lower than that of the interlayer insulative film (8).

18 Claims, 98 Drawing Sheets

METHOD OF FABRICATING SEMICONDUCTOR DEVICE

BACKGROUND OF THE INVENTION

1. Field of the Invention

The present invention relates to a method of fabricating a semiconductor device which includes two interconnect layers (word line and bit line) formed over a semiconductor substrate, a capacitor formed over the interconnect layers, connection electrodes for connecting the bit line and the capacitor to the semiconductor substrate, and a transistor having a gate electrode serving as the word line.

2. Description of the Background Art

FIGS. 111 through 122 are cross-sectional views showing conventional steps of the fabrication of a semiconductor device (DRAM) in sequential order. First, an isolation insulative film 2 is formed on a semiconductor (e.g., Si) substrate 1 by the LOCOS technique, and laminated structures each comprised of a gate oxide film 3, a gate electrode 4, and an insulative film 5 are selectively formed on the semiconductor substrate 1 except where the isolation insulative film 2 is formed (FIG. 111). The gate electrodes 4 are to function as word lines of the DRAM. Then, a silicon oxide film 6 having a thickness of, for example, some hundreds of nanometers is formed over the top surface by the CVD process (FIG. 112).

Anisotropic oxide etching which provides a high etching rate in a direction perpendicular to the semiconductor substrate 1 is performed to leave parts of the silicon oxide film 6 on side walls of the gate oxide films 3, gate electrodes 4, and insulative films 5 to form sidewalls 6a to 6f. Ion implantation is performed using the insulative films 5 and the sidewalls 6a to 6f as a mask to form source/drain regions 261 to 263 in the semiconductor substrate 1 (FIG. 113).

A silicon oxide film is deposited over the top surface by the CVD process to form an interlayer insulative film 8 having a thickness of, for example, some hundreds of nanometers (FIG. 114). A photoresist 10 having a predetermined pattern is formed on the interlayer insulative film 8 by the conventional transfer process. Using the photoresist 10 as a mask, the interlayer insulative film 8 is subjected to an etching process which forms a contact hole 50 to expose the source/drain region 262. Then, the photoresist 10 is removed (FIG. 115).

A conductive film 9 of WSi/poly Si, TiSi/poly Si and the like is formed for connection to the source/drain region 262 through the contact hole 50 (FIG. 116). The conductive film 9 is to function as a bit line of the DRAM.

A silicon oxide film, for example, is deposited over the top surface by the CVD process to form an interlayer insulative film 11 (FIG. 117). A photoresist 12 having a predetermined pattern is formed on the interlayer insulative film 11 by the conventional transfer process (FIG. 118).

Etching the interlayer insulative films 11 and 8 by the same etchant using the photoresist 12 as a mask forms a contact hole 51 to expose the source/drain region 261. Then, the photoresist 12 is removed (FIG. 119).

Poly Si is deposited by the CVD process so as to fill the contact hole 51 to form a capacitor lower electrode 13. The capacitor lower electrode 13 is connected to the source/drain region 261 through the contact hole 51. A $Si_3N_4$ film is deposited over the top surface to form a capacitor dielectric film 14. Poly Si is deposited on the capacitor dielectric film 14 by the CVD process to form a capacitor upper electrode 15 (FIG. 120).

An interlayer insulative film 16 made of, for example, silicon oxide is formed on the capacitor upper electrode 15 by the CVD process (FIG. 121). Interconnect layers 17 made of, for example, AlCu and AlSiCu are selectively formed on the interlayer insulative film 16 (FIG. 122).

The background art method of fabricating the semiconductor device, however, involves the need to etch the silicon oxide film which is as thick as some hundreds of nanometers when the sidewalls 6a to 6f are formed to cause difficulties in etching control, resulting in damages to the surface of the semiconductor substrate 1 due to overetching. Additionally, the surface of the semiconductor substrate 1 is also damaged by overetching when the contact holes 50 and 51 are formed. In this fashion, crystal defects 25 have been created adjacent the source/drain regions 261 and 262 (FIGS. 113 through 122). The crystal defects 25 induce leakage currents to cause the device to malfunction.

For instance, the DRAM is required to re-write (refresh) data stored in memory cells thereof at regular time intervals. The presence of the crystal defect 25 adjacent the source/drain region 261 connected to the capacitor lower electrode 13 causes the electric charges accumulated in the capacitor lower electrode 13 to flow away as a leakage current toward the semiconductor substrate 1, making it impossible to re-write proper data.

Furthermore, misalignment of the pattern of the gate electrodes 4 and the photoresist 10 due to process variations in the step of forming the photoresist 10 results in contact between the conductive film 9 serving as the bit line and the gate electrodes 4 serving as the word lines as shown in FIG. 116, leading to device malfunctions.

SUMMARY OF THE INVENTION

According to a first aspect of the present invention, a method of fabricating a semiconductor device comprises the steps of: (a) selectively forming a first conductive film on a surface of a semiconductor substrate; (b) forming a first insulative film on the first conductive film; (c) forming a second insulative film on a structure provided by the steps (a) and (b); (d) forming a third insulative film on the second insulative film; (e) forming a fourth insulative film on the third insulative film; (f) selectively and individually etching the fourth insulative film, the third insulative film, and the second insulative film in this order to expose a part of the surface of the semiconductor substrate which is located in a first position where the first conductive film is not formed; and (g) forming a second conductive film for electrically contacting the semiconductor substrate in the first position, wherein the etching rate of the third insulative film is lower than that of the fourth insulative film.

Preferably, according to a second aspect of the present invention, in the method of the first aspect, the second insulative film is present in a first region located on side walls of the first conductive film and the first insulative film, and in a second region located on the surface of the semiconductor substrate except where the first conductive film is formed; and wherein the width of the second insulative film in the first region is greater than the thickness of the second insulative film in the second region.

Preferably, according to a third aspect of the present invention, the method of the second aspect further comprises the steps of: (x) removing the third insulative film over a part of the surface of the semiconductor substrate which is located in a second position where the first conductive film is not formed, the second position being different from the first position, the step (x) being performed between the steps (d) and (e); (y) etching the fourth insulative film and the second insulative film over the second position in this order in succession to expose the part of the surface of the semiconductor substrate which is located in the second position, the step (y) being performed after the step (e); and (z) forming a third conductive film for electrically contacting the semiconductor substrate in the second position.

Preferably, according to a fourth aspect of the present invention, the method of the second aspect further comprises the steps of: (y) selectively and individually etching the fourth insulative film, the third insulative film, and the second insulative film in this order to expose a part of the surface of the semiconductor substrate which is located in a second position where the first conductive film is not formed, the second position being different from the first position, the step (y) being performed after the step (g); and (z) forming a third conductive film for electrically contacting the semiconductor substrate in the second position.

Preferably, according to a fifth aspect of the present invention, in the method of the second aspect, a part of the surface of the semiconductor substrate which is located in a second position where the first conductive film is not formed is exposed in the step (f), the second position being different from the first position; and a third conductive film for electrically contacting the semiconductor substrate in the second position is formed in the step (g), and the method further comprises the steps of: (h) forming a fifth insulative film for covering the second and third conductive films and the fourth insulative film, the step (h) being performed after the step (g); (i) selectively etching the fifth insulative film to form an opening over the third conductive film; and (j) providing a fourth conductive film electrically connected to the third conductive film through the opening of the fifth insulative film.

According to a sixth aspect of the present invention, a method of fabricating a semiconductor device comprises the steps of: (a) selectively forming a first conductive film on a surface of a semiconductor substrate; (b) forming a first insulative film on the first conductive film; (c) forming a second insulative film on a structure provided by the steps (a) and (b); (d) forming a third insulative film on the second insulative film; (e) selectively and individually etching the third insulative film and the second insulative film in this order to expose a part of the surface of the semiconductor substrate which is located in a first position where the first conductive film is not formed; and (f) forming a second conductive film for electrically contacting the semiconductor substrate in the first position, wherein the etching rate of the second insulative film is lower than that of the third insulative film, wherein the second insulative film is present in a first region located on side walls of the first conductive film and the first insulative film, and in a second region located on the surface of the semiconductor substrate except where the first conductive film is formed, and wherein the width of the second insulative film in the first region is greater than the thickness of the second insulative film in the second region.

Preferably, according to a seventh aspect of the present invention, the method of the sixth aspect further comprises the steps of: (y) selectively and individually etching the third insulative film and the second insulative film in this order to expose a part of the surface of the semiconductor substrate which is located in a second position where the first conductive film is not formed, the second position being different from the first position, the step (y) being performed after the step (d); and (z) forming a third conductive film for electrically contacting the semiconductor substrate in the second position.

Preferably, according to an eighth aspect of the present invention, in the method of the sixth aspect, a part of the surface of the semiconductor substrate which is located in a second position where the first conductive film is not formed is exposed in the step (e), the second position being different from the first position; and a third conductive film for electrically contacting the semiconductor substrate in the second position is formed in the step (f), and the method further comprises the steps of: (g) forming a fourth insulative film for covering the second and third conductive films and the third insulative film, the step (g) being performed after the step (f); (h) selectively etching the fourth insulative film to form an opening over the third conductive film; and (i) providing a fourth conductive film electrically connected to the third conductive film through the opening of the fourth insulative film, wherein the etching rate of the fourth insulative film is lower than that of the third insulative film.

Preferably, according to a ninth aspect of the present invention, the method of any one of the third, fourth, fifth, seventh, and eighth aspects further comprises the steps of: (s) introducing a first impurity of a conductivity type opposite to that of the semiconductor substrate through the second insulative film into the part of the surface of the semiconductor substrate which is located in the second position to form a first impurity region, the step (s) being performed between the steps (c) and (d); and (t) introducing a second impurity of the conductivity type opposite to that of the semiconductor substrate into the part of the surface of the semiconductor substrate which is located in the second position to form a second impurity region, the step (t) being performed between the steps (y) and (z), wherein the second impurity region has a wider area and a lower impurity concentration than the first impurity region.

Preferably, according to a tenth aspect of the present invention, the method of any one of the third, fourth, fifth, seventh, and eighth aspects further comprises the steps of: (s) introducing a first impurity of a conductivity type opposite to that of the semiconductor substrate through the second insulative film into the parts of the surface of the semiconductor substrate which are located in the first and second positions to form first impurity regions, the step (s) being performed between the steps (c) and (d); and (t) introducing a second impurity of the conductivity type opposite to that of the semiconductor substrate into the parts of the surface of the semiconductor substrate which are located in the first and second positions to form second impurity regions, the step (t) being performed between the steps (s) and (d), wherein the second impurity regions have a wider area and a lower impurity concentration than the first impurity regions.

Preferably, according to an eleventh aspect of the present invention, the method of the second aspect further comprises the steps of: (h) introducing a first impurity of a conductivity type opposite to that of the semiconductor substrate through the second insulative film into a part of the surface of the semiconductor substrate which is located in a second position where the first conductive film is not formed to form a first impurity region, the second position being different from the first position, the step (h) being performed between the steps (c) and (d); (i) removing the third insulative film over the second position, the step (i) being performed between the steps (d) and (e); (j) introducing a second impurity of the conductivity type opposite to that of the semiconductor substrate through the second insulative film into the part of the surface of the semiconductor substrate which is located in the second position to form a second impurity region, the step (j) being performed between the steps (i) and (e); (k) etching the fourth insulative film and the second insulative film over the second position in this order in succession to expose the part of the surface of the semiconductor substrate which is located in the second position, the step (k) being performed simultaneously with the step (f); and (l) forming a third conductive film for electrically contacting the semiconductor substrate in the second position, the step (l) being performed simultaneously with the step (g), wherein the second impurity region has a wider area and a lower impurity concentration than the first impurity region.

In accordance with the first aspect of the present invention, the etching of the second insulative film does not immediately follow the etching of the fourth insulative film. The third insulative film functions as an etch stopper when the fourth insulative film is etched, and thereafter the second insulative film is etched separately. This permits accurate control of the etching amount of the second insulative film to suppress the overetching of the exposed semiconductor substrate and, accordingly, the crystal defects in the semiconductor substrate.

Thus, when the second conductive film is formed in the step (g), an undesired leakage current is avoided at the contact between the second conductive film and the semiconductor substrate.

In accordance with the second aspect of the present invention, the width of the second insulative film in the first region is greater than the thickness of the second insulative film in the second region, and the first insulative film overlies the first conductive film. Thus, in the step (f), the surface of the semiconductor substrate may be selectively exposed in a self-aligned manner while the first conductive film is not exposed if the setting accuracy of the first position is not high. Therefore, a short circuit between the second conductive film and the first conductive film is avoided when the second conductive film is formed in the step (g).

In accordance with the third aspect of the present invention, when the part of the surface of the semiconductor substrate which is located in the second position is exposed in the step (y), it is not necessary to etch the third insulative film having a low etching rate over the second position, permitting the surface of the semiconductor substrate to be readily exposed.

In accordance with the fourth aspect of the present invention, the etching of the second insulative film does not immediately follow the etching of the fourth insulative film. The third insulative film functions as an etch stopper when the fourth insulative film is etched. This permits accurate control of the etching amount of the second insulative film to suppress the overetching of the exposed surface of the semiconductor substrate and, accordingly, the crystal defects in the semiconductor substrate. Thus, when the third conductive film is formed in the step (z), an undesired leakage current is avoided at the contact between the third conductive film and the semiconductor substrate.

In accordance with the fifth aspect of the present invention, the fourth conductive film at a different level from the second conductive film, with the fifth insulative film therebetween, is electrically connected to the semiconductor substrate in the second position through the third conductive film. The step (i) of etching the fifth insulative film to form the opening in the fifth insulative film and the step (f) of etching the fourth insulative film to expose the surface of the semiconductor substrate in the second position are not performed in succession. Then, the thickness of the film to be etched in each of the steps is less than that of the fourth and fifth insulative films to be etched in succession. This facilitates the control of the etching amount, avoiding the overetching of the third insulative film.

In accordance with the sixth aspect of the present invention, the width of the second insulative film in the first region is greater than the thickness of the second insulative film in the second region, and the first insulative film overlies the first conductive film. Thus, in the step (e), the surface of the semiconductor substrate may be selectively exposed in a self-aligned manner while the first conductive film is not exposed if the setting accuracy of the first position is not high.

Further, the etching of the second insulative film does not immediately follow the etching of the third insulative film. The second insulative film functions as an etch stopper when the third insulative film is etched, and thereafter the second insulative film is etched separately. This permits accurate control of the etching amount of the second insulative film to suppress the overetching of the exposed semiconductor substrate and, accordingly, the crystal defects in the semiconductor substrate.

Thus, when the second conductive film is formed in the step (f), a short circuit between the second conductive film and the first conductive film is avoided, and an undesired leakage current is avoided at the contact between the second conductive film and the semiconductor substrate.

In accordance with the seventh aspect of the present invention, the etching of the second insulative film does not immediately follow the etching of the third insulative film. The second insulative film functions as an etch stopper when the third insulative film is etched. This permits accurate control of the etching amount of the second insulative film to suppress the overetching of the exposed surface of the semiconductor substrate and, accordingly, the crystal defects in the semiconductor substrate. Thus, when the third conductive film is formed in the step (z), an undesired leakage current is avoided at the contact between the third conductive film and the semiconductor substrate.

In accordance with the eighth aspect of the present invention, the fourth conductive film at a different level from the second conductive film, with the fourth insulative film therebetween, is electrically connected to the semiconductor substrate in the second position through the third conductive film. The step (h) of etching the fourth insulative film to form the opening in the fourth insulative film and the step (f) of etching the second and third insulative films to expose the surface of the semiconductor substrate in the second position are not performed in succession. Then, the thickness of the film to be etched in each of the steps is less than that of the fourth, third and second insulative films to be etched in succession. This facilitates the control of the etching amount.

Additionally, the third conductive film functions as an etch stopper in the step (h) to avoid the overetching of the third insulative film which has a higher etching rate than the fourth insulative film. Therefore, the amount of overetching need not be considered to control the etching amount of the third insulative film.

In accordance with the ninth aspect of the present invention, the second impurity region is wider than the first impurity region, reducing the contact resistance of the third conductive film formed in the step (z) and the semiconductor substrate. Further, the impurity concentration gradient between the third conductive film and the semiconductor substrate becomes gentle, alleviating the electric field in the semiconductor substrate under the third conductive film.

Therefore, an undesired leakage current flowing from the third conductive film into the semiconductor substrate is further suppressed.

In accordance with the tenth aspect of the present invention, the second impurity regions are wider than the first impurity regions, reducing the contact resistance of the third conductive film formed in the step (z) and the semiconductor substrate. Further, the impurity concentration gradient between the third conductive film and the semiconductor substrate becomes gentle, alleviating the electric field in the semiconductor substrate under the third conductive film. Therefore, an undesired leakage current flowing from the third conductive film into the semiconductor substrate is further suppressed.

Additionally, the semiconductor substrate is not exposed when the first and second impurity regions are formed. Thus, the first and second impurity regions may be formed without damages to the semiconductor substrate.

In accordance with the eleventh aspect of the present invention, when the part of the surface of the semiconductor substrate which is located in the second position is exposed in the step (k), it is not necessary to etch the third insulative film having a low etching rate over the second position, permitting the surface of the semiconductor substrate to be readily exposed.

Furthermore, the second impurity region is wider than the first impurity region, reducing the contact resistance of the third conductive film formed in the step (k) and the semiconductor substrate. Further, the impurity concentration gradient between the third conductive film and the semiconductor substrate becomes gentle, alleviating the electric field in the semiconductor substrate under the third conductive film. Therefore, an undesired leakage current flowing from the third conductive film into the semiconductor substrate is further suppressed.

It is therefore an object of the present invention to provide a method of fabricating a semiconductor device which permits a bit line to be connected to a semiconductor substrate in a self-aligned manner without contacting a word line and which prevents a crystal defect in the semiconductor substrate which induces a leakage current.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment 1

Figure 1:
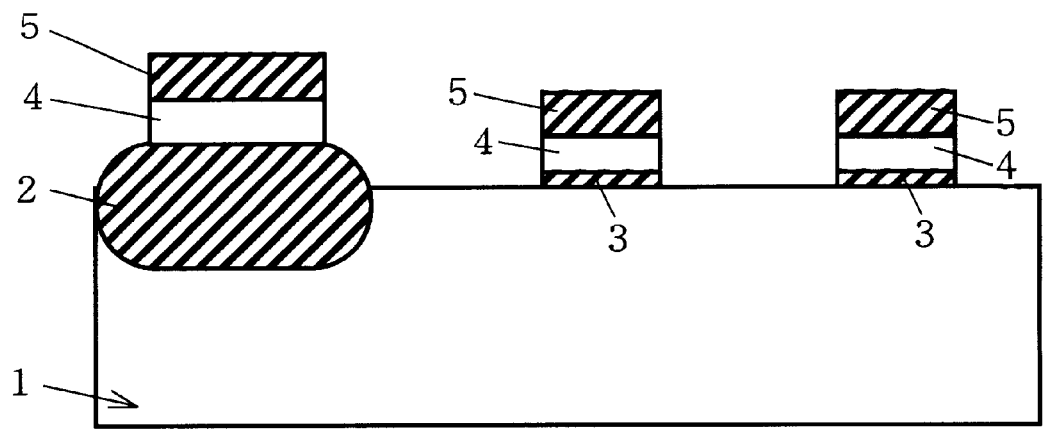
FIGS. 1 through 15 are cross-sectional views showing respective steps of the fabrication of a semiconductor device according to a first preferred embodiment of the present invention.

FIGS. 1 through 15 are cross-sectional views showing respective steps of the fabrication of a semiconductor device in sequential order according to a first preferred embodiment of the present invention. An isolation insulative film 2 is formed on a semiconductor (e.g., Si) substrate 1 by the LOCOS technique, and laminated structures each comprised of a gate oxide film 3, a gate electrode 4, and an insulative film 5 stacked in this order are selectively formed on the semiconductor substrate 1 except where the isolation insulative film 2 is formed (FIG. 1). The gate electrodes 4 are to function as word lines of a DRAM. The gate oxide film 3 is not shown in FIG. 1 as formed under the gate electrode 4 overlying the isolation insulative film 2, but the above described laminated structure is formed behind the isolation insulative film 2 as viewed in a direction perpendicular to the plane of the figure.

Figure 2:
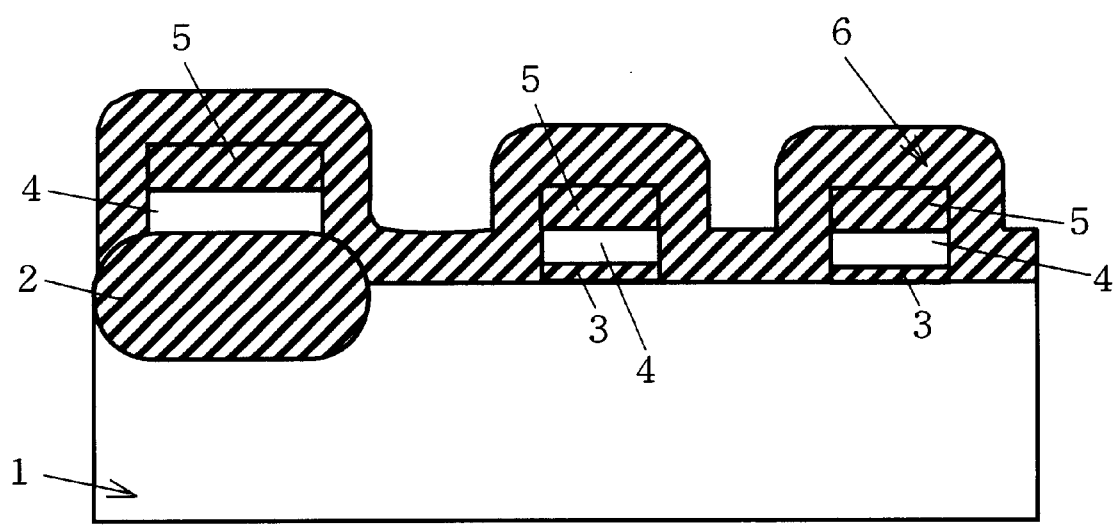
Figure 3:
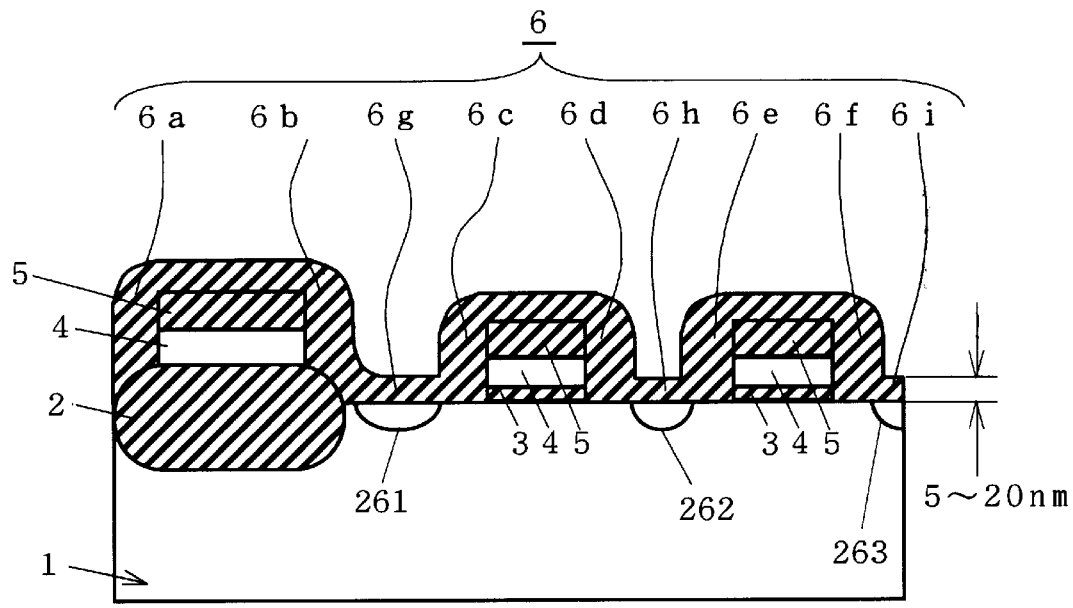

A silicon oxide film 6 is formed over the top surface by the CVD process (FIG. 2). Anisotropic oxide etching which provides a high etching rate in a direction perpendicular to the semiconductor substrate 1 is performed to etch the silicon oxide film 6. This etching causes parts of the silicon oxide film 6 to be left on side walls of the gate oxide films 3, gate electrodes 4, and insulative films 5 to form sidewalls 6a to 6f. It should be noted that, during this etching process, parts of the silicon oxide film 6 having a predetermined thickness are left on the semiconductor substrate 1 to form substrate protective oxide films 6g to 6i so that the semiconductor substrate 1 is not exposed. The thickness of the substrate protective oxide films 6g to 6i is set within a range which permits accurate control of anisotropic oxide etching to be carried out for removal of the substrate protective oxide films 6g to 6i to prevent damages to the semiconductor substrate 1. For example, the thickness of the substrate protective oxide films 6g to 6i is 5 to 20 nm in the first preferred embodiment. Ions of a conductivity type opposite to that of the semiconductor substrate 1 are implanted into the semiconductor substrate 1 through the substrate protective oxide films 6g to 6i to form source/drain regions 261 to 263 (FIG. 3).

Figure 4:
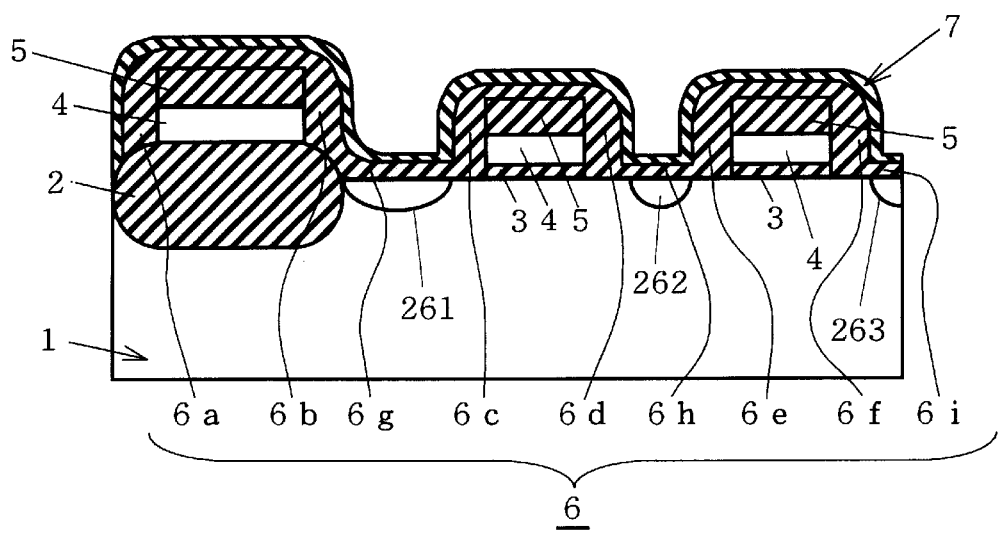

An insulative film 7 made of $Si_3N_4$, SiON and the like is deposited to a thickness of 5 to 100 nm over the top surface by the CVD process (FIG. 4).

Figure 5:
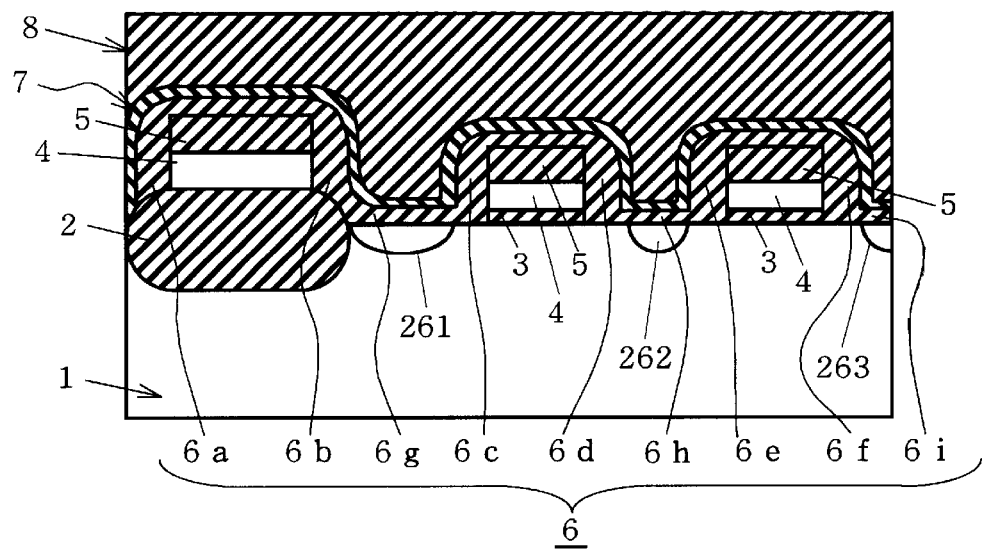

A silicon oxide film, for example, is deposited over the top surface by the CVD process to form an interlayer insulative film 8 (FIG. 5).

Figure 6:
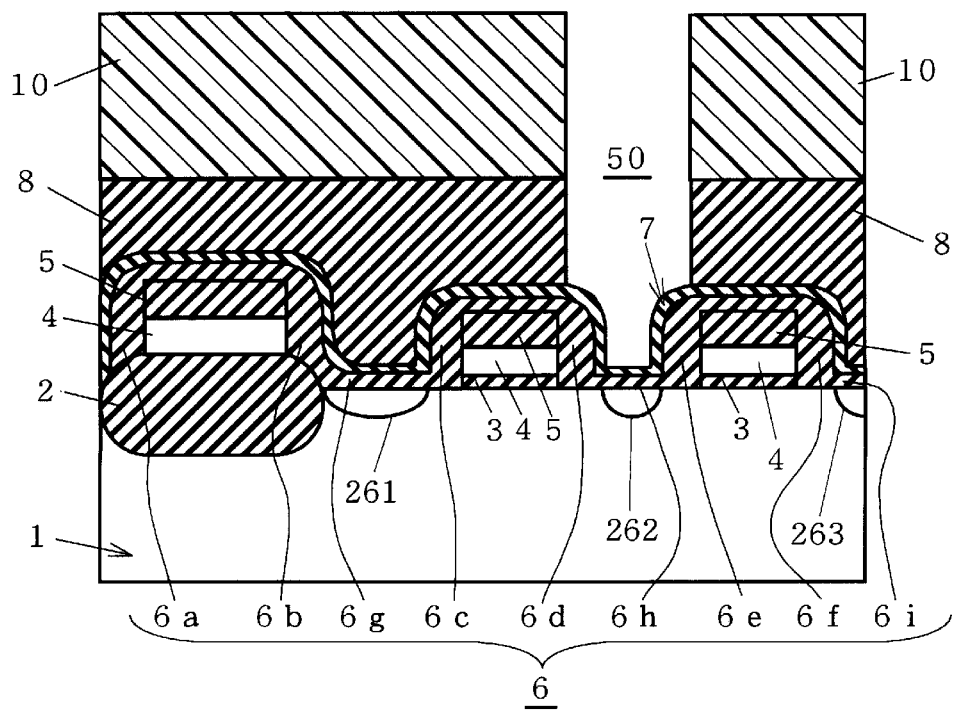

A photoresist 10 having an opening over the source/drain region 262 is formed on the interlayer insulative film 8 by the conventional transfer process. With the photoresist 10 used as a mask, only the interlayer insulative film 8 is etched by an oxide etching process using a $C_4F_8$ gas and the like which forms a contact hole 50 (FIG. 6). Since the etching rate of the insulative film 7 of $Si_3N_4$, SiON and the like formed by the CVD process is lower than that of the interlayer insulative film 8 of silicon oxide formed by the CVD process, this oxide etching process may be readily stopped at the time when the insulative film 7 is exposed.

Figure 7:
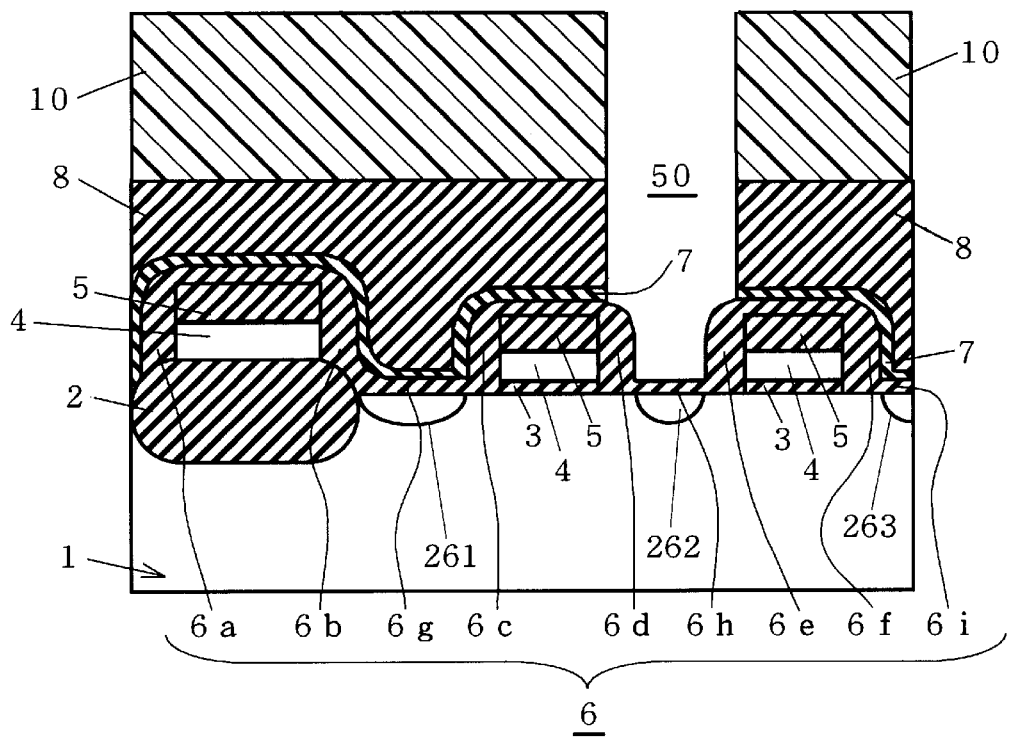
Figure 8:
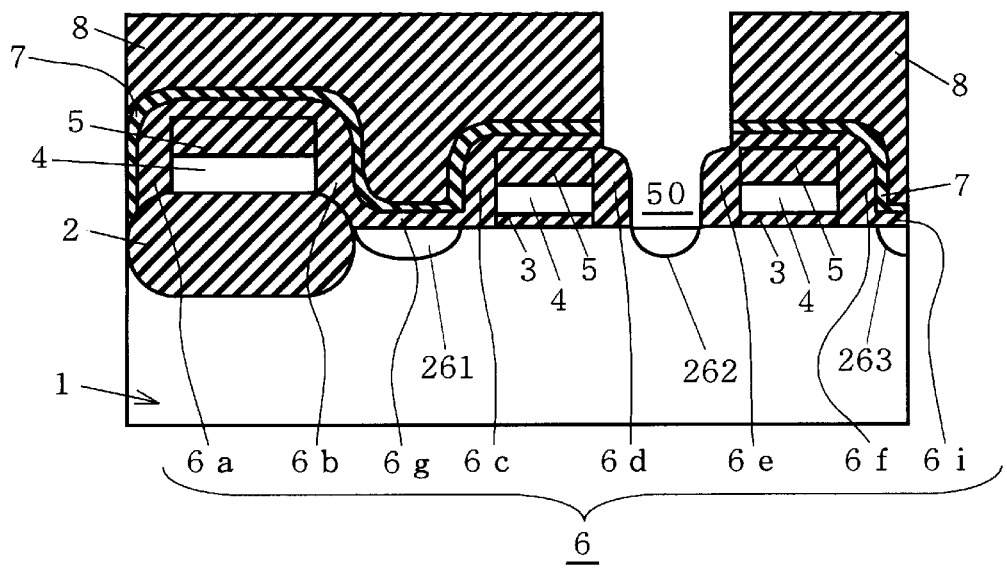

With the photoresist 10 used as a mask, the insulative film 7 is removed by an etching process using a $CF_4$ gas and the like (FIG. 7). Anisotropic oxide etching using the photoresist 10 as a mask removes the substrate protective oxide film 6h to expose the source/drain region 262. During this anisotropic oxide etching process, the sidewalls 6d and 6e are also removed by the amount of the thickness of the substrate protective oxide film 6h. Then, the photoresist 10 is removed (FIG. 8).

Figure 9:
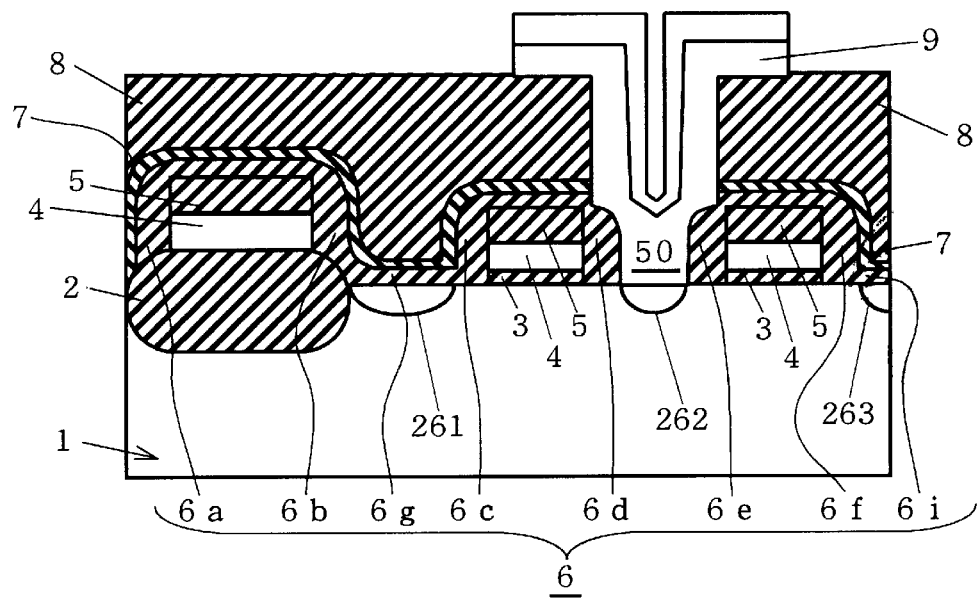

A conductive film 9 of WSi/poly Si, TiSi/poly Si and the like is formed for connection to the source/drain region 262 through the contact hole 50 (FIG. 9). The conductive film 9 is to function as a bit line of the DRAM.

Figure 10:
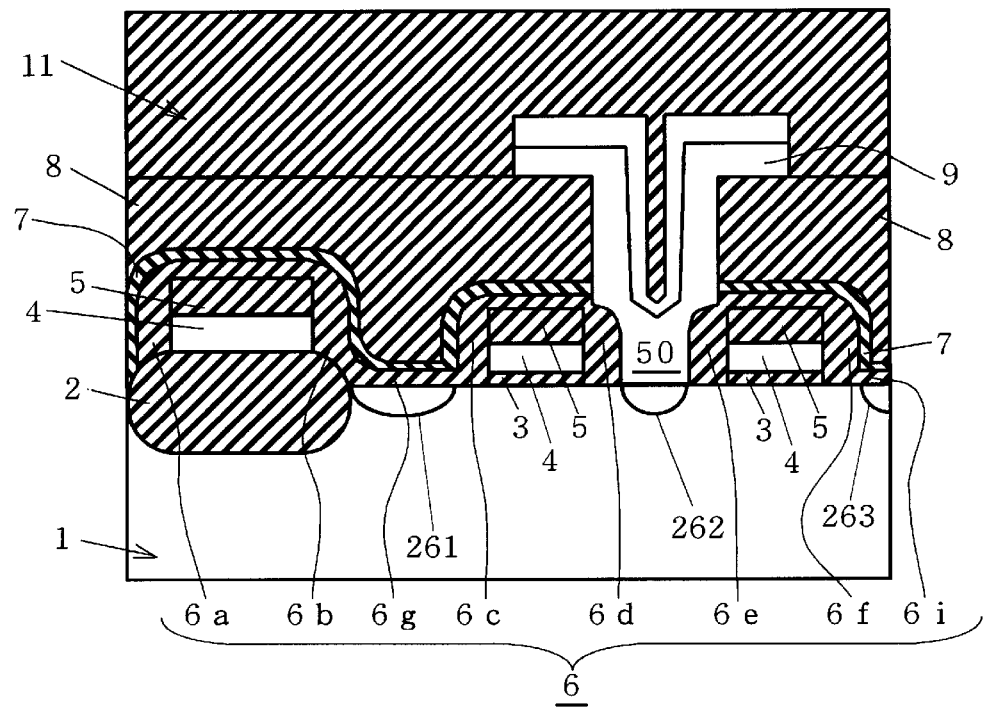
Figure 11:
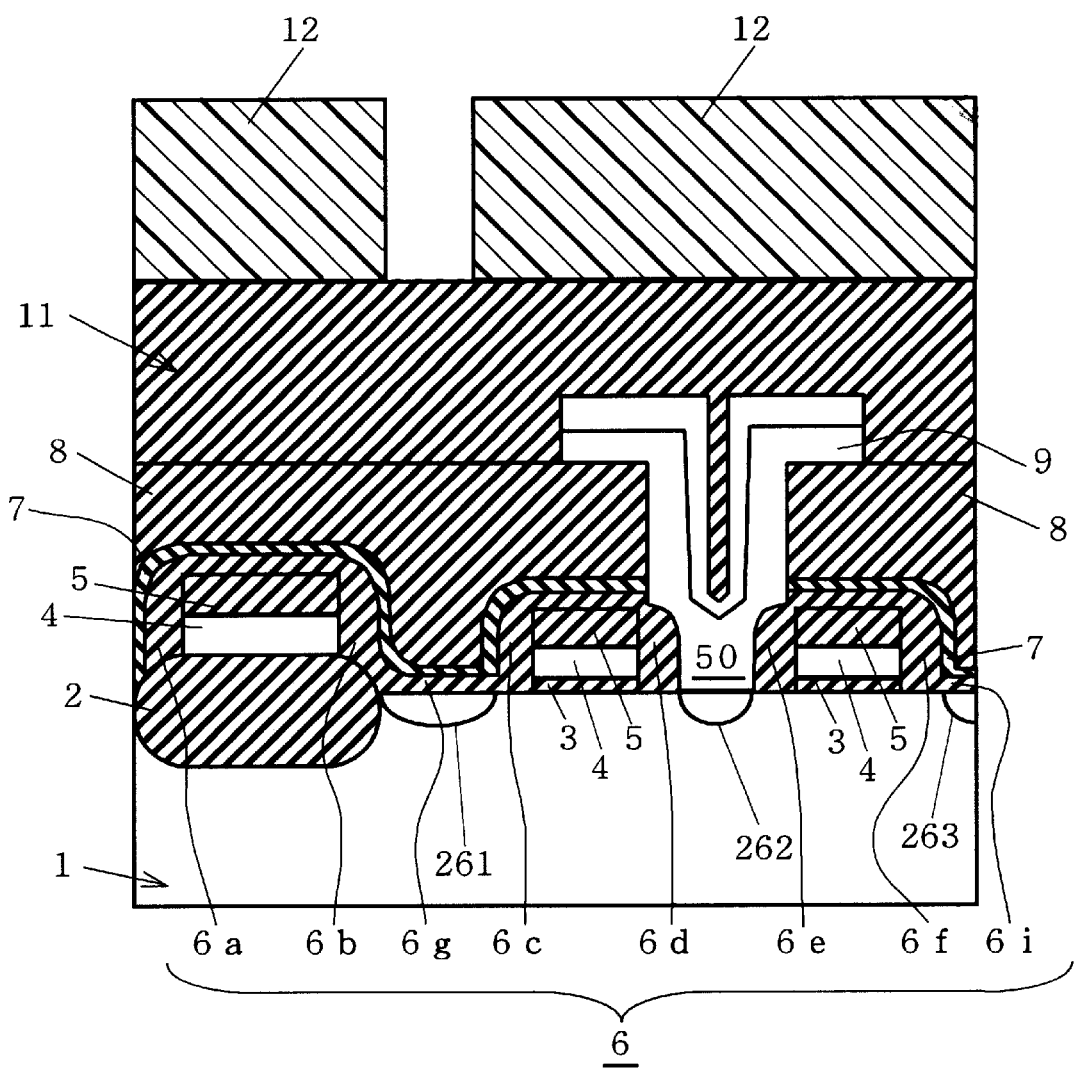
Figure 12:
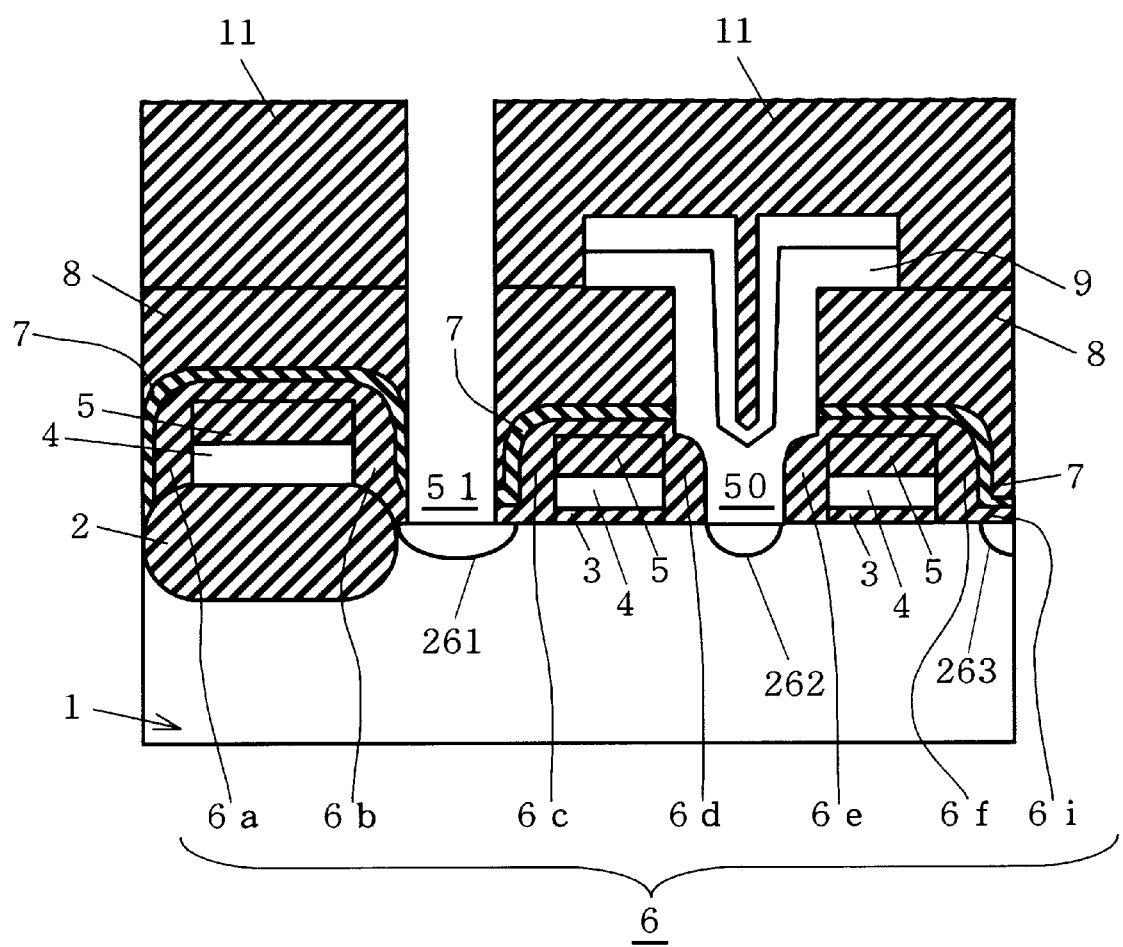

A silicon oxide film, for example, is deposited over the top surface by the CVD process to form an interlayer insulative film 11 (FIG. 10). A photoresist 12 having an opening over the source/drain region 261 is formed on the interlayer insulative film 11 by the conventional transfer process (FIG. 11). Using the photoresist 12 as a mask, the interlayer insulative films 11 and 8, the insulative film 7, and the substrate protective oxide film 6g are subjected to etching which forms a contact hole 51 to expose the source/drain region 261. This etching may be carried out using the same etchant by the known technique. Then, the photoresist 12 is removed (FIG. 12).

Figure 13:
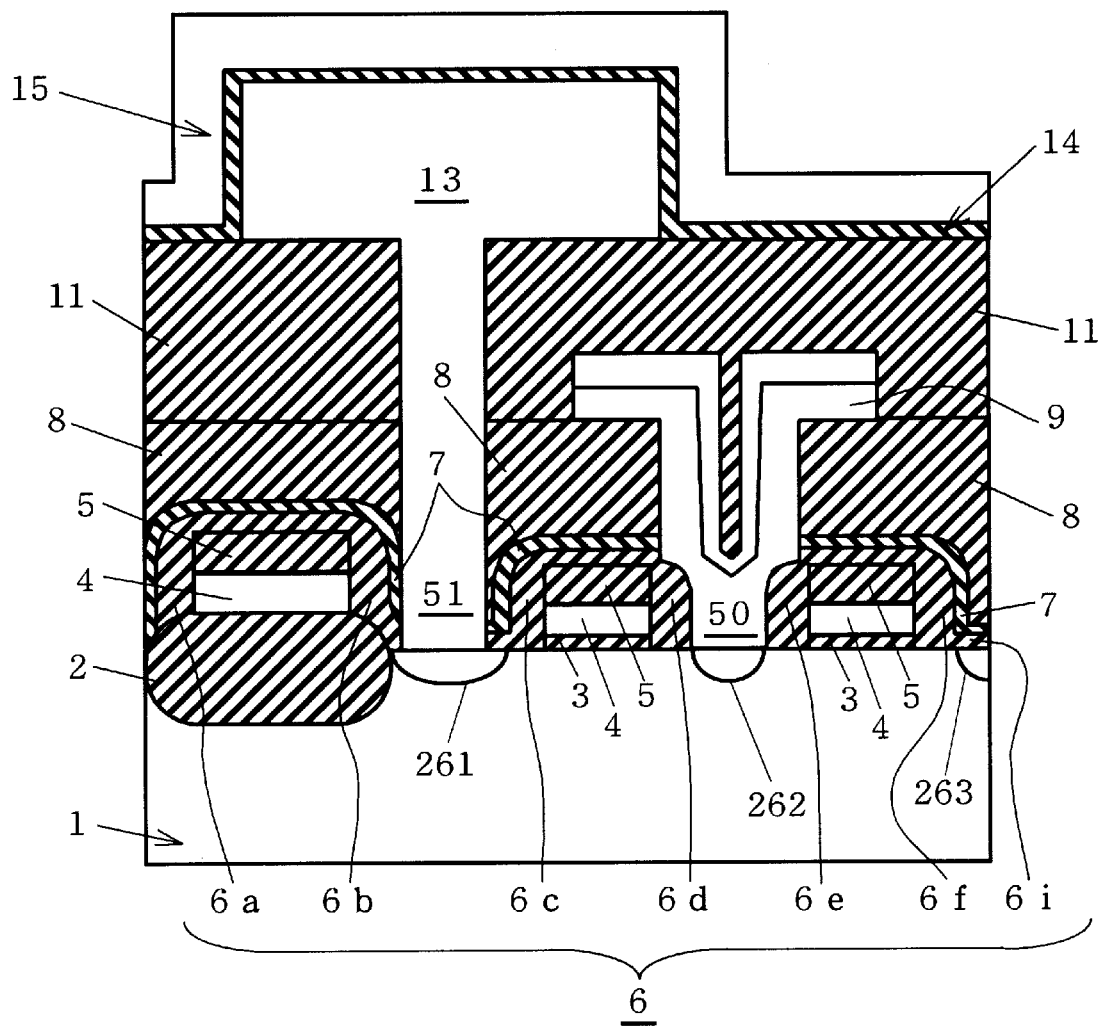

Poly Si is deposited by the CVD process so as to fill the contact hole 51 to form a capacitor lower electrode 13. The capacitor lower electrode 13 is connected to the source/drain region 261 through the contact hole 51. A $Si_3N_4$ film is deposited over the top surface to form a capacitor dielectric film 14. Further, poly Si is deposited on the capacitor dielectric film 14 by the CVD process to form a capacitor upper electrode 15 (FIG. 13).

Figure 14:
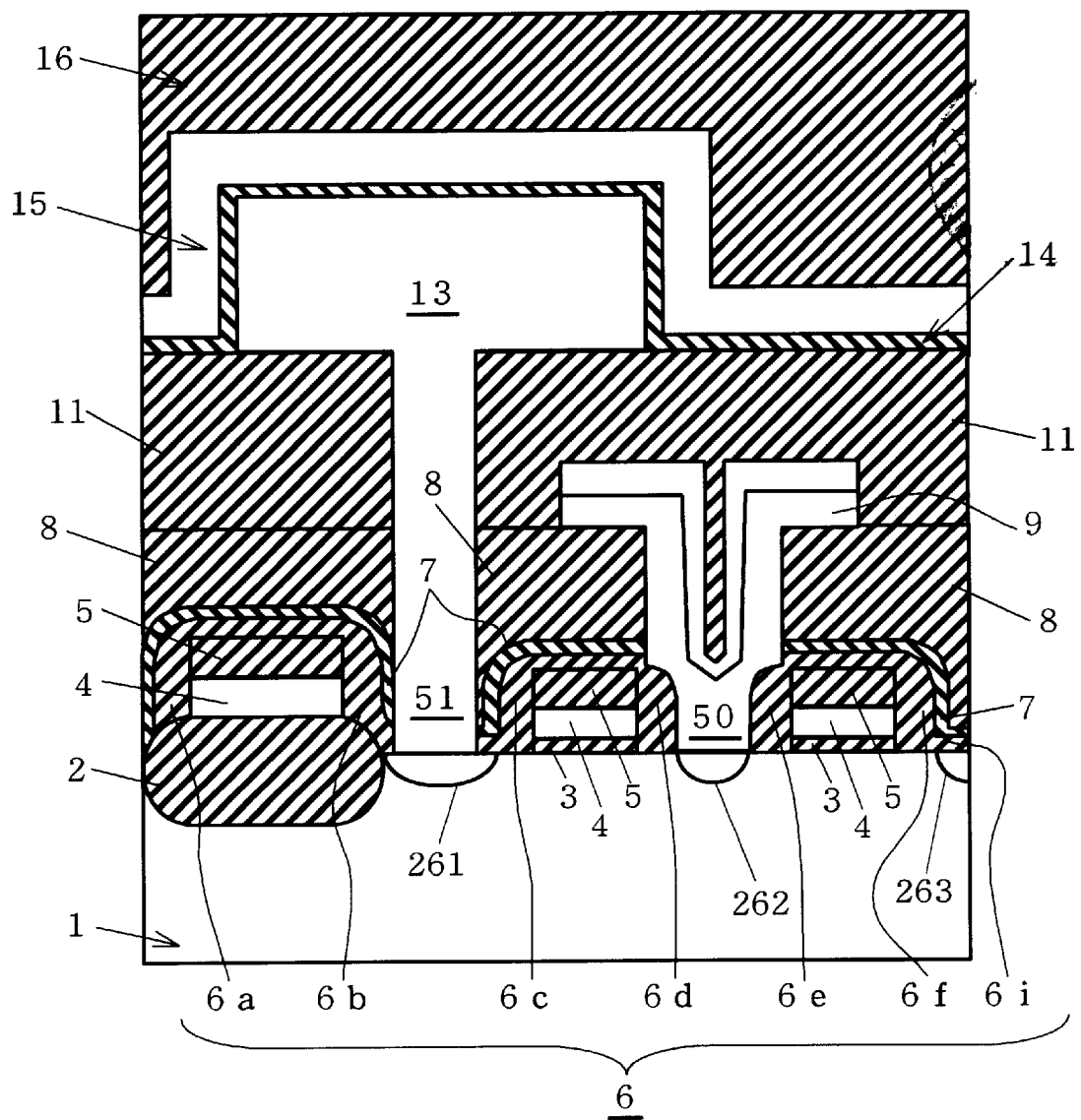
Figure 15:
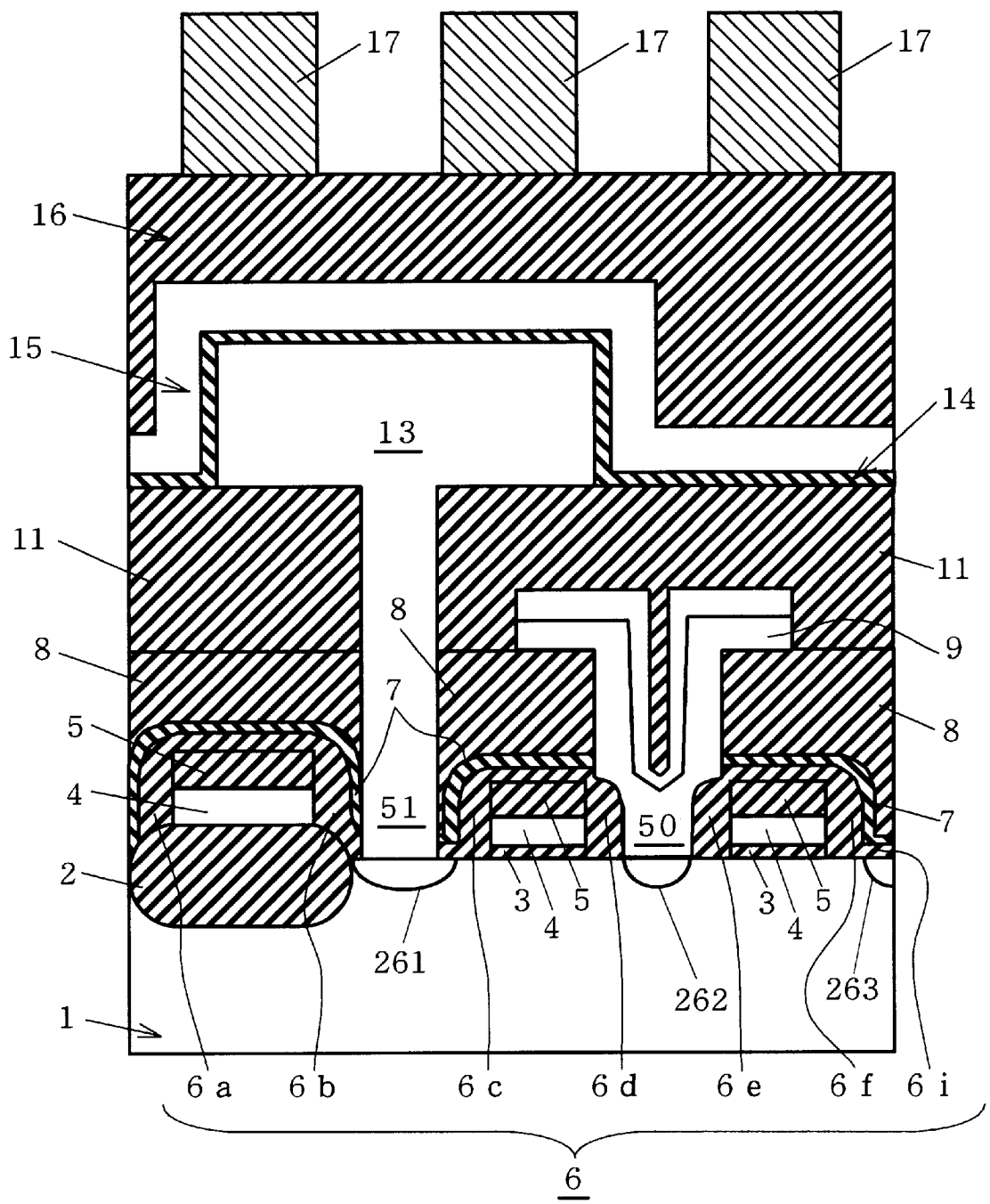
Figure 17:
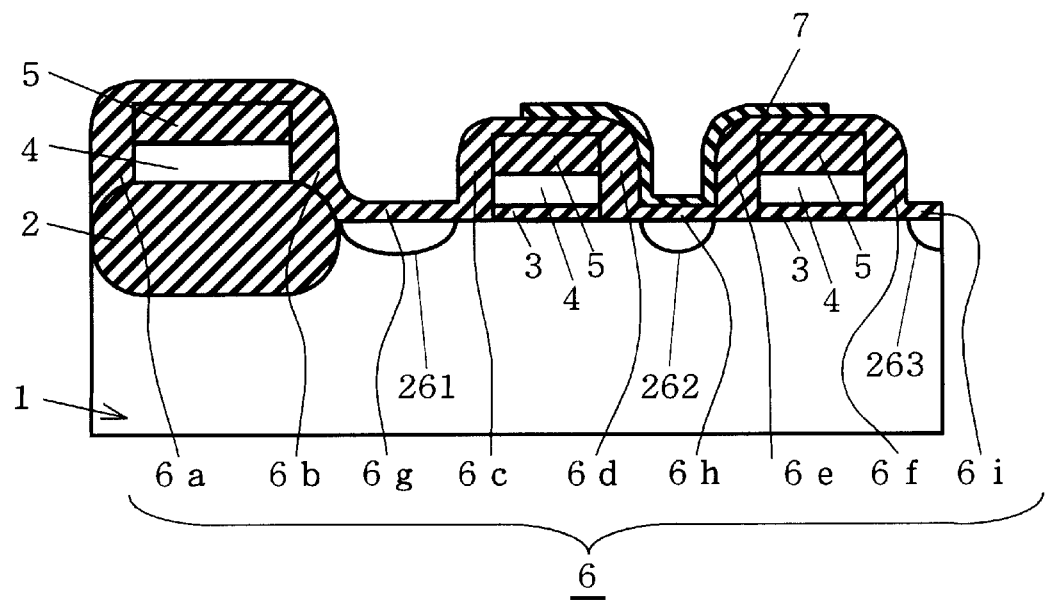

A silicon oxide film, for example, is deposited on the capacitor upper electrode 15 by the CVD process to form an interlayer insulative film 16 (FIG. 14). Interconnect layers 17 made of, for example, AlCu and AlSiCu are selectively formed on the interlayer insulative film 16 (FIG. 17).

In the method of fabricating the semiconductor device of the first preferred embodiment, as above described, the interlayer insulative film 8 is etched using the insulative film 7 as an etch stopper when the contact hole 50 is formed. At this stage, the substrate protective oxide film 6h has not yet been etched. Thus, the etching of the interlayer insulative film 8 does not damage the source/drain region 262. Furthermore, the thinness of the substrate protective oxide film 6h facilitates control of the etching amount thereof, preventing damages to the source/drain region 262. Small amounts of the insulative film 5 and the sidewalls 6d and 6e are removed relative to the total etching amounts. Therefore, the contact hole 50 may be formed in a self-aligned fashion in non-contacting relation to the gate electrodes 4.

The conditions of the source/drain region 261 are noted below. In the background art fabrication method, the semiconductor substrate 1 is overetched in two fabrication steps of forming the sidewalls 6a to 6f and forming the contact hole 51, causing the significant crystal defects 25. In the method of fabricating the semiconductor device according to the first preferred embodiment, on the other hand, the substrate protective oxide film 6g is left when the sidewalls 6a to 6f are formed, to prevent the semiconductor substrate 1 from being overetched during the etching and to preclude the crystal defects 25. Thus, the method of the first preferred embodiment causes a smaller amount of crystal defects 25 adjacent the source/drain region 261 than the background art method, thereby suppressing leakage currents which are induced when the capacitor lower electrode 13 is connected to the source/drain region 261 through the contact hole 51 and which causes the device to malfunction.

Preferred Embodiment 2

The interlayer insulative film 8 is formed after the insulative film 7 is formed in the first preferred embodiment. However, the insulative film 7 except where the contact hole 50 is formed may be removed prior to the formation of the interlayer insulative film 8 after the insulative film 7 is formed.

Figure 16:
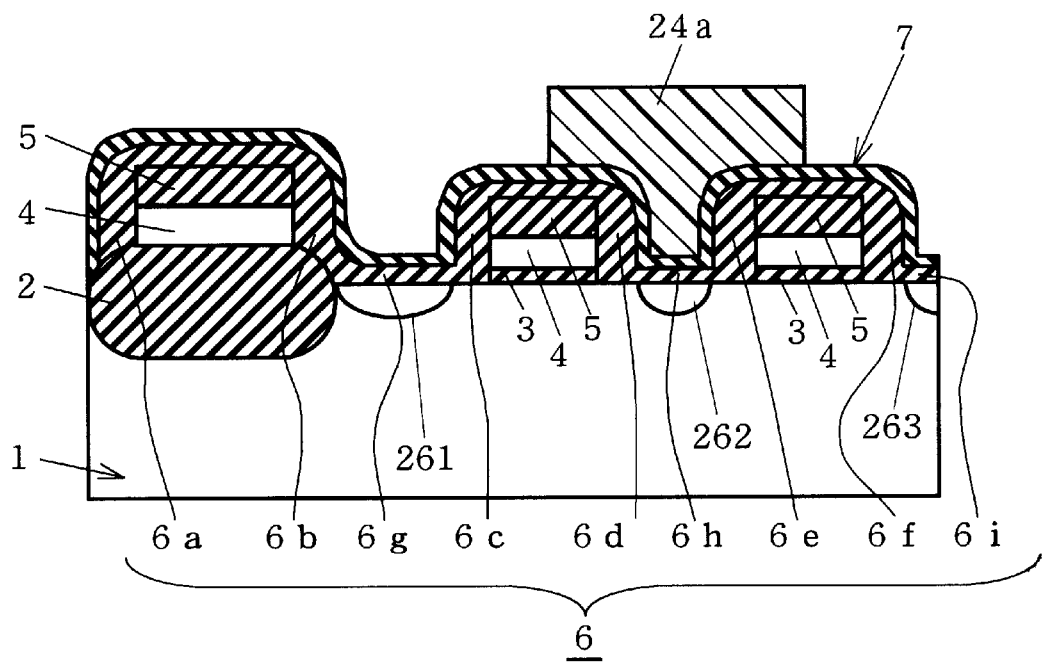
FIGS. 16 through 27 are cross-sectional views showing respective steps of the fabrication of the semiconductor device according to a second preferred embodiment of the present invention.

FIGS. 16 through 27 are cross-sectional views showing respective steps of the fabrication of the semiconductor device in sequential order according to a second preferred embodiment of the present invention. First, the structure of FIG. 4 is provided through fabrication steps similar to those of the first preferred embodiment. Then, a photoresist 24a is formed by the conventional transfer process in a region wherein the contact hole 50 is to be formed (FIG. 16).

Parts of the insulative film 7 which are not covered with the photoresist 24a are removed by an etching process using the $CF_4$ gas and the like. Then, the photoresist 24a is removed (FIG. 17).

Figure 18:
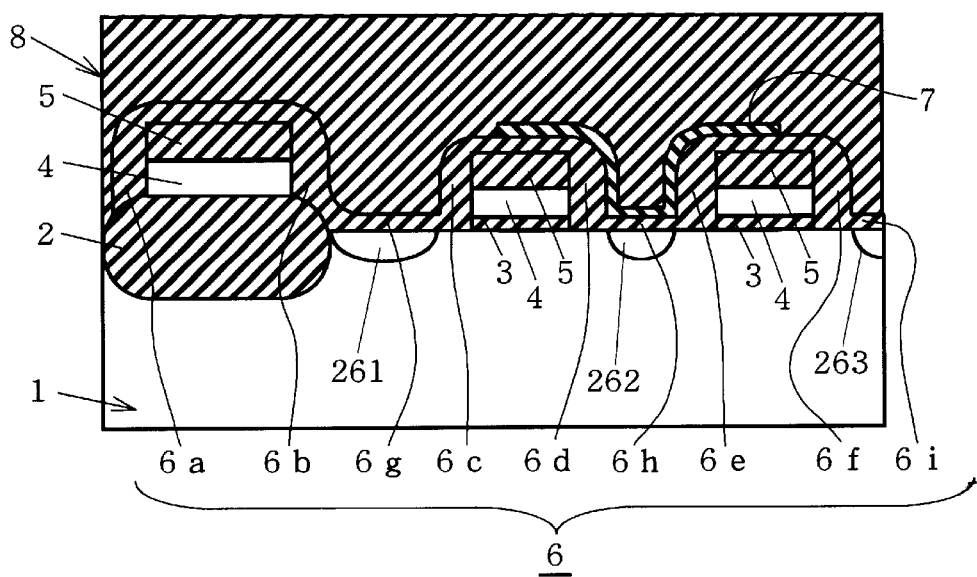
Figure 19:
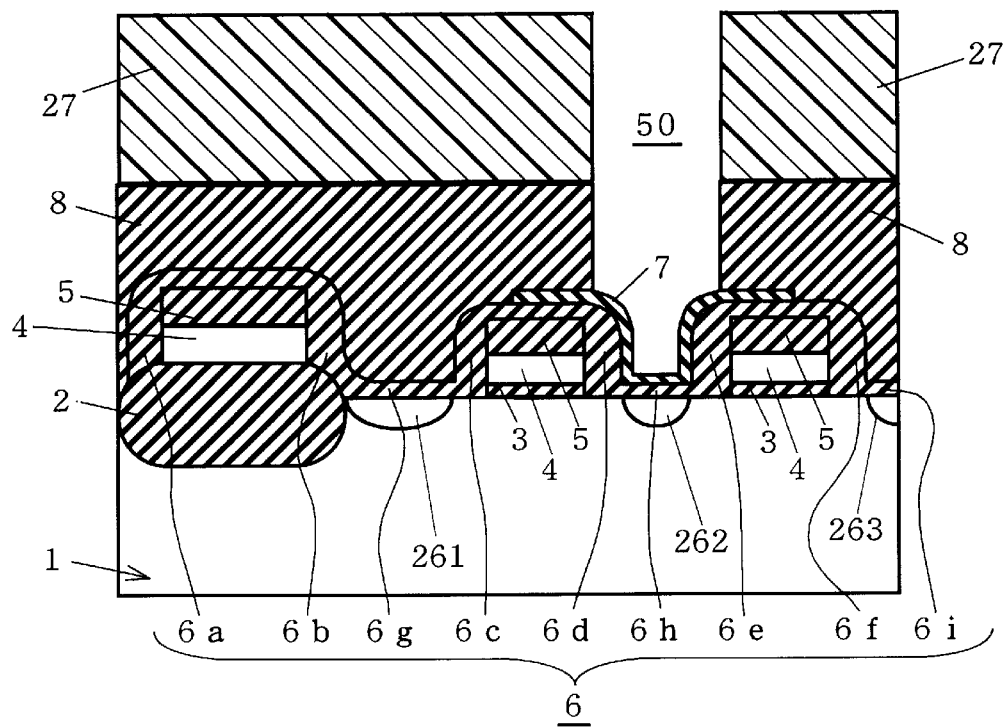
Figure 20:
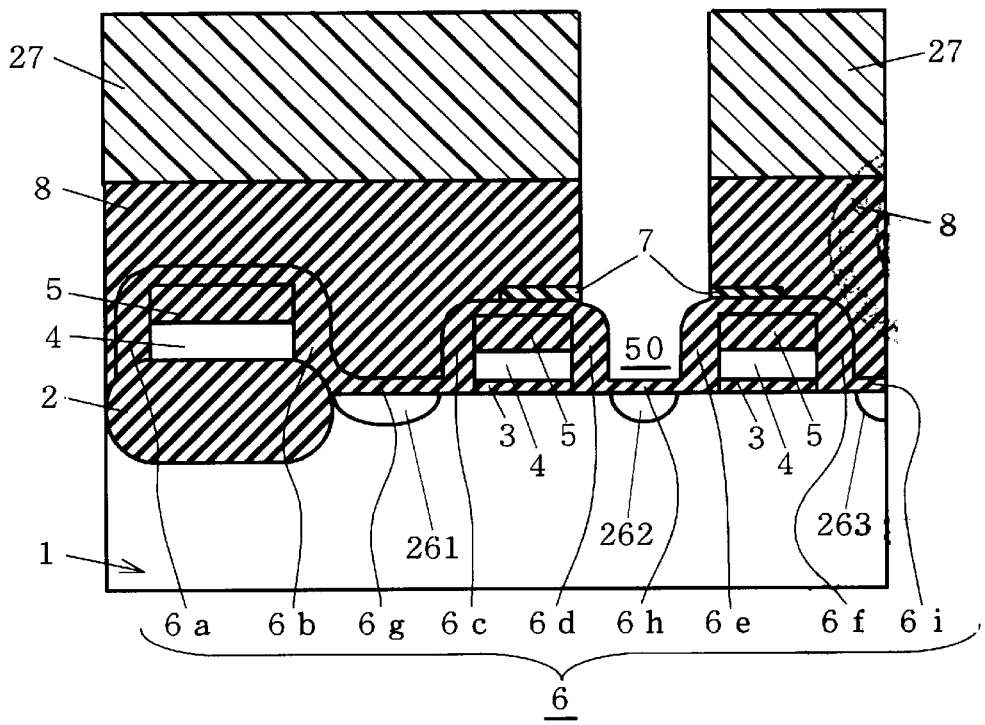
Figure 21:
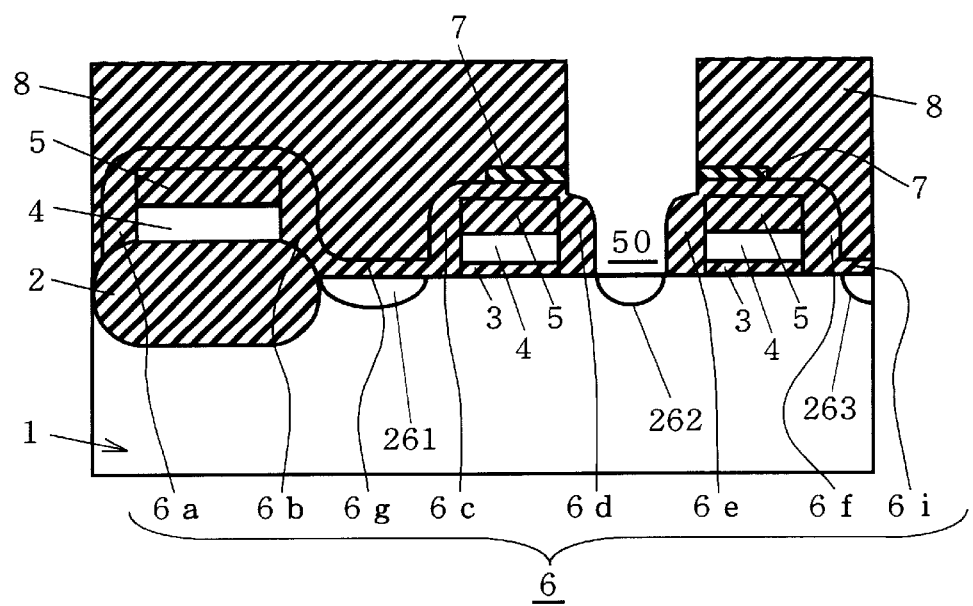
Figure 22:
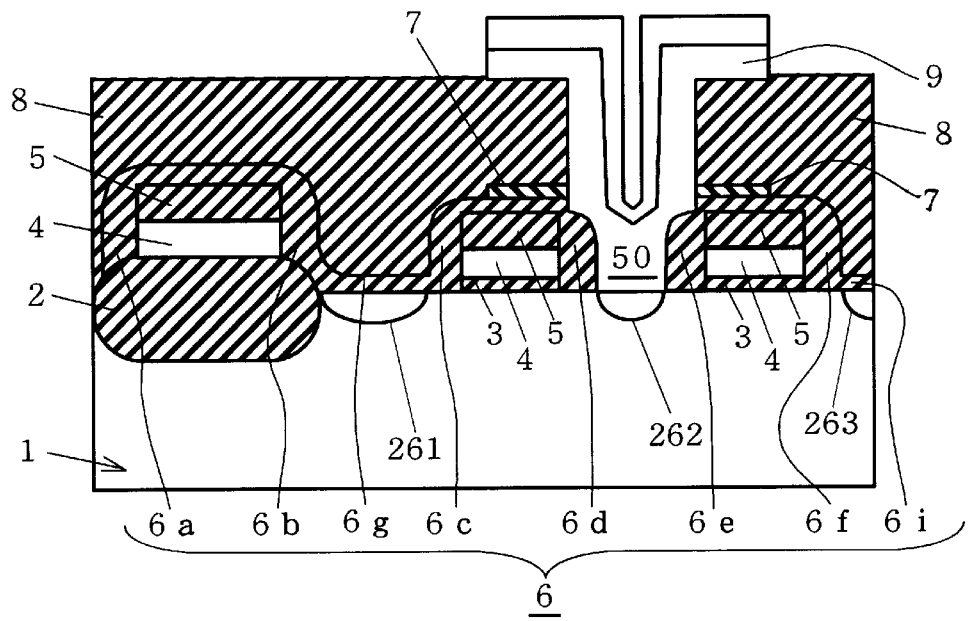
Figure 23:
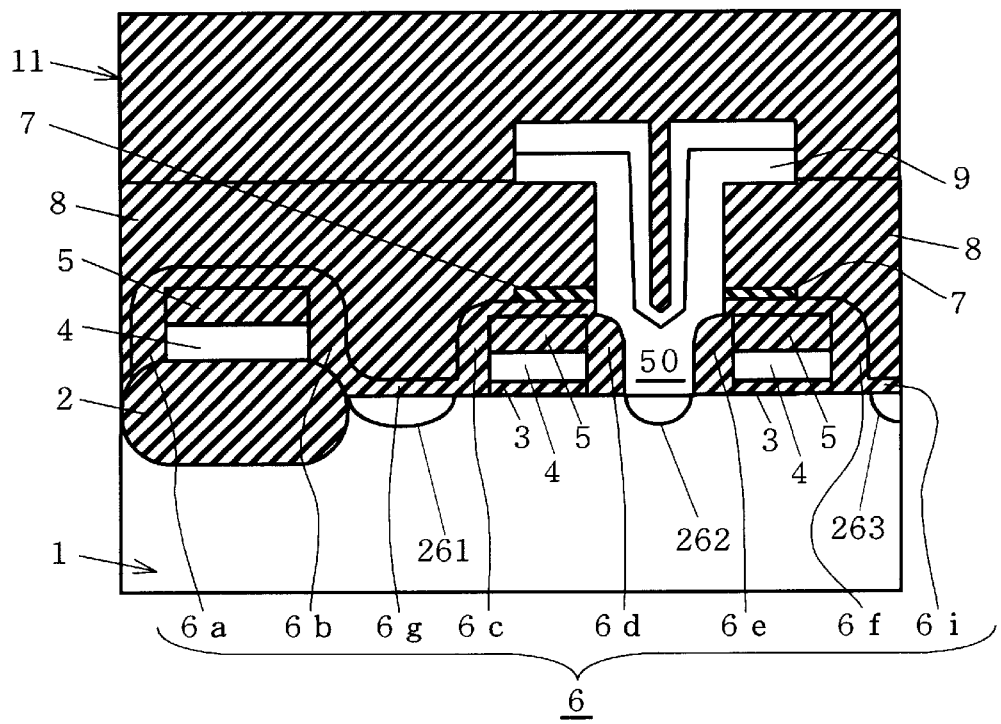

Thereafter, fabrication steps similar to those of the first preferred embodiment are performed until the interlayer insulative film 11 is formed. More specifically, the interlayer insulative film 8 is deposited over the top surface (FIG. 18). Using as a mask a photoresist 27 formed on the interlayer insulative film 8, only the interlayer insulative film 8 is etched by the oxide etching process using the $C_4F_8$ gas and the like which forms the contact hole 50 (FIG. 19). Then, the insulative film 7 is etched using the photoresist 27 as a mask (FIG. 20). The substrate protective oxide film 6h is removed, and thereafter the photoresist 27 is removed (FIG. 21). The conductive film 9 is connected to the source/drain region 262 through the contact hole 50 (FIG. 22). The interlayer insulative film 11 is formed over the top surface (FIG. 23).

Figure 24:
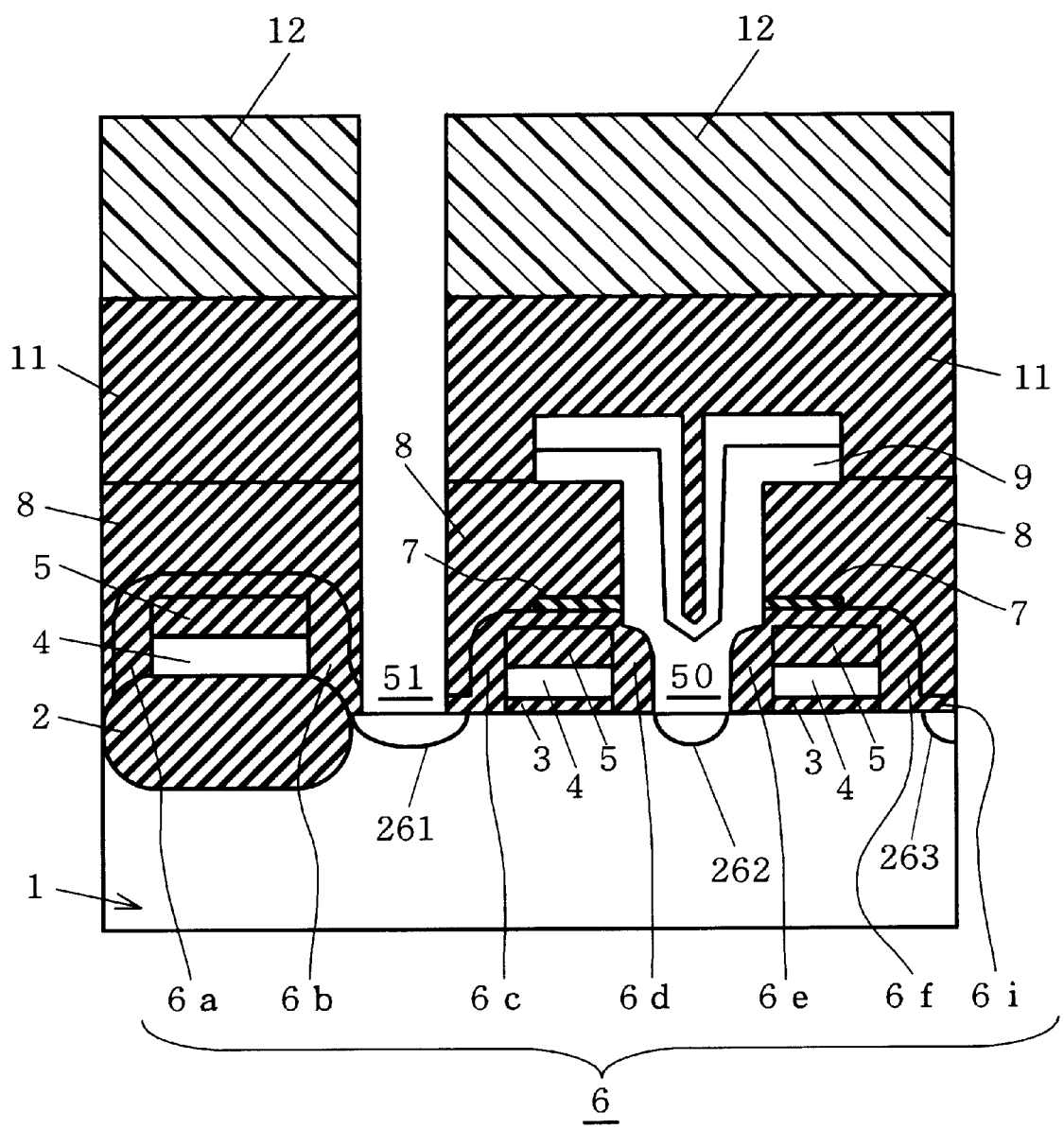

The photoresist 12 is formed on the interlayer insulative film 11 by the conventional transfer process. Using the photoresist 12 as a mask, the interlayer insulative films 11 and 8, and the substrate protective oxide film 6g are etched by the same etchant, which forms the contact hole 51 to expose the source/drain region 261 (FIG. 24).

Figure 25:
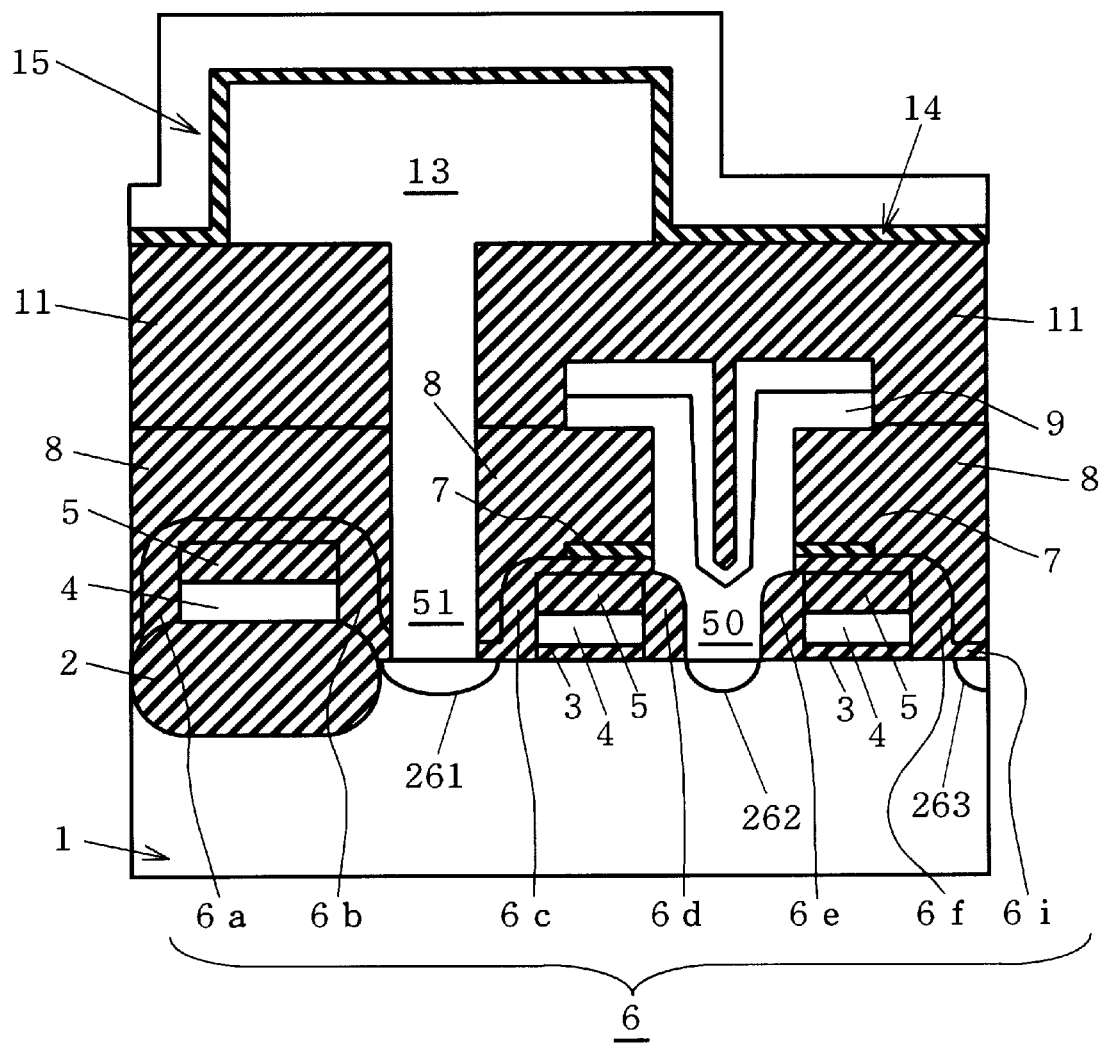
Figure 26:
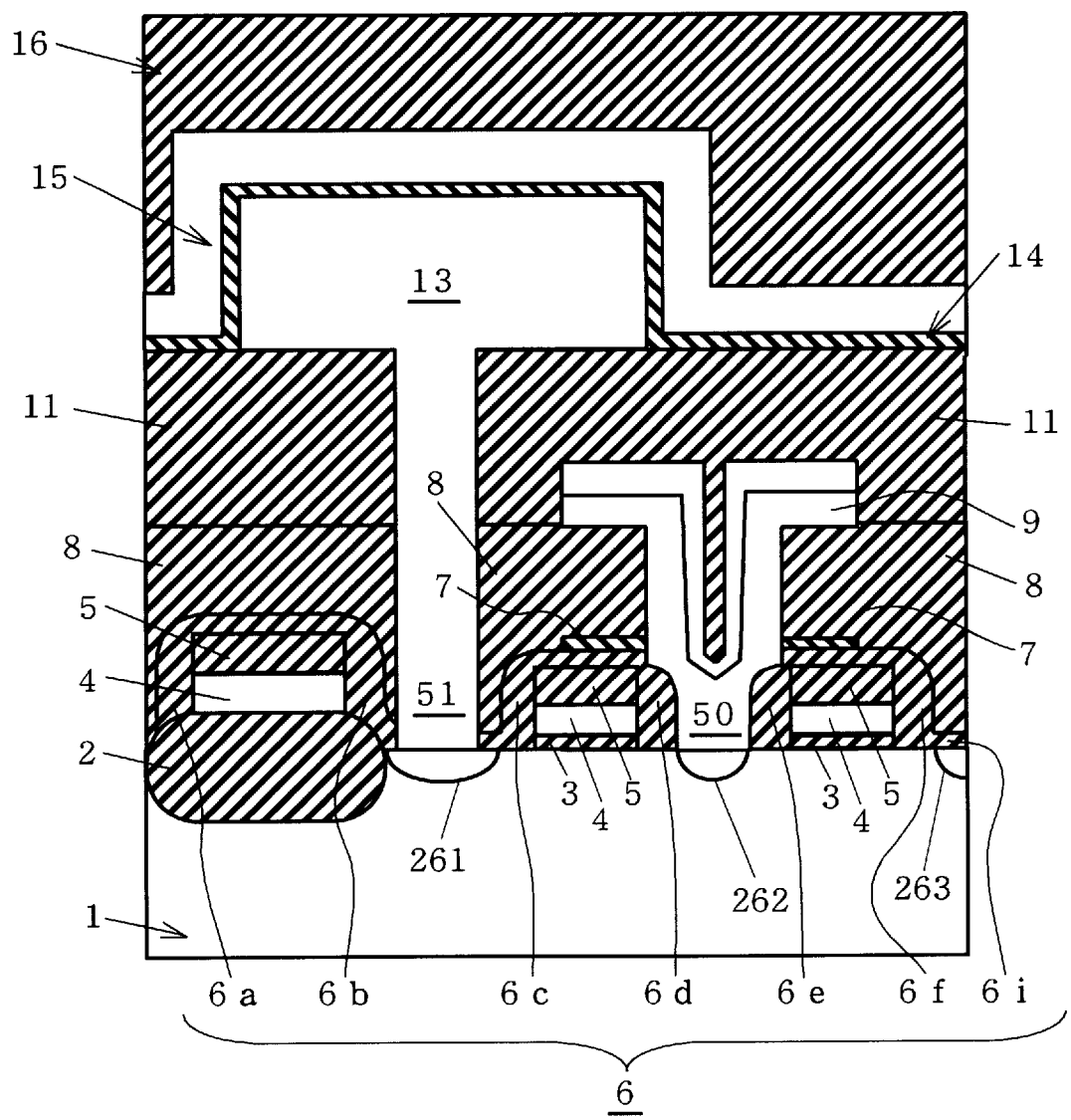
Figure 27:
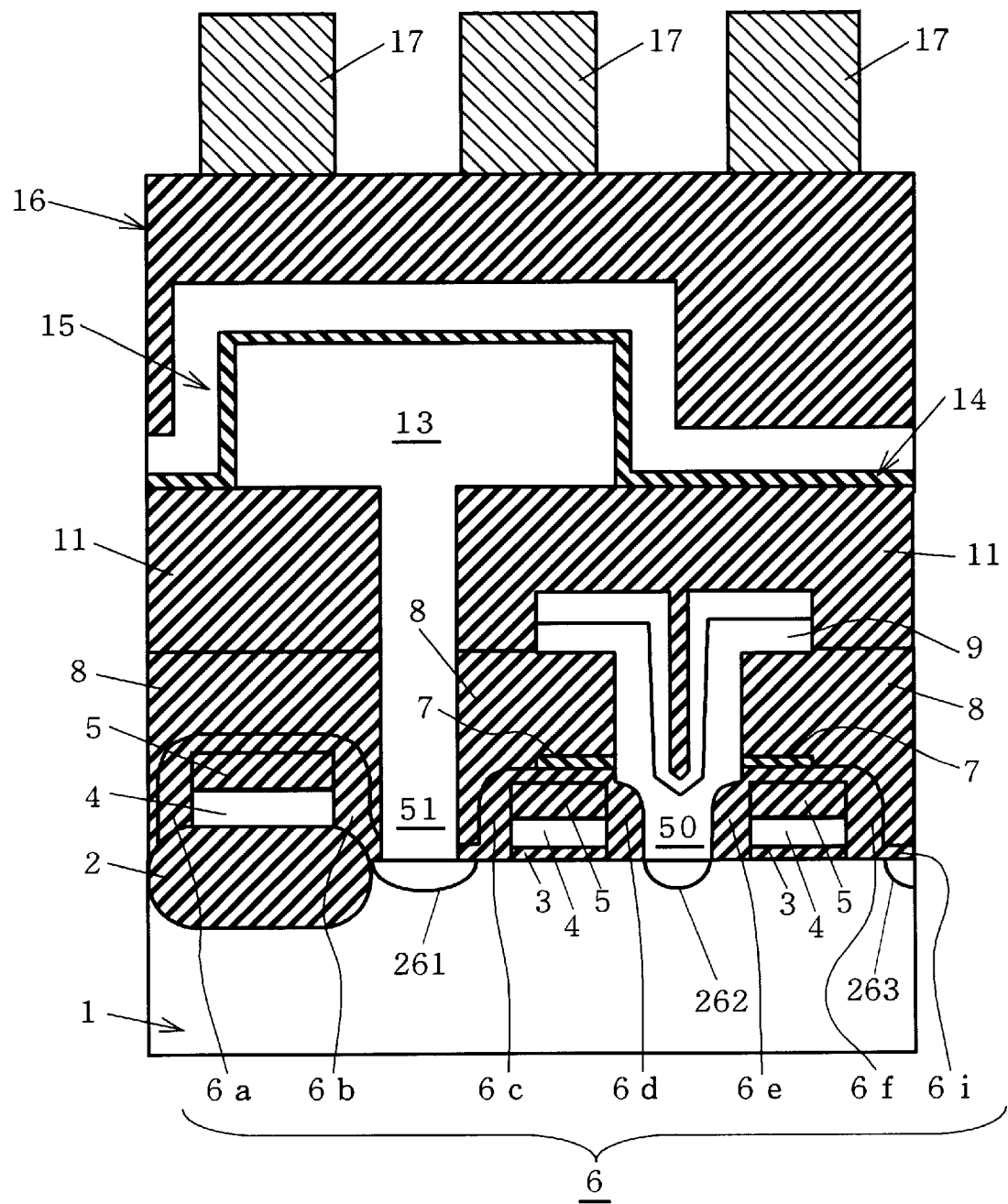

Thereafter, fabrication steps similar to those of the first preferred embodiment are performed until the interconnect layers 17 are formed. More specifically, the capacitor lower electrode 13 is formed for connection to the source/drain region 261 through the contact hole 51, and then the capacitor dielectric film 14 and the capacitor upper electrode 15 are formed over the entire surface (FIG. 25). The interlayer insulative film 16 is formed over the top surface (FIG. 26), and the interconnect layers 17 are selectively formed on the interlayer insulative film 16 (FIG. 27).

Since the contact hole 51 must be out of contact with the gate electrodes 4 serving as the word lines and the conductive film 9 serving as the bit line, the formation of a fine contact hole is inevitably required. The presence of a film having a low etching rate, such as the insulative film 7, is not desirable to form the fine contact hole 51. In the method of fabricating the semiconductor device of the second preferred embodiment, there is no need to etch the insulative film 7 having the low etching rate when the contact hole 51 is formed, facilitating the formation of the contact hole 51.

Preferred Embodiment 3

In the first preferred embodiment, the contact hole 51 is formed by etching the interlayer insulative films 11 and 8, the insulative film 7, and the substrate protective oxide film 6g in the single step using the same etchant, with the photoresist 12 formed on the interlayer insulative film 11 by the conventional transfer process being used as a mask, after the formation of the interlayer insulative film 11. However, the contact hole 51 may be formed in a plurality of fabrication steps.

Figure 28:
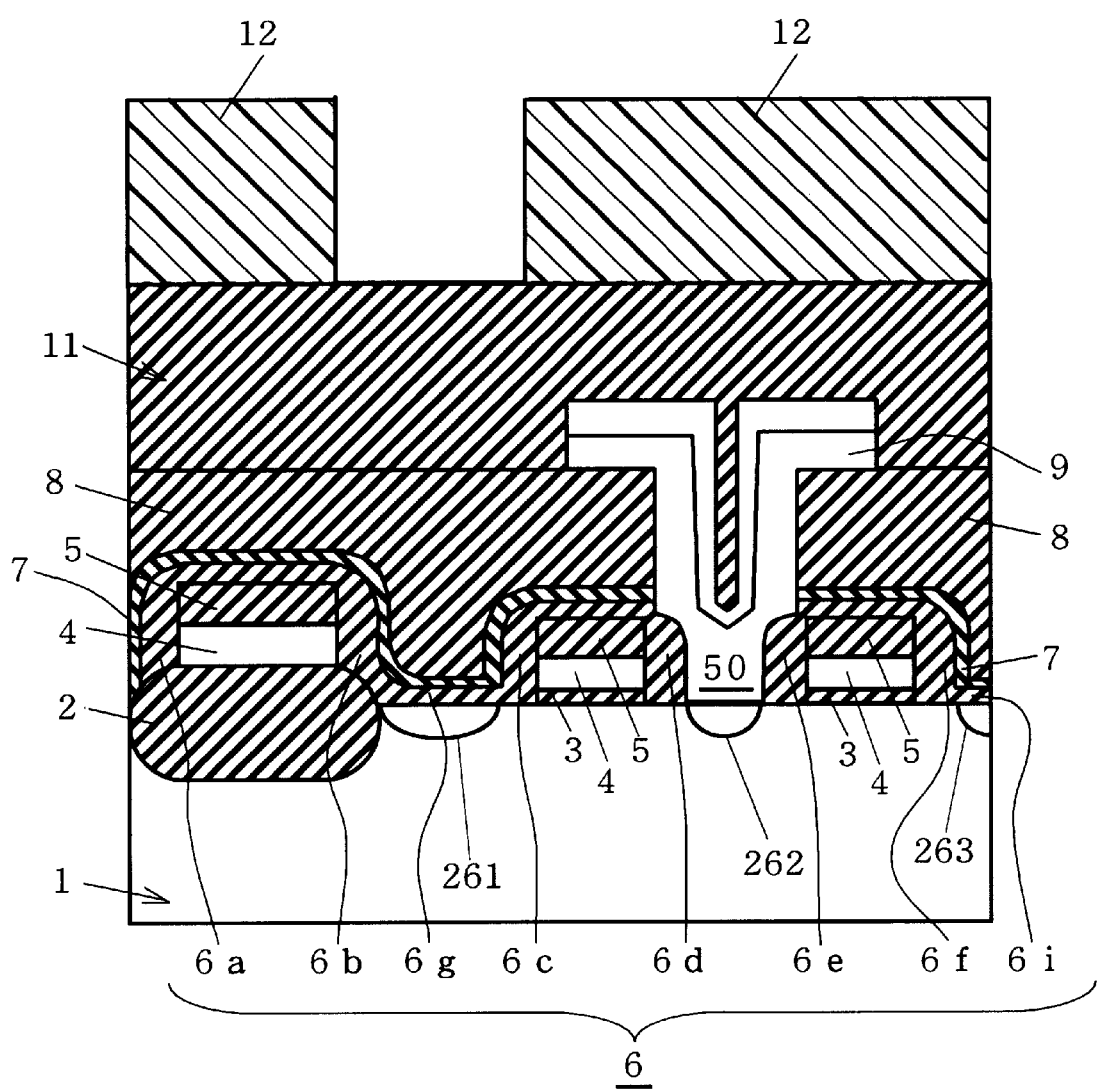
FIGS. 28 through 34 are cross-sectional views showing respective steps of the fabrication of the semiconductor device according to a third preferred embodiment of the present invention.

FIGS. 28 through 34 are cross-sectional views showing respective steps of the fabrication of the semiconductor device in sequential order according to a third preferred embodiment of the present invention. First, the structure of FIG. 11 is provided through fabrication steps similar to those of the first preferred embodiment (FIG. 28).

Figure 29:
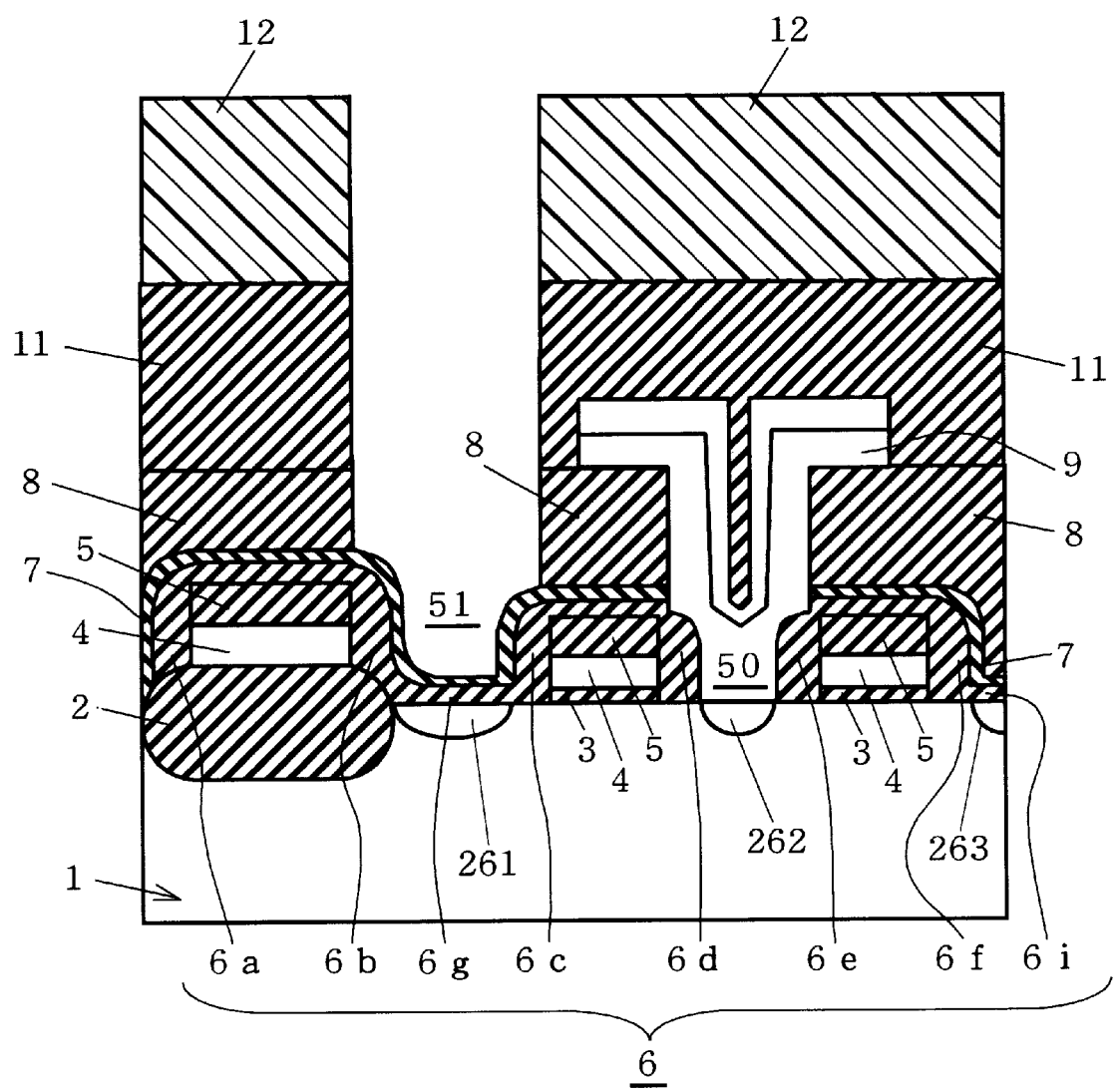

Using the photoresist 12 as a mask, only the interlayer insulative films 11 and 8 are etched by the oxide etching process using the $C_4F_8$ gas and the like. This etching process is stopped at the time when the insulative film 7 is exposed (FIG. 29). Since the etching rate of the insulative film 7 of $Si_3N_4$, SiON and the like is lower than that of the interlayer insulative films 8 and 11 of silicon oxide, this oxide etching process may be readily stopped at the time when the insulative film 7 is exposed, as described in the first preferred embodiment.

Figure 30:
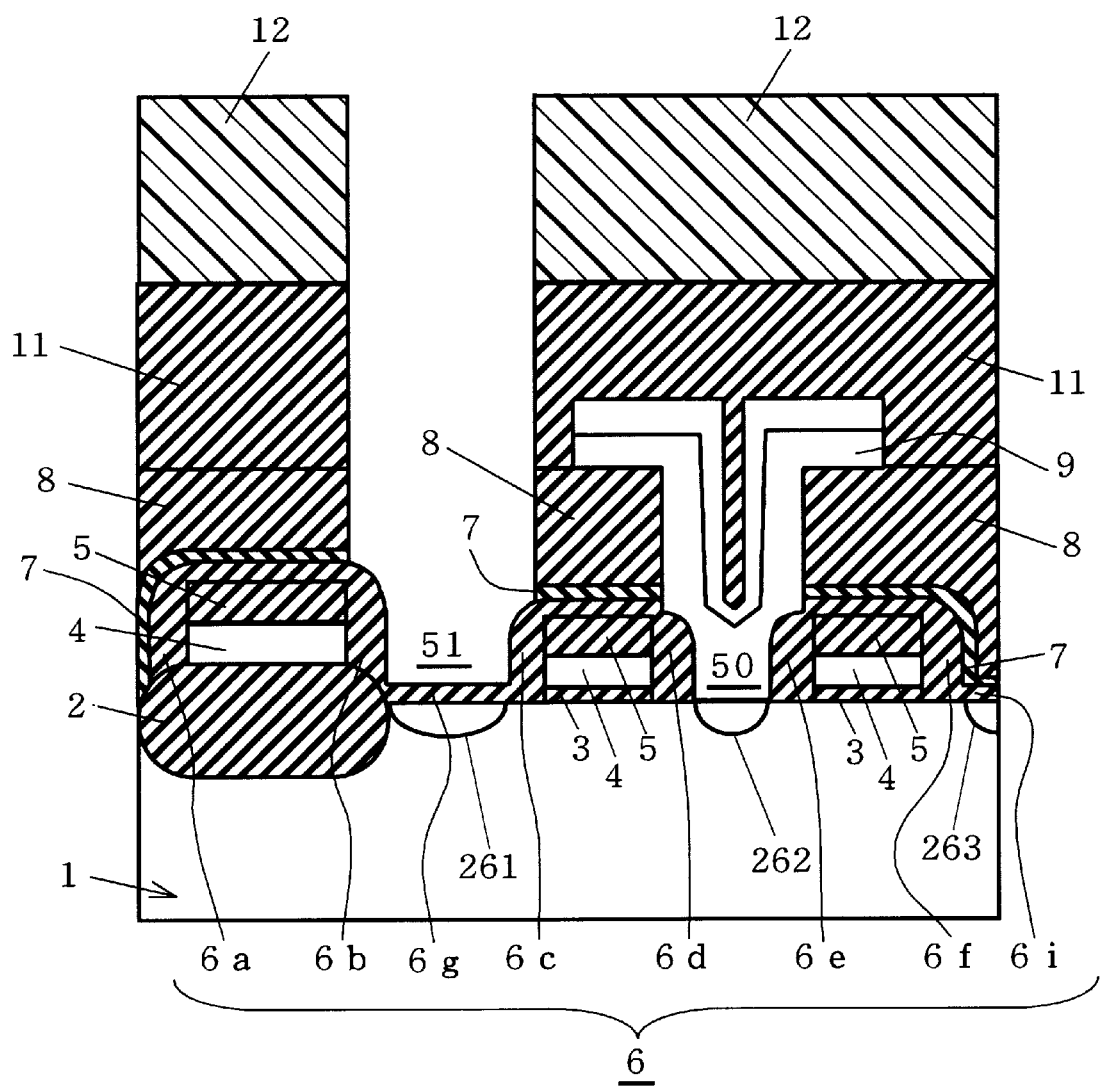
Figure 31:
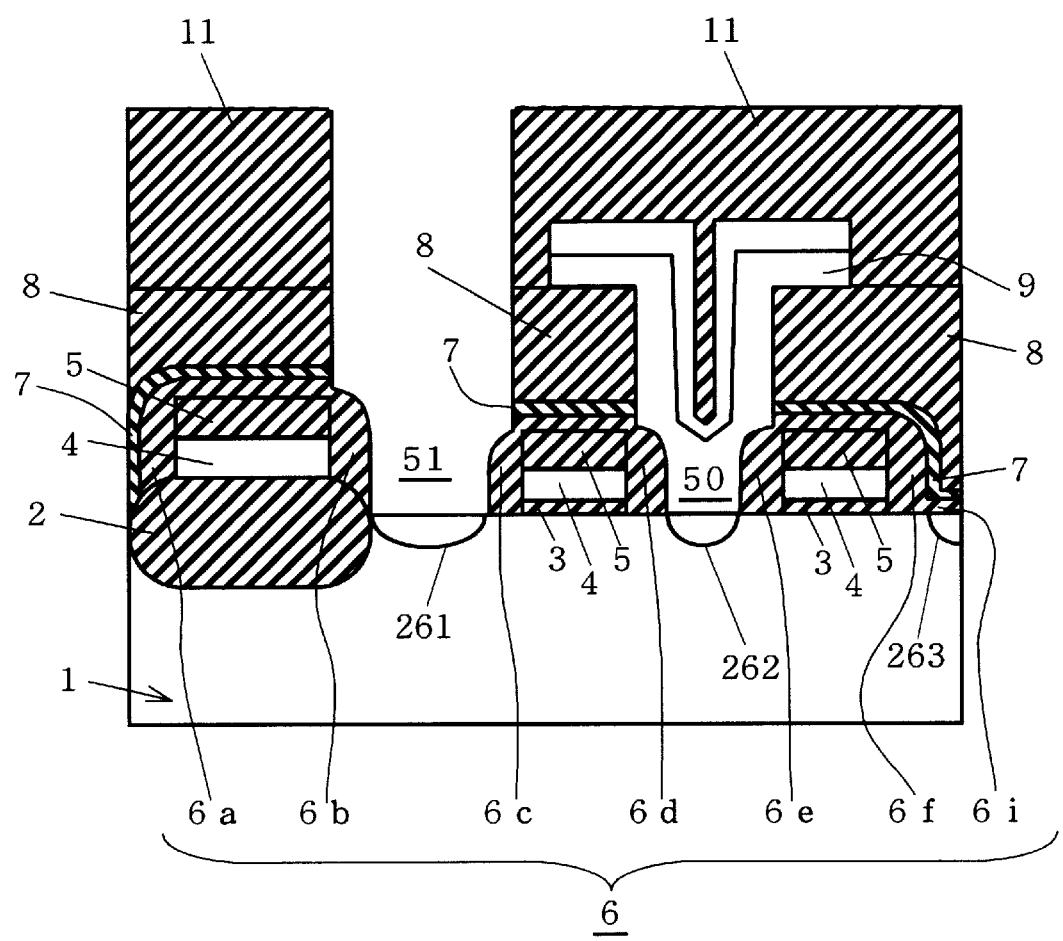

With the photoresist 12 used as a mask, only the insulative film 7 is removed by the etching process using the $CF_4$ gas and the like (FIG. 30). Anisotropic oxide etching using the photoresist 12 as a mask removes the substrate protective oxide film 6g to expose the source/drain region 261. Then, the photoresist 12 is removed (FIG. 31).

Figure 32:
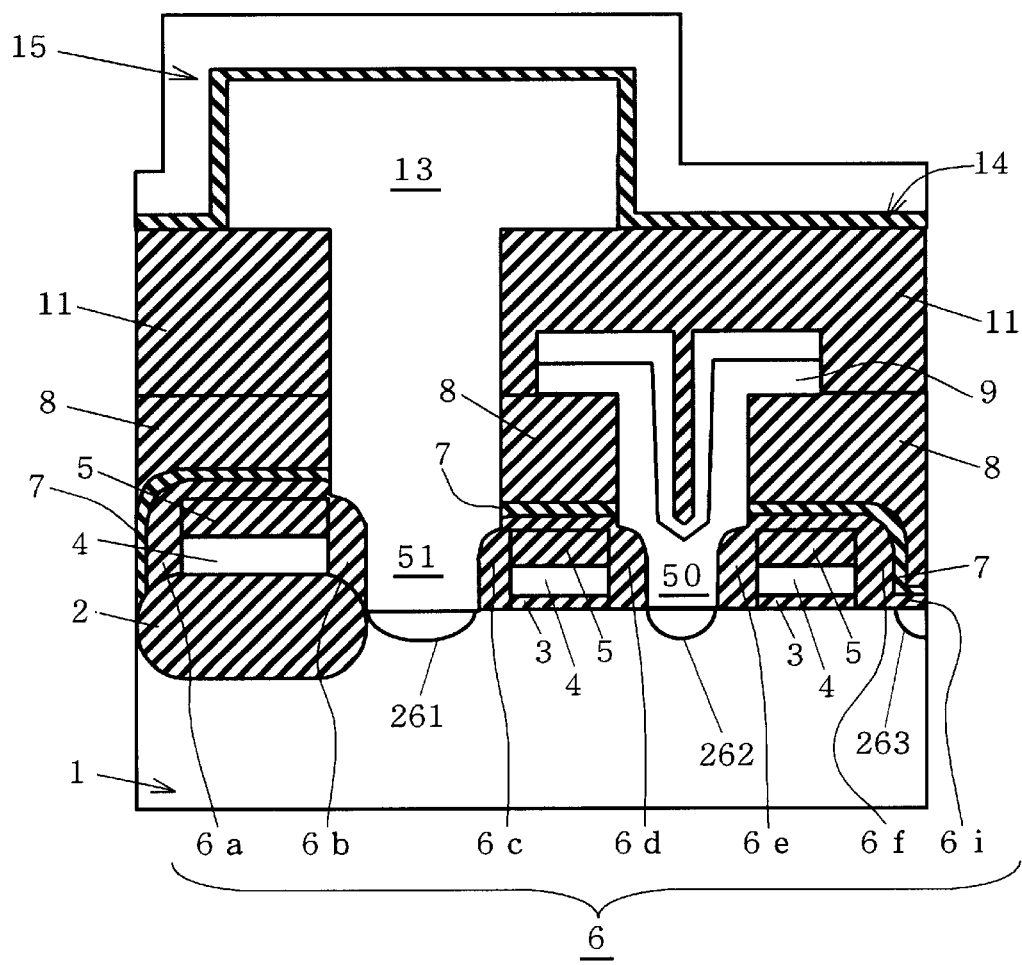
Figure 33:
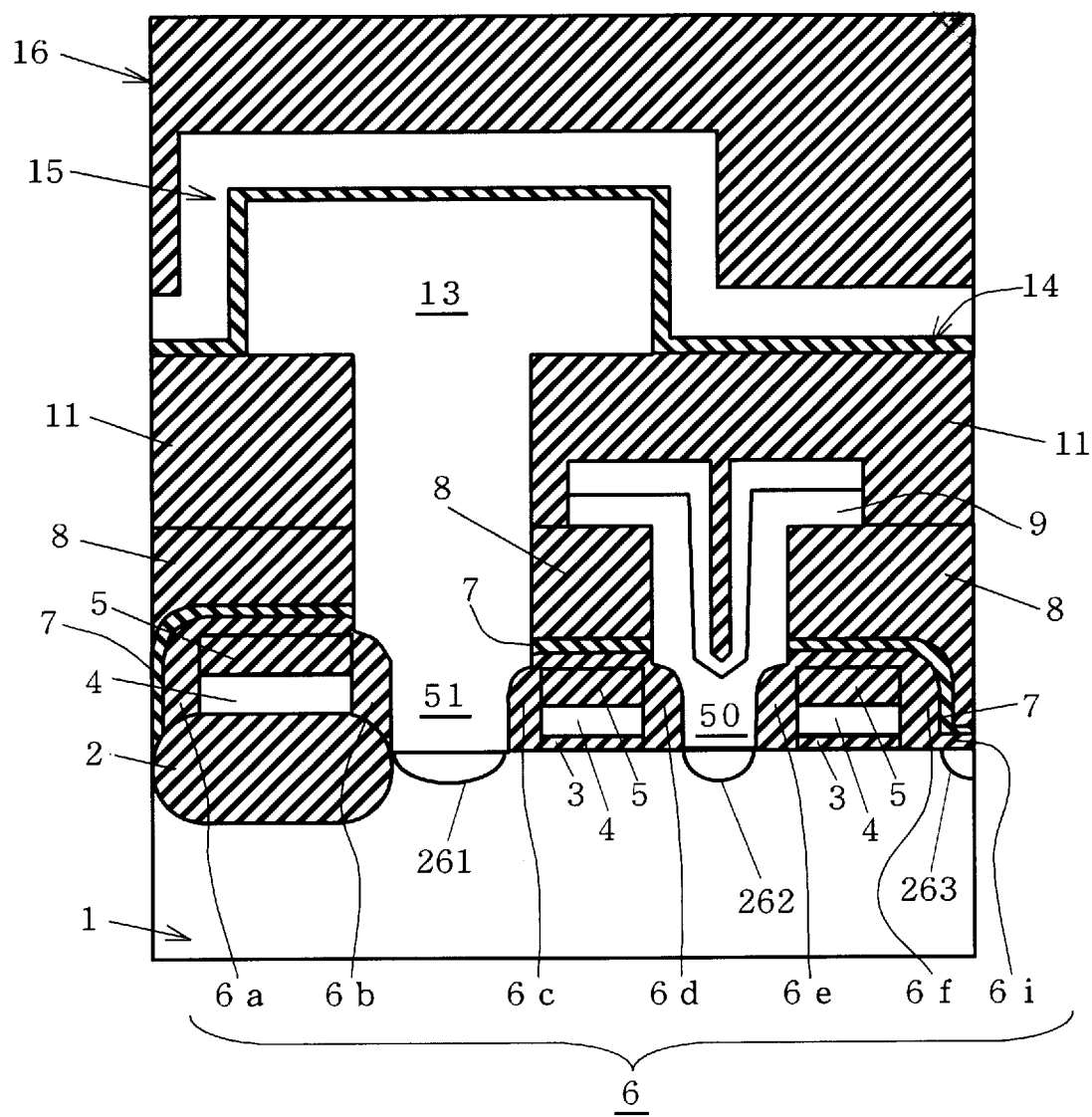
Figure 34:
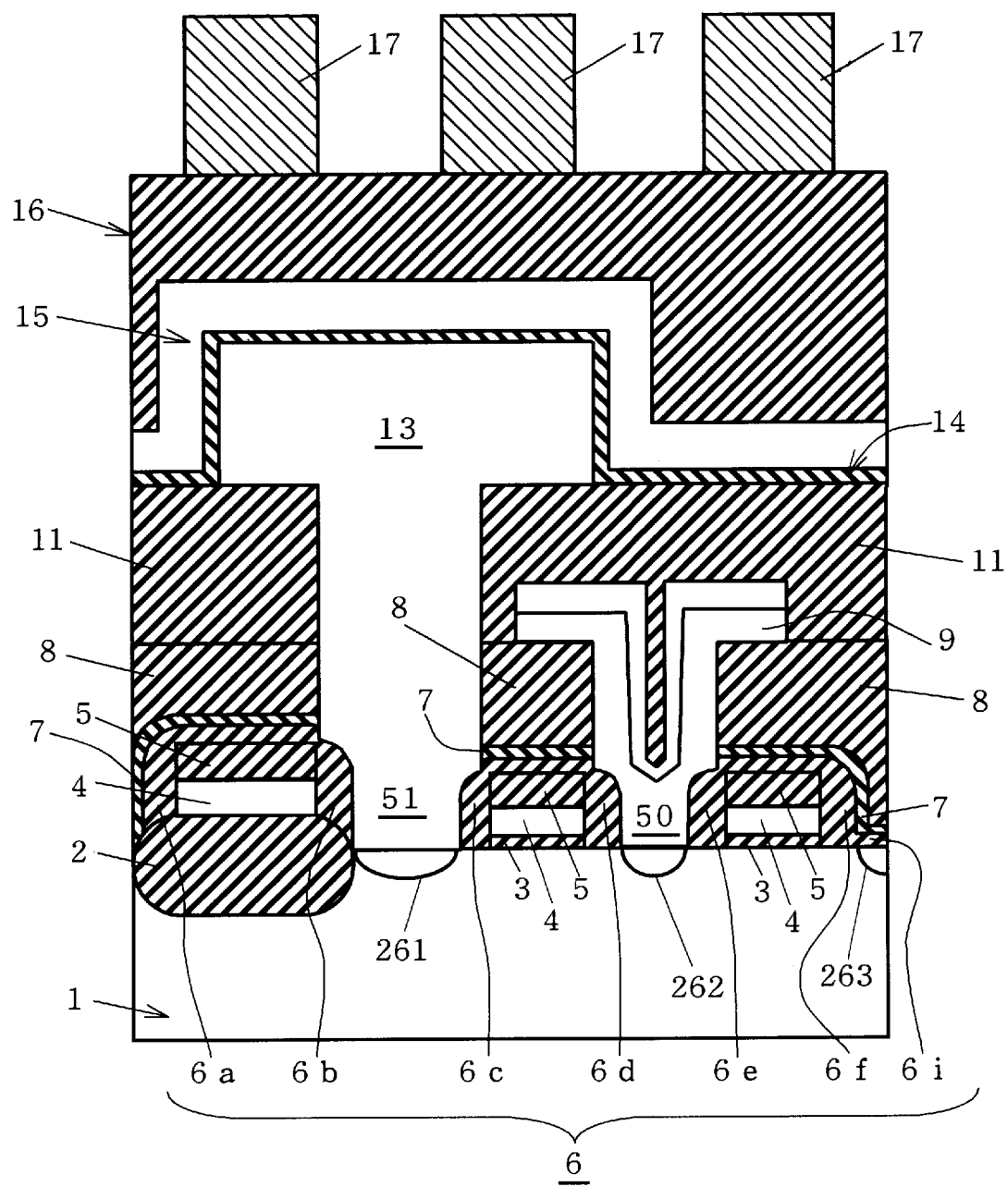

Thereafter, fabrication steps similar to those of the first preferred embodiment are performed until the interconnect layers 17 are formed. More specifically, the capacitor lower electrode 13 is formed for connection to the source/drain region 261 through the contact hole 51, and then the capacitor dielectric film 14 and the capacitor upper electrode 15 are formed (FIG. 32). The interlayer insulative film 16 is formed over the top surface (FIG. 33). The interconnect layers 17 are selectively formed on the interlayer insulative film 16 (FIG. 34).

In the method of fabricating the semiconductor device according to the third preferred embodiment, as above described, the insulative film 7 having the low etching rate functions as an etch stopper when the contact hole 51 is formed. Similar to the contact hole 50 of the first preferred embodiment, the contact hole 51 is formed in a self-aligned fashion in non-contacting relation to the gate electrodes 4.

In the first preferred embodiment, the contact hole 51 is formed by etching the interlayer insulative films 11 and 8, and the substrate protective oxide film 6g in the single step using the same etchant. This method causes difficulties in controlling the etching amount because of the substantial thickness of the films to be removed. However, in the method of the third preferred embodiment, only the interlayer insulative films 11 and 8 are first etched, and thereafter only the insulative film 7 is etched. Thus, no influences are exerted upon the source/drain region 261. In the subsequent step of etching only the substrate protective oxide film 6g, the thinness of the film to be removed allows the etching amount to be readily controlled. This decreases the amount of overetching of the semiconductor substrate 1 during the etching process for forming the contact hole 51, causing a smaller amount of crystal defects 25 adjacent the source/drain region 261 than the method of the first preferred embodiment.

Preferred Embodiment 4

In the first preferred embodiment, only the source/drain region 262 is exposed once after the interlayer insulative film 8 is formed. However, the source/drain region 261 may be exposed at the same time.

Figure 35:
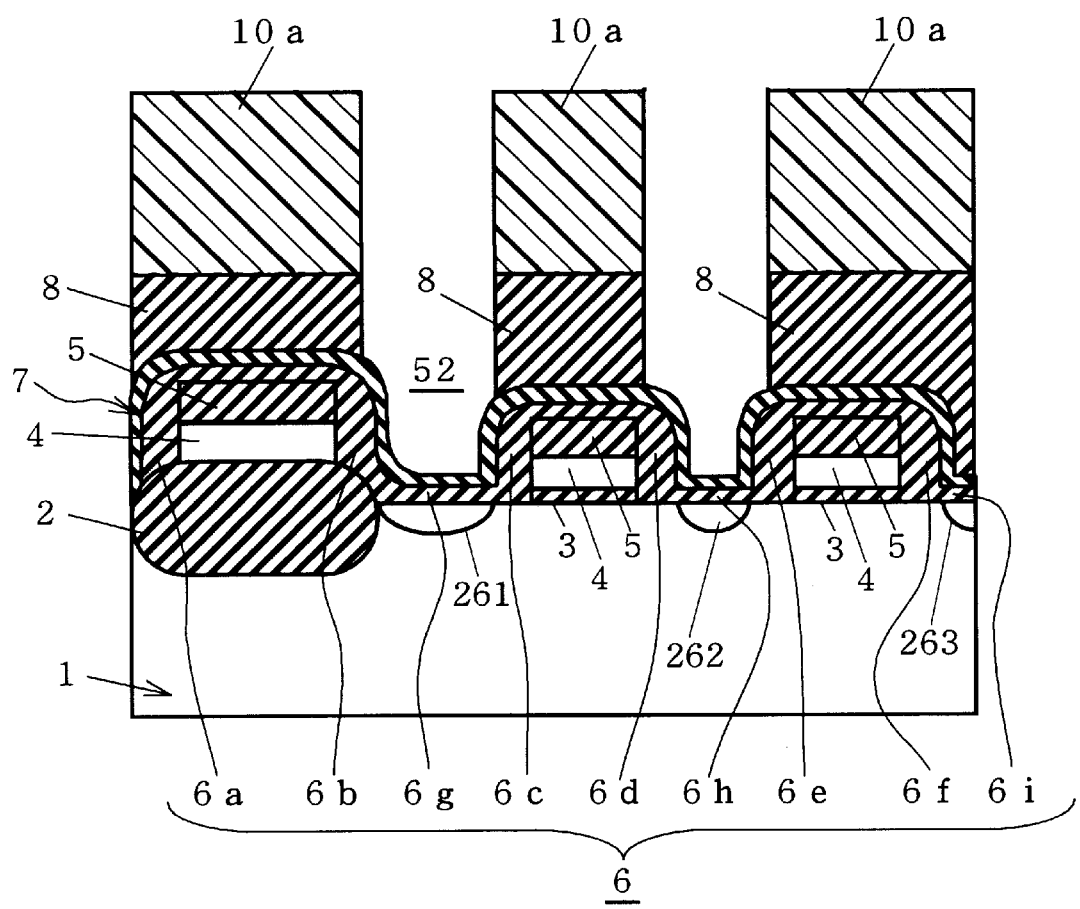
FIGS. 35 through 44 are cross-sectional views showing respective steps of the fabrication of the semiconductor device according to a fourth preferred embodiment of the present invention.

FIGS. 35 through 44 are cross-sectional views showing respective steps of the fabrication of the semiconductor device in sequential order according to a fourth preferred embodiment of the present invention. First, the structure of FIG. 5 is provided through fabrication steps similar to those of the first preferred embodiment. Then, a photoresist 10a having openings over the source/drain regions 261 and 262 is formed on the interlayer insulative film 8 by the conventional transfer process. Using the photoresist 10a as a mask, only the interlayer insulative film 8 is subjected to the oxide etching using the $C_4F_8$ gas and the like which forms contact holes 50 and 52 (FIG. 35).

Figure 36:
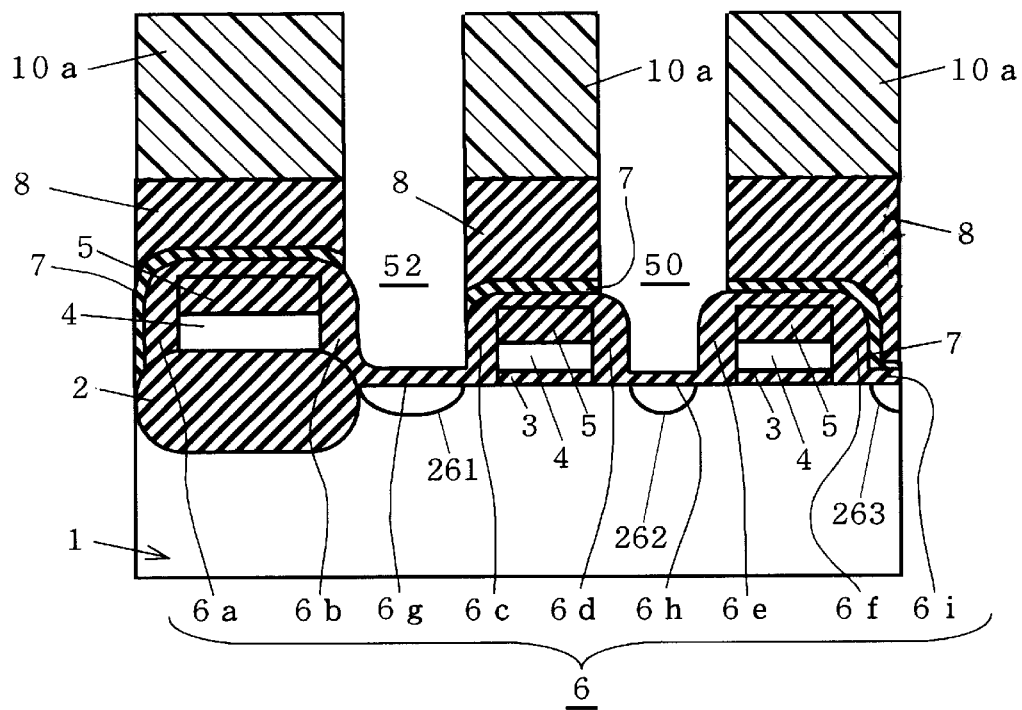
Figure 37:
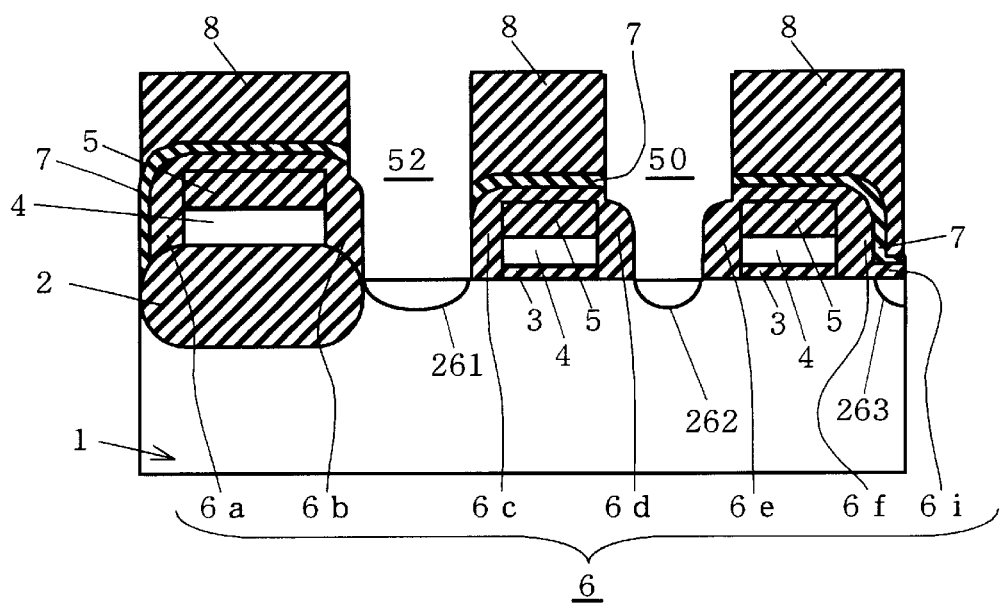

Using the photoresist 10a as a mask, an etching process using the $CF_4$ gas and the like removes only the insulative film 7 (FIG. 36). Anisotropic oxide etching using the photoresist 10a as a mask removes the substrate protective films 6g and 6h to expose the source/drain regions 261 and 262. Then, the photoresist 10a is removed (FIG. 37).

Figure 38:
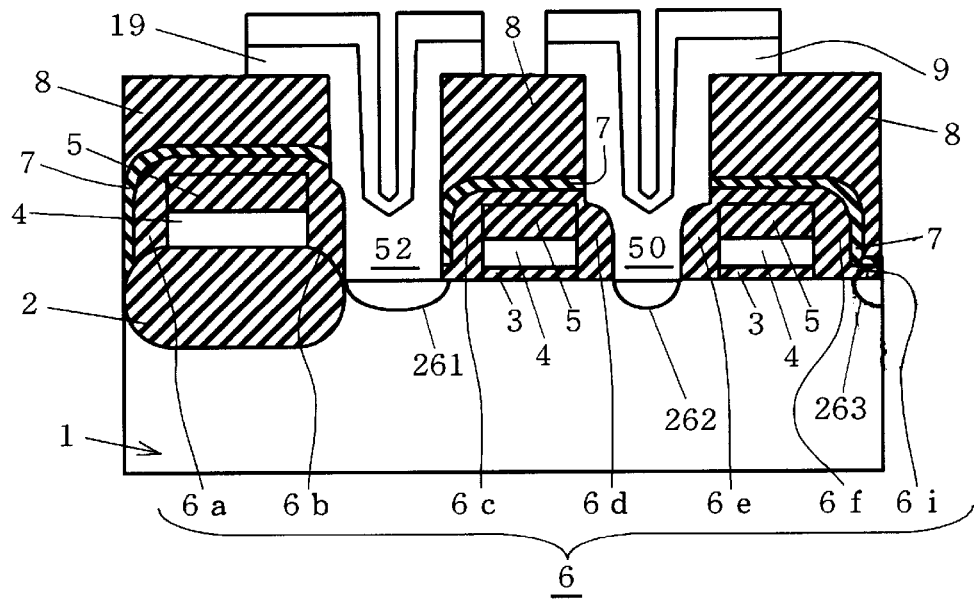

The conductive film 9 serving as the bit line is formed for connection to the source/drain region 262 through the contact hole 50. At the same time, a conductive film 19 similar in construction to the conductive film 9 is formed for connection to the source/drain region 261 through the contact hole 52 (FIG. 38). The conductive film 19 is to function as a connection electrode for establishing connection between the capacitor lower electrode 13 and the source/drain region 261.

Figure 39:
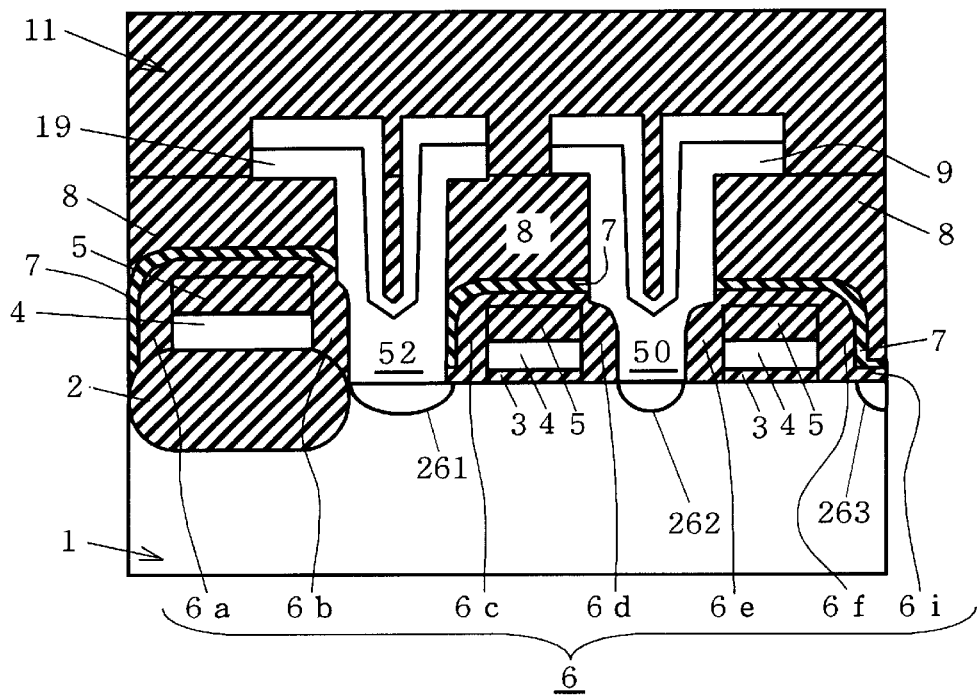
Figure 40:
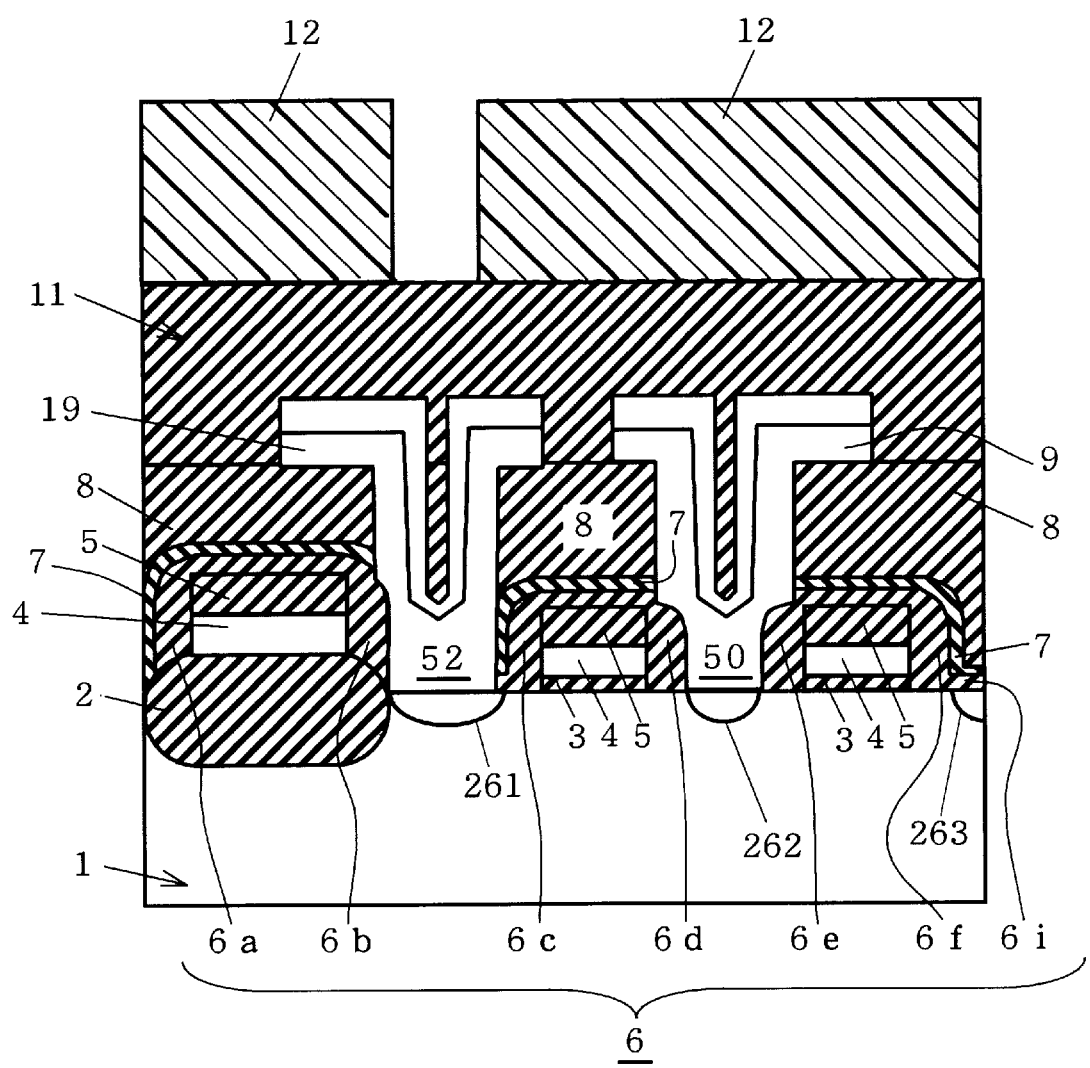

A silicon oxide film, for example, is deposited over the top surface by the CVD process to form the interlayer insulative film 11 (FIG. 39). The photoresist 12 having an opening over the source/drain region 261 is formed on the interlayer insulative film 11 by the conventional transfer process (FIG. 40).

Figure 41:
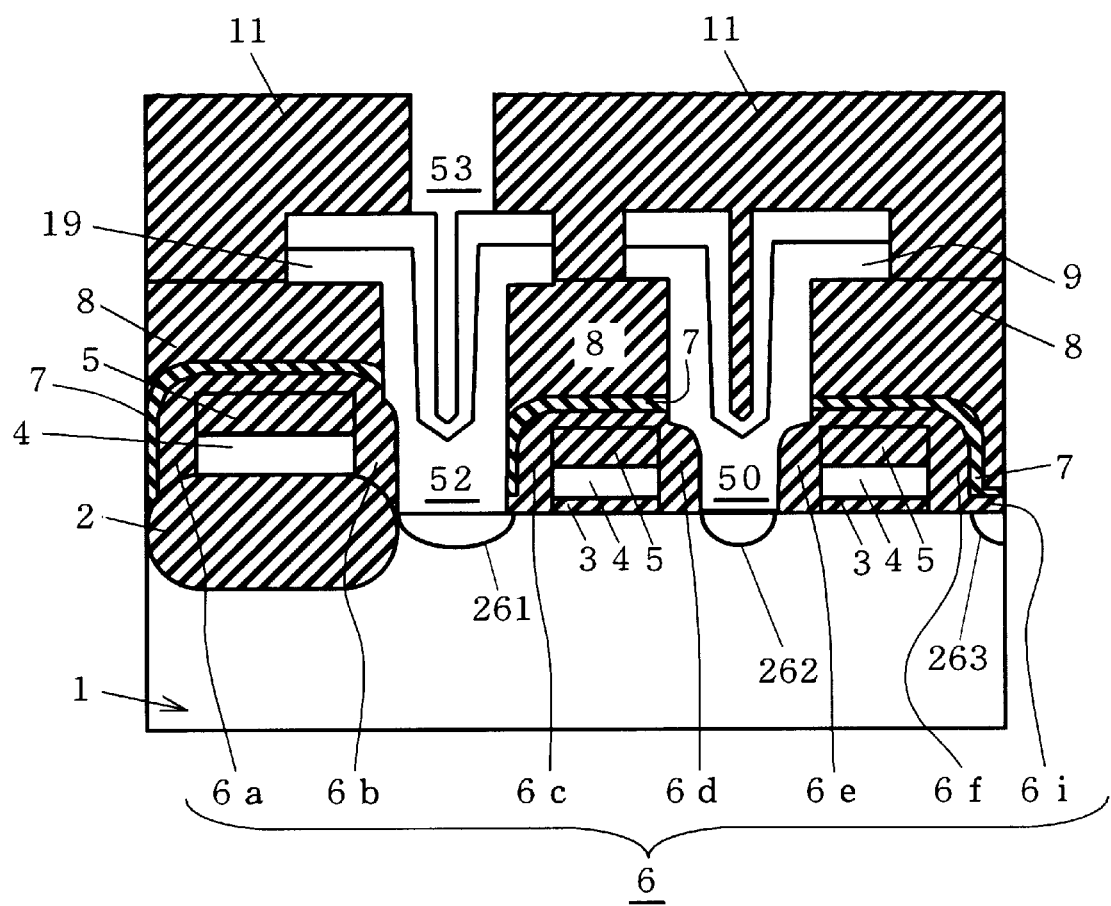

Using the photoresist 12 as a mask, the interlayer insulative film 11 is subjected to etching which forms a contact hole 53 to expose the conductive film 19. Then, the photoresist 12 is removed (FIG. 41).

Figure 42:
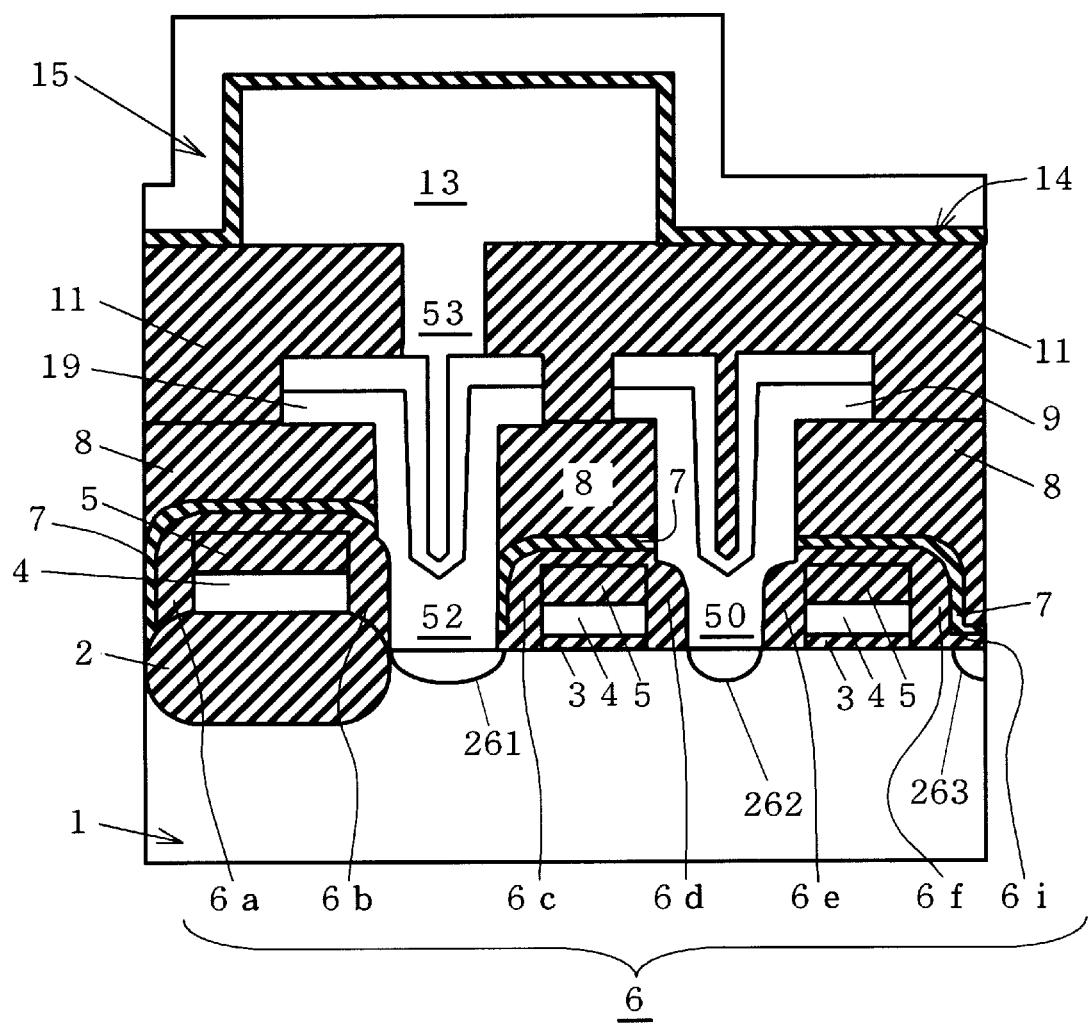
Figure 43:
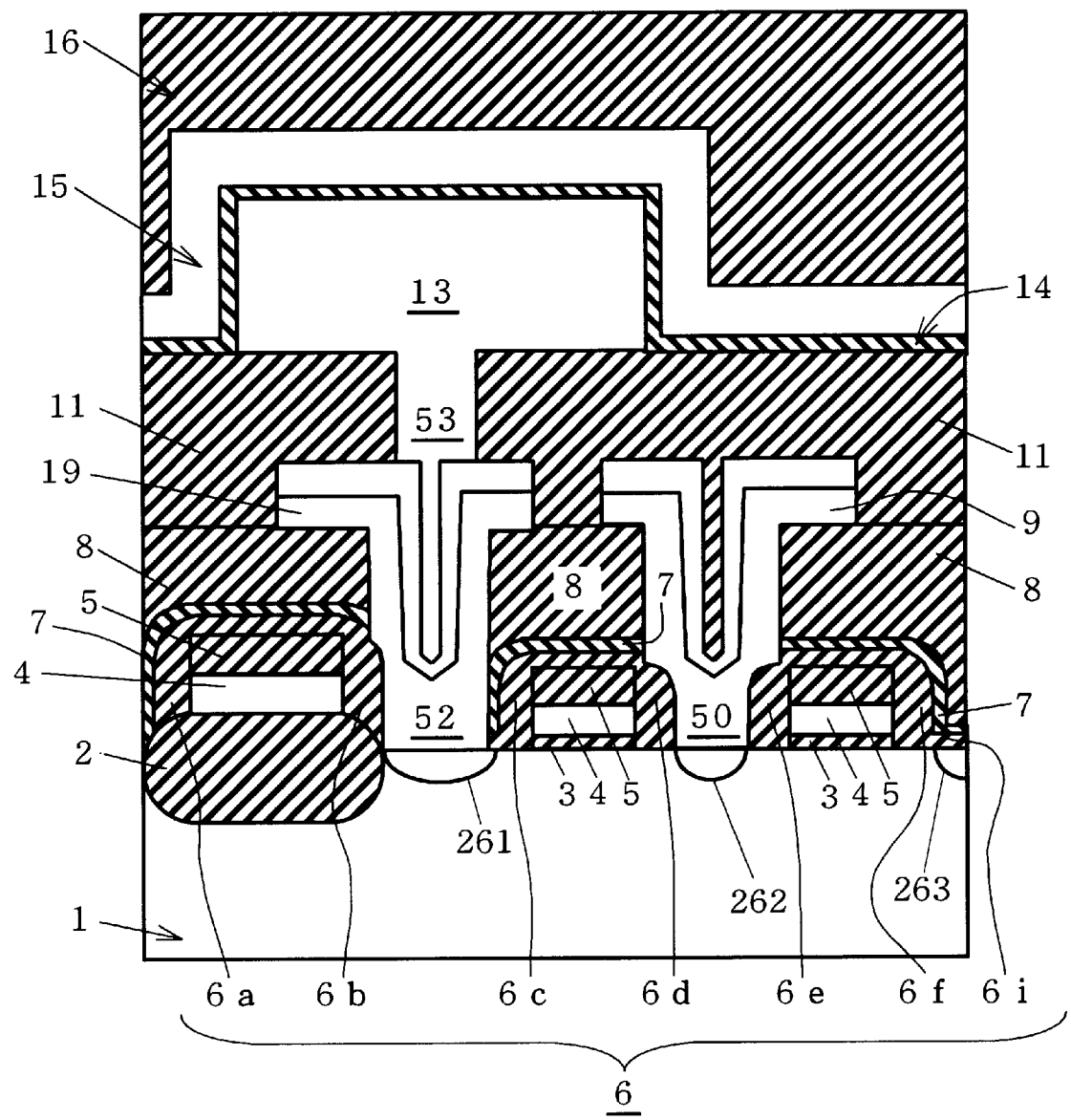
Figure 44:
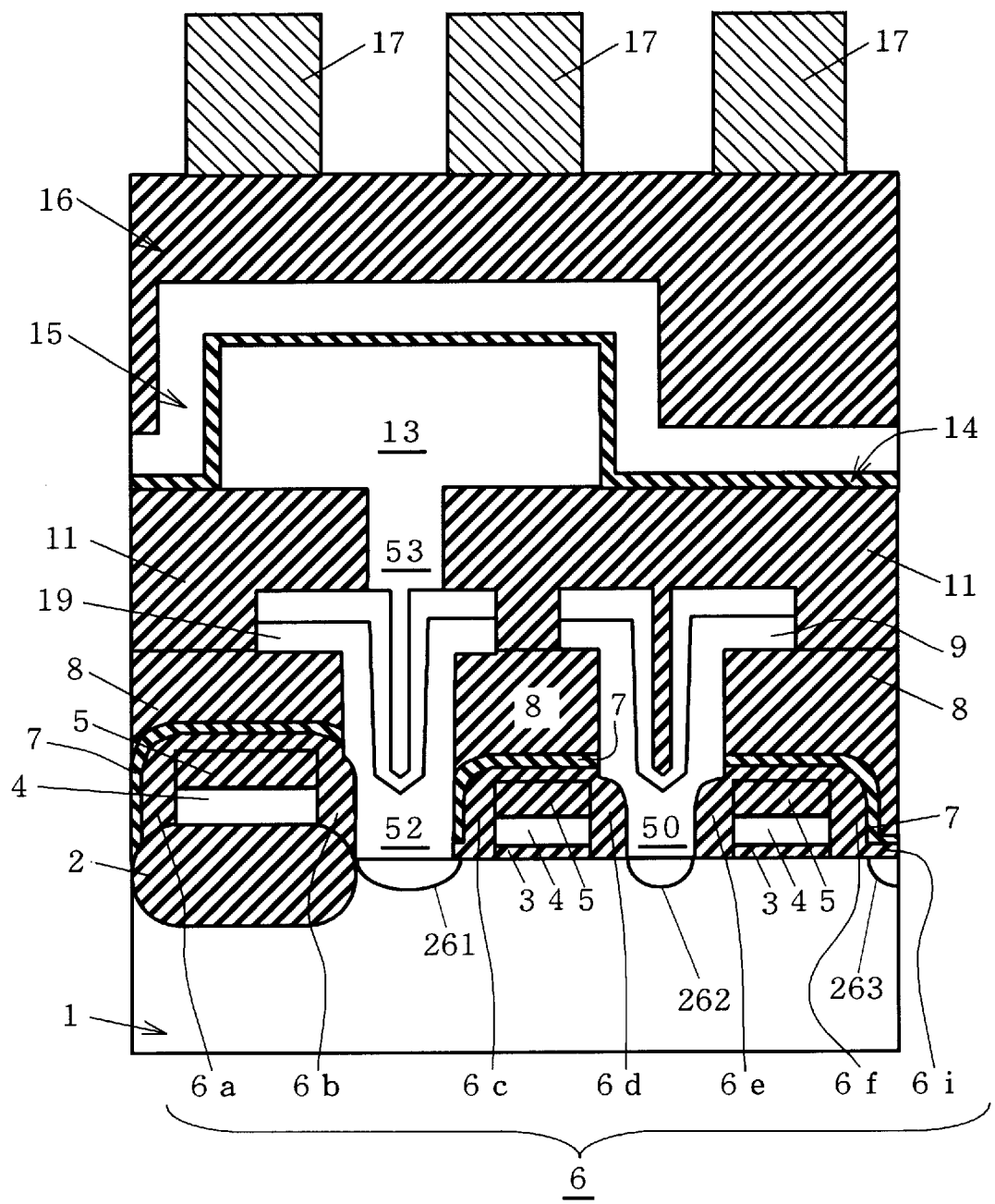

Thereafter, fabrication steps similar to those of the first preferred embodiment are performed until the interconnect layers 17 are formed. More specifically, the capacitor lower electrode 13 is formed for connection to the conductive film 19 through the contact hole 53, and then the capacitor dielectric film 14 and the capacitor upper electrode 15 are formed over the entire surface (FIG. 42). The interlayer insulative film 16 is formed over the top surface (FIG. 43). The interconnect layers 17 are selectively formed on the interlayer insulative film 16 (FIG. 44).

In the method of fabricating the semiconductor device according to the fourth preferred embodiment, as above described, the insulative film 7 having the low etching rate functions as an etch stopper against etching of the interlayer insulative film 8 when the contact holes 50 and 52 are formed. Therefore, the contact holes 50 and 52 may be formed in a self-aligned fashion in non-contacting relation to the gate electrodes 4.

In the third preferred embodiment, the insulative film 7 is exposed in the step of forming the contact hole 51 by etching the interlayer insulative films 11 and 8 in the single step using the same etchant. This method causes difficulties in controlling the etching because of the substantial thickness of the films to be removed. Excessive overetching during the etching of the interlayer insulative films 11 and 8 might break the insulative film 7 which should function as the etch stopper to overetch the surface of the source/drain region 261 since the substrate protective oxide film 6g underlying the insulative film 7 is an easy-to-etch silicon oxide film.

In the method of fabricating the semiconductor device according to the fourth preferred embodiment, however, the insulative films 11 and 8 are not etched in the single step to expose the insulative film 7. That is, only the interlayer insulative film 8 is once etched in the step prior to the formation of the interlayer insulative film 11 to expose the insulative film 7, and only the interlayer insulative film 11 is etched in the subsequent step. The thinness of the film to be removed in each of the steps may facilitate control of the etching amount. Therefore, overetching of the source/drain region 261 is avoided more easily.

Preferred Embodiment 5

In the first preferred embodiment, the insulative film 7 and the interlayer insulative film 8 are formed on the sidewalls 6a to 6f and the substrate protective oxide films 6g to 6i. However, an insulative film having an etching rate higher than that of the silicon oxide film 6 may be formed in place of the insulative film 7 and the interlayer insulative film 8.

Figure 45:
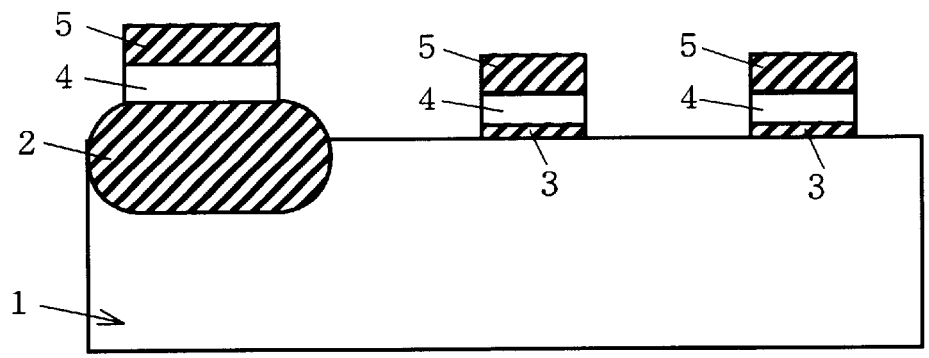
FIGS. 45 through 57 are cross-sectional views showing respective steps of the fabrication of the semiconductor device according to a fifth preferred embodiment of the present invention.

FIGS. 45 through 57 are cross-sectional views showing respective steps of the fabrication of the semiconductor device in sequential order according to a fifth preferred embodiment of the present invention. First, the structure of FIG. 3 is provided through fabrication steps similar to those of the first preferred embodiment. More specifically, the isolation insulative film 2 is formed on the semiconductor substrate 1 by the LOCOS technique, and laminated structures each comprised of the gate oxide film 3, the gate electrode 4, and the insulative film 5 stacked in this order are selectively formed on the semiconductor substrate 1 except where the isolation insulative film 2 is formed (FIG. 45).

Figure 46:
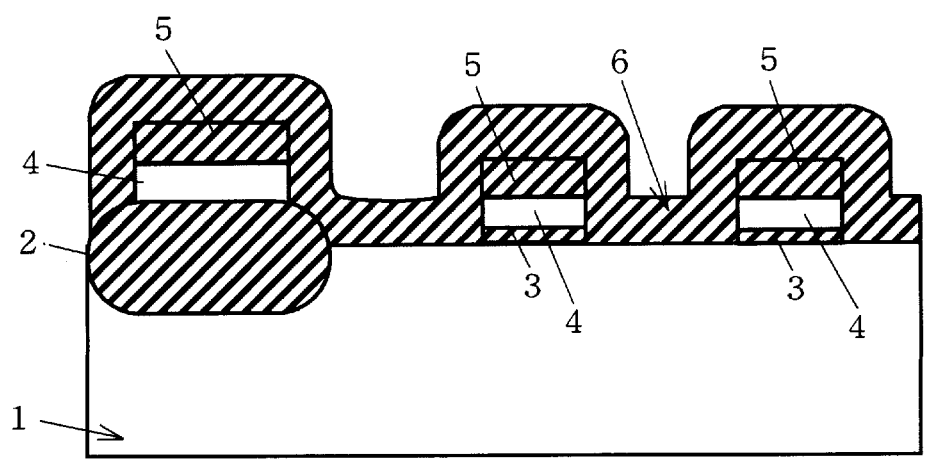
Figure 47:
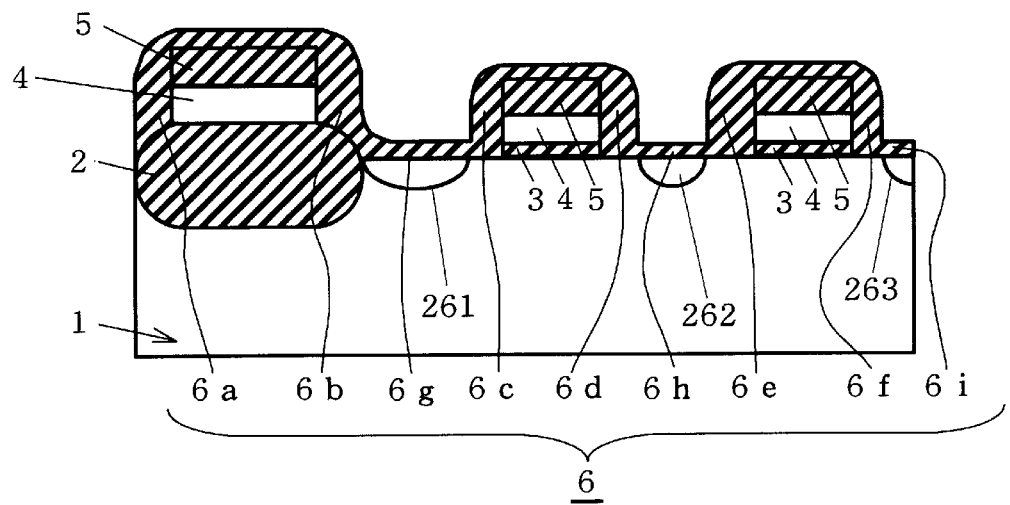

The silicon oxide film 6 is formed over the top surface by the CVD process (FIG. 46). Anisotropic oxide etching which provides a high etching rate in the direction perpendicular to the semiconductor substrate 1 is performed to etch the silicon oxide film 6, thereby forming the sidewalls 6a to 6f and the substrate protective oxide films 6g to 6i. Then, the source/drain regions 261 to 263 are formed (FIG. 47).

Figure 48:
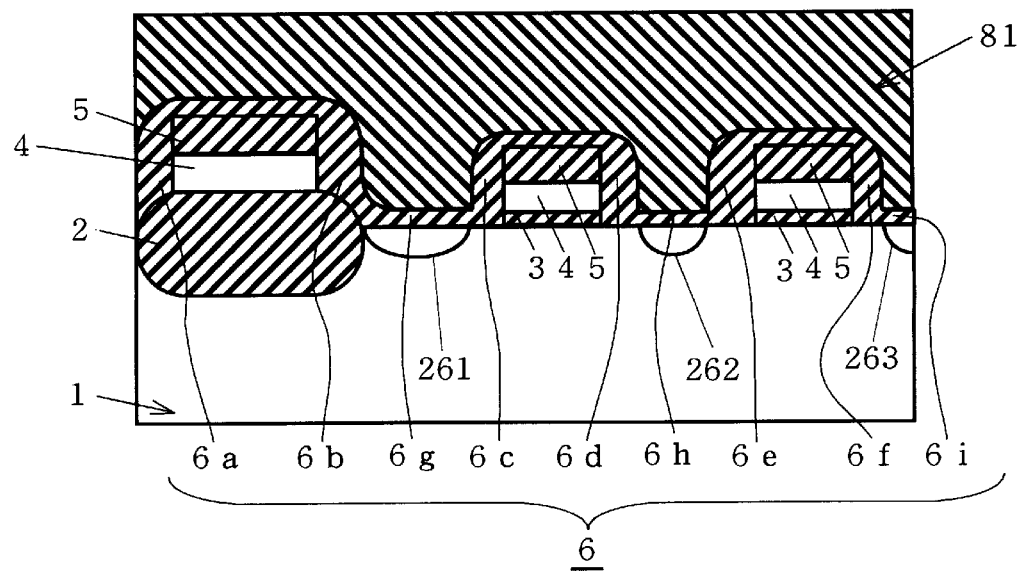

An interlayer insulative film (e.g., a silicon oxide film containing impurities such as boron and phosphorus) 81 having an etching rate higher than that of the silicon oxide film 6 is formed over the top surface (FIG. 48).

Figure 49:
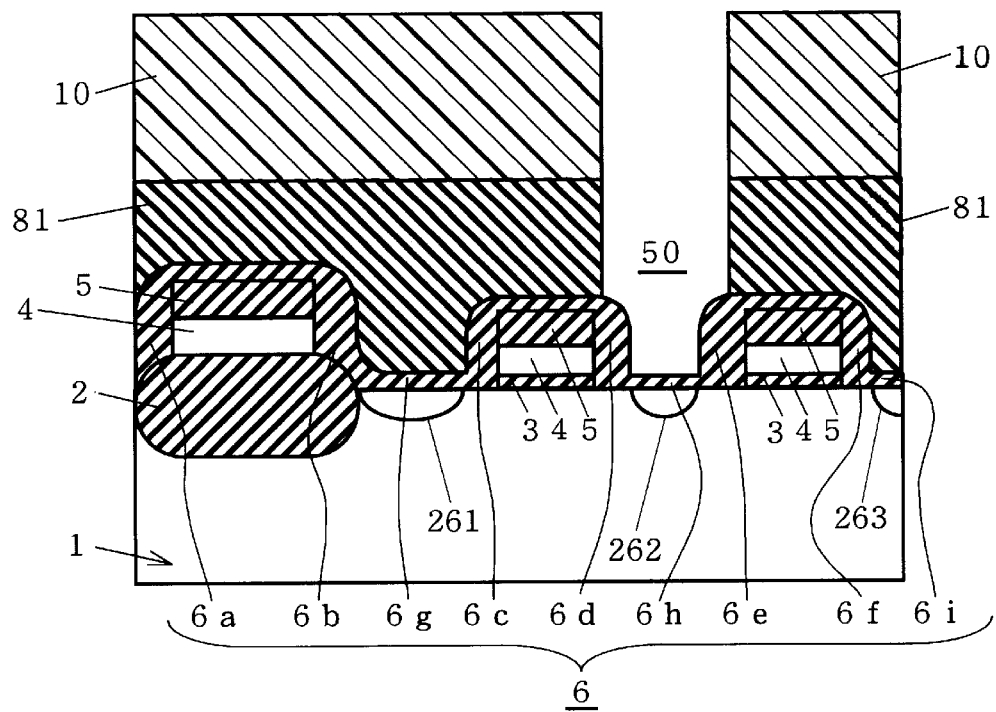

The photoresist 10 having an opening over the source/drain region 262 is formed on the interlayer insulative film 81 by the conventional transfer process. Only the interlayer insulative film 81 is etched using the photoresist 10 as a mask. An example of etchants used in this etching process includes $CHF_3$, $CF_4$, and a gas mixture thereof in the form of a low-density plasma (on the order of $10^{10}/cm^2$). The silicon oxide film 6 (particularly the sidewalls 6d, 6e and the substrate protective oxide film 6h) functions as an etch stopper because of the difference in etching rate. Then, the contact hole 50 is formed for exposing the sidewalls 6d, 6e and the substrate protective oxide film 6h (FIG. 49).

Figure 50:
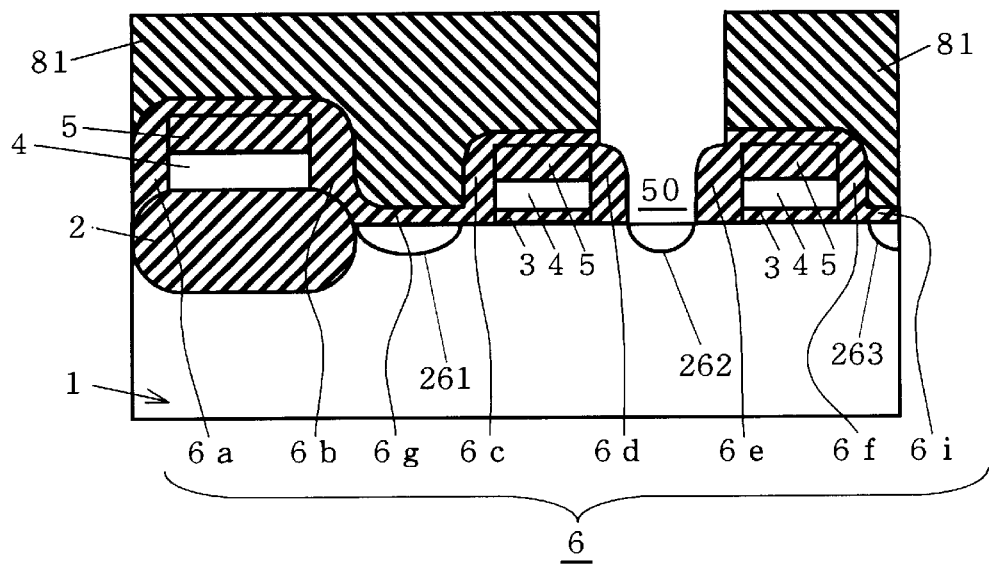

Anisotropic oxide etching using the photoresist 10 as a mask removes the substrate protective oxide film 6h to expose the source/drain region 262. During this anisotropic oxide etching process, the sidewalls 6d and 6e are also removed by the amount of the thickness of the substrate protective oxide film 6h. Then, the photoresist 10 is removed (FIG. 50).

Figure 51:
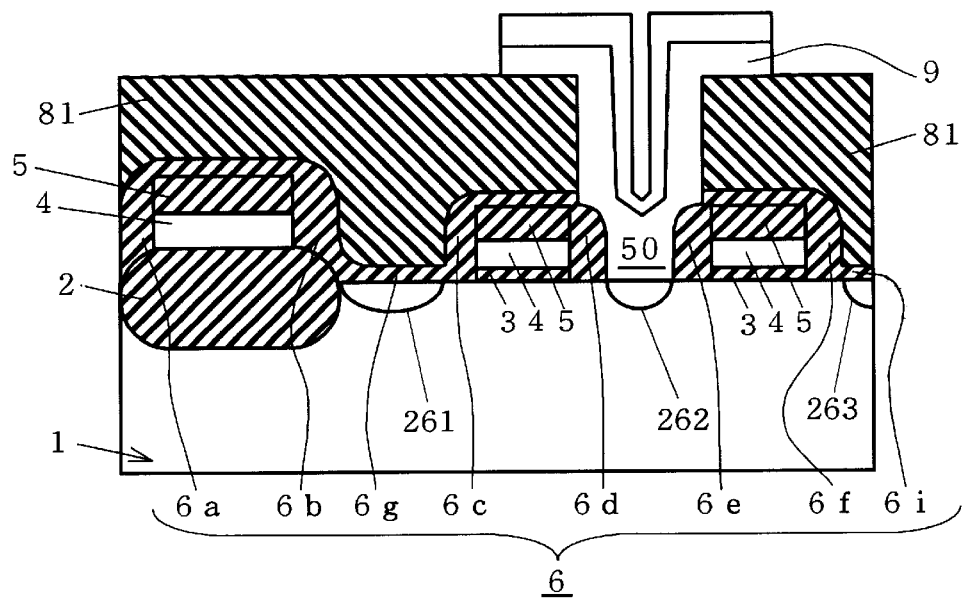
Figure 52:
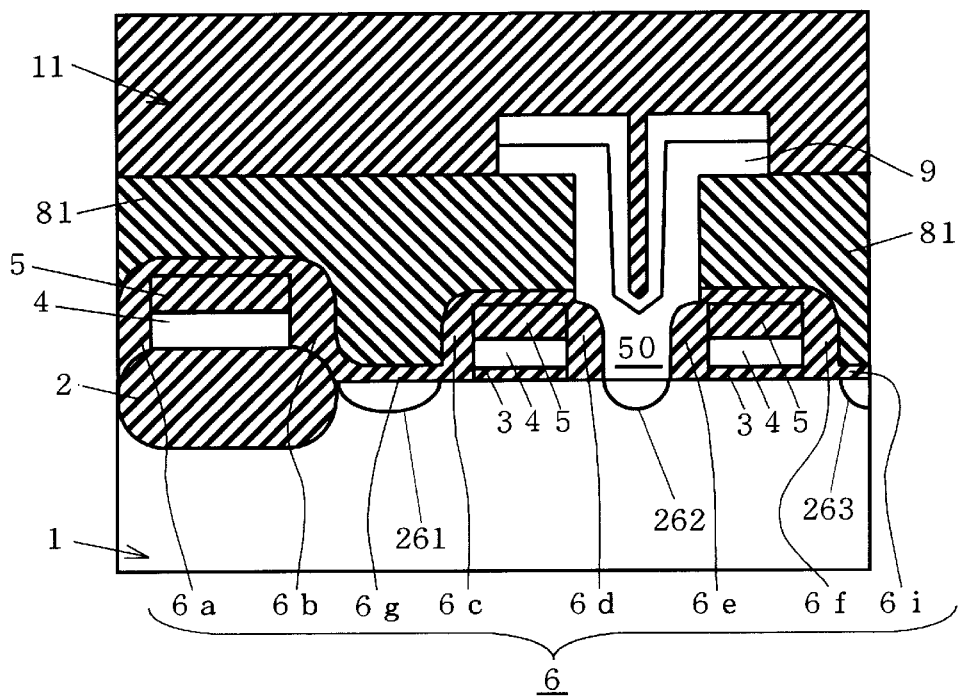

The conductive film 9 is formed for connection to the source/drain region 262 through the contact hole 50 (FIG. 51). The interlayer insulative film 11 is formed over the top surface (FIG. 52).

Figure 53:
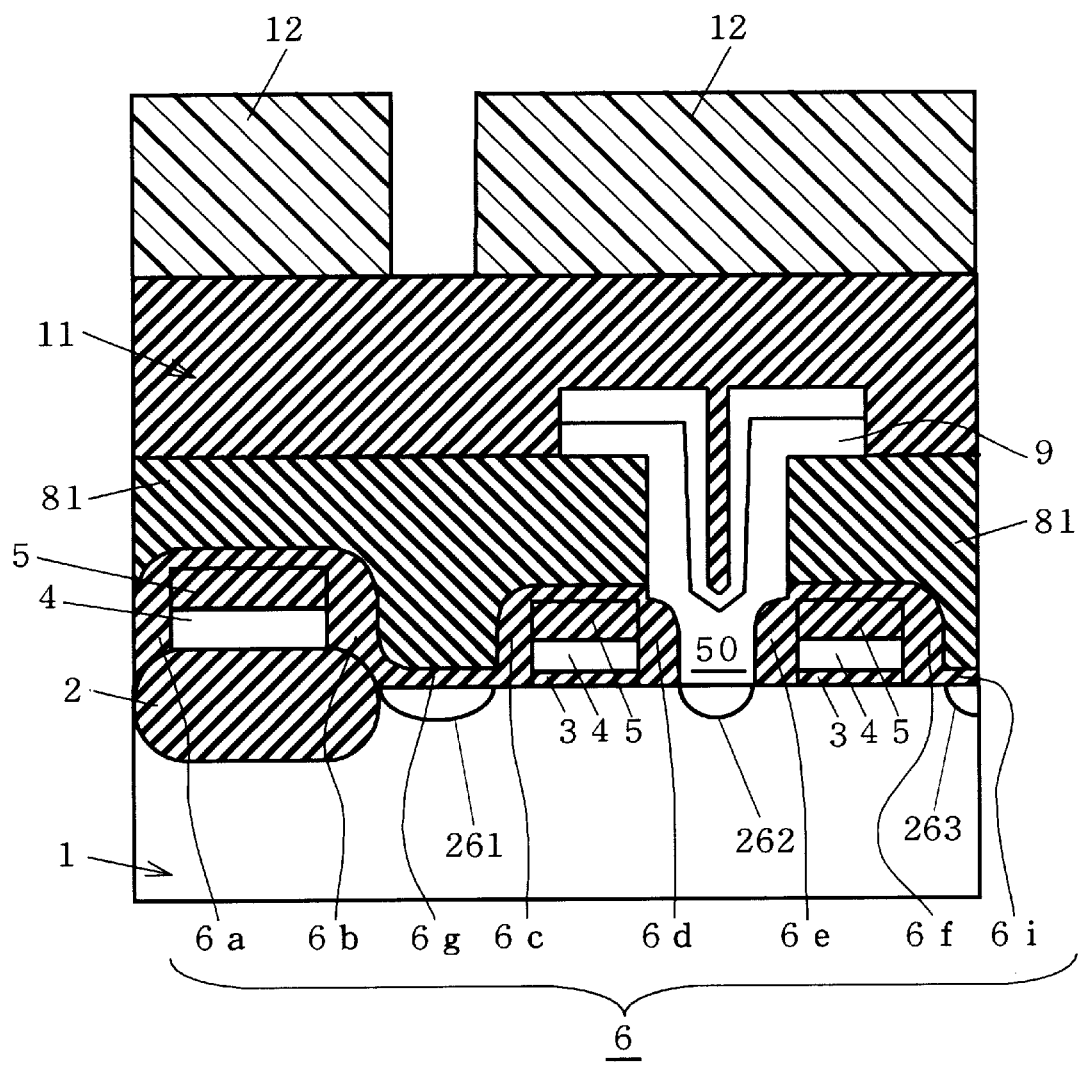
Figure 54:
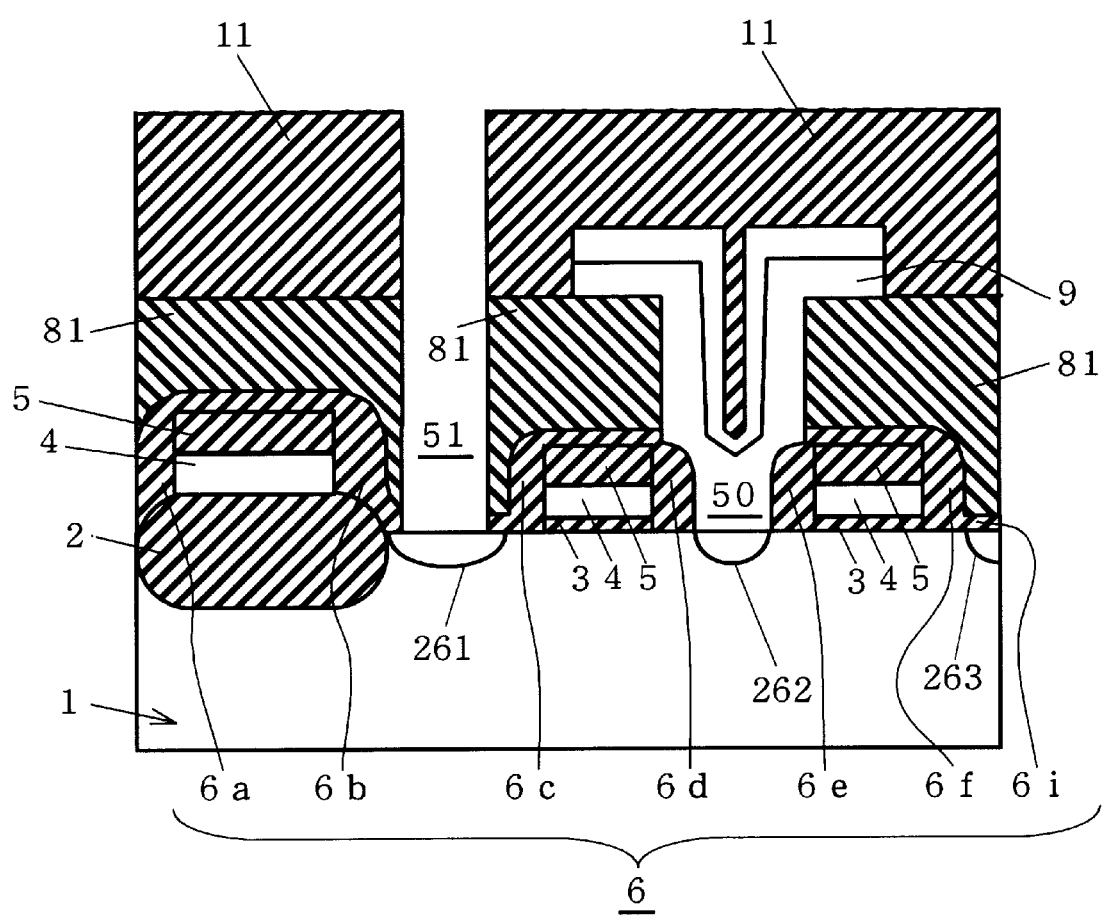

The photoresist 12 having an opening over the source/drain region 261 is formed on the interlayer insulative film 11 by the conventional transfer process (FIG. 53). With the photoresist 12 used as a mask, the interlayer insulative films 11 and 81 and the substrate protective oxide film 6g are subjected to etching using the same etchant which forms the contact hole 51 to expose the source/drain region 261 (FIG. 54).

Figure 55:
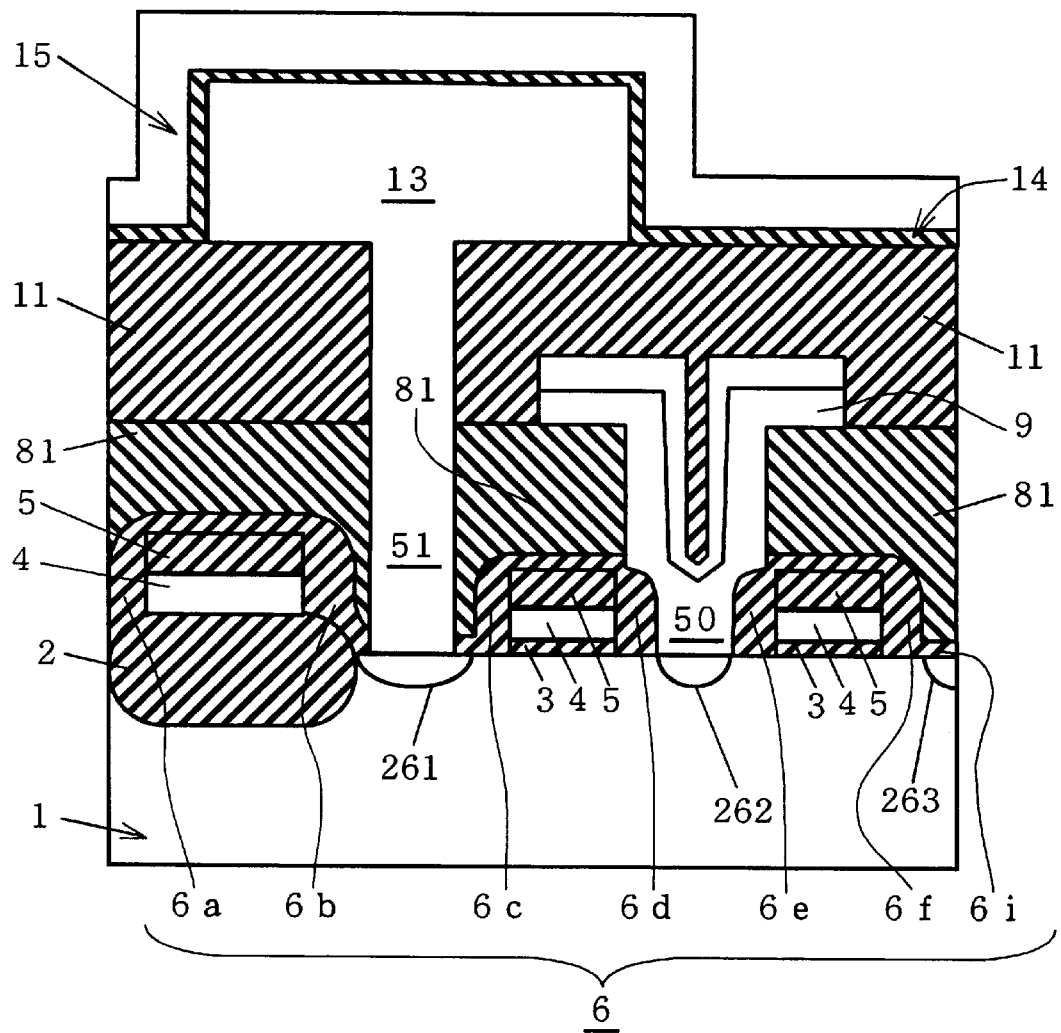
Figure 56:
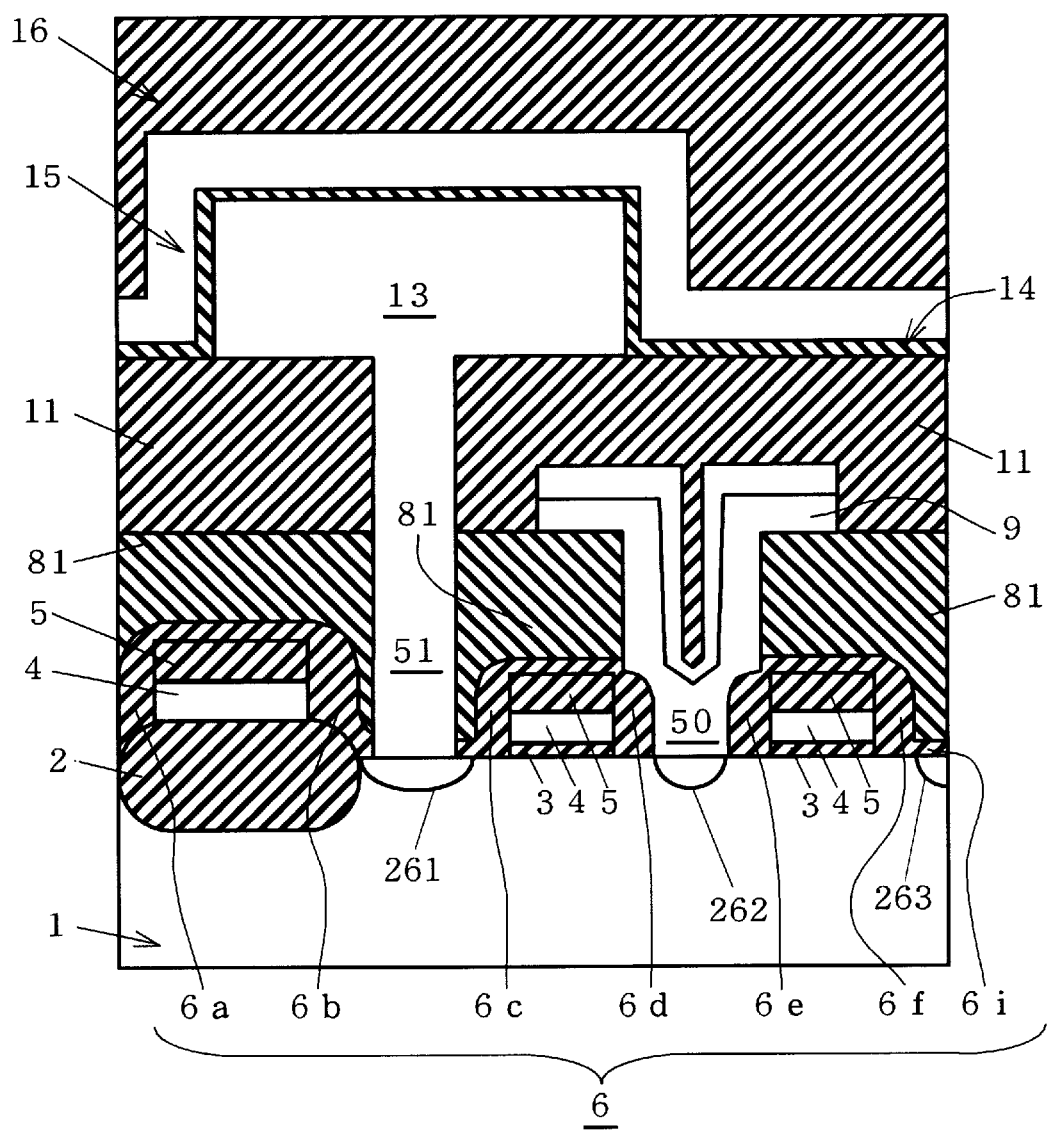
Figure 57:
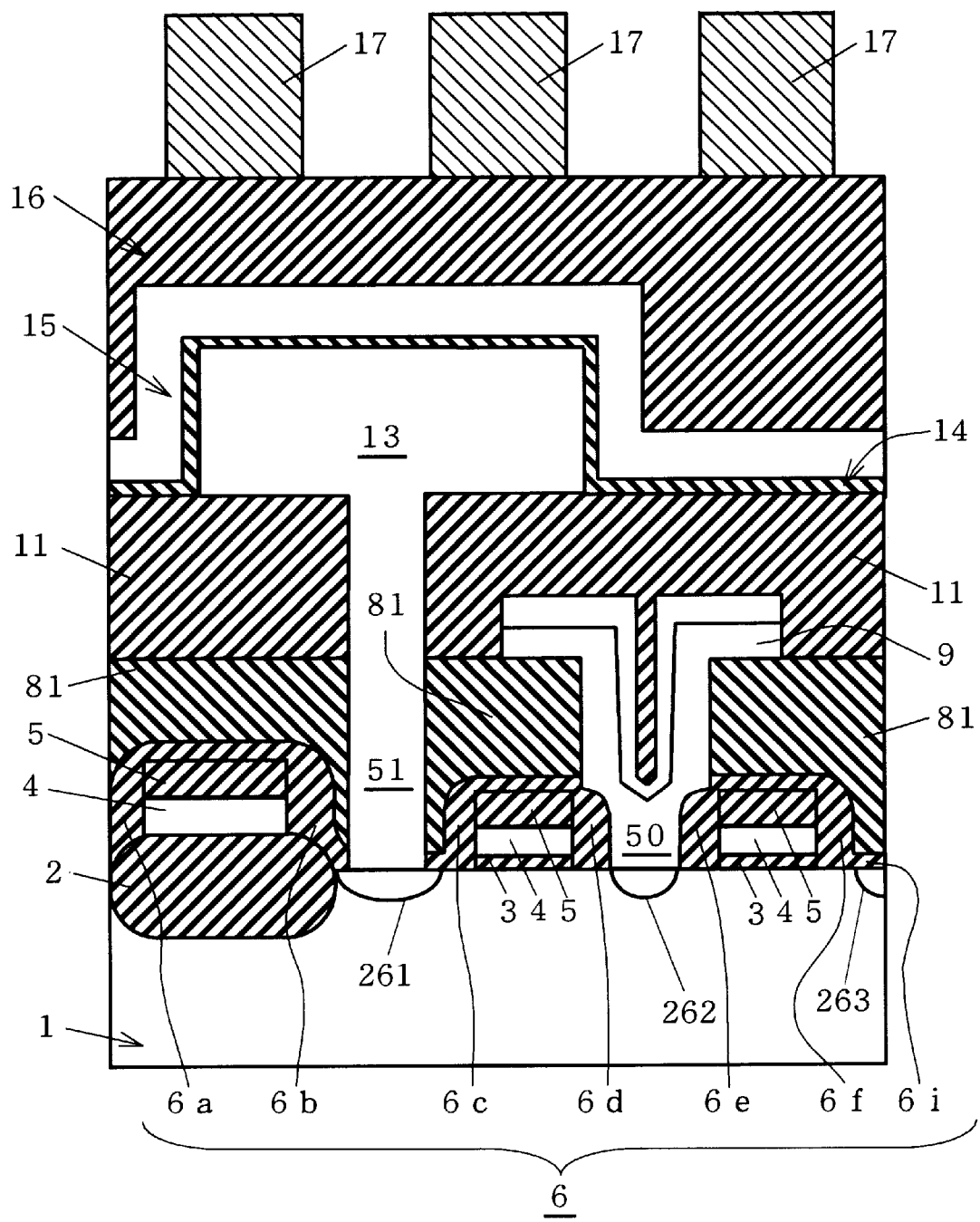

Thereafter, fabrication steps similar to those of the first preferred embodiment are performed until the interconnect layers 17 are formed. More specifically, the capacitor lower electrode 13 is formed for connection to the source/drain region 261 through the contact hole 51, and the capacitor dielectric film 14 and the capacitor upper electrode 15 are formed over the entire surface (FIG. 55). The interlayer insulative film 16 is formed over the top surface (FIG. 56). The interconnect layers 17 are selectively formed on the interlayer insulative film 16 (FIG. 57).

In the method of fabricating the semiconductor device according to the fifth preferred embodiment, as above described, only the interlayer insulative film 81 is etched to expose the sidewalls 6d and 6e and the substrate protective oxide film 6h when the contact hole 50 is formed. Thus, the contact hole 50 may be formed in a self-aligned manner in non-contacting relation to the gate electrodes 4 for similar reasons to the first preferred embodiment, and the crystal defects 25 are suppressed. Unlike the first preferred embodiment, there is no need to etch the insulative film 7 having the low etching rate, facilitating control of the etching amount during the formation of the contact holes 50 and 51.

Preferred Embodiment 6

In the fifth preferred embodiment, the contact hole 51 is formed by etching the interlayer insulative films 11 and 81 and the substrate protective oxide film 6g in the single step using the same etchant, with the photoresist 12 formed by the conventional transfer process being used as a mask, after the formation of the interlayer insulative film 11. However, the contact hole 51 may be formed in a plurality of fabrication steps.

Figure 58:
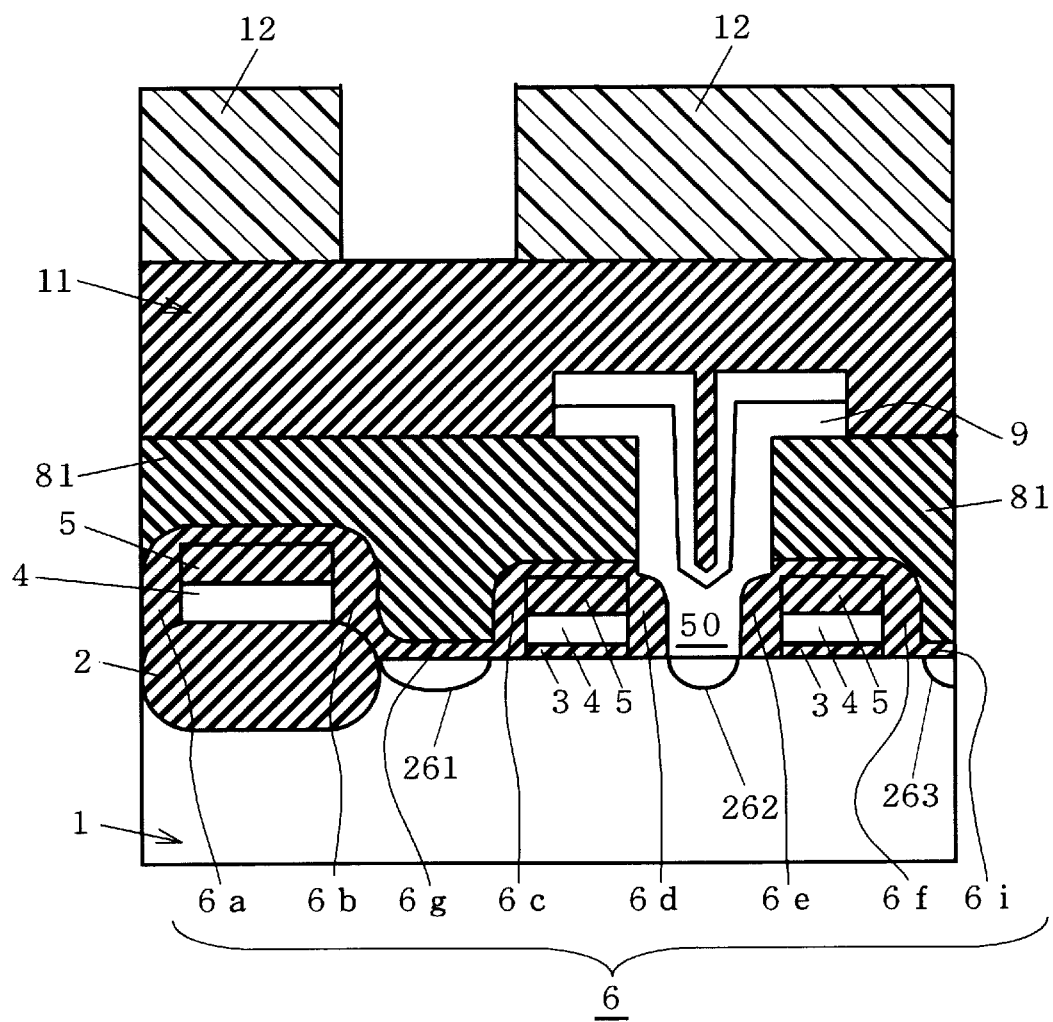
FIGS. 58 through 64 are cross-sectional views showing respective steps of the fabrication of the semiconductor device according to a sixth preferred embodiment of the present invention.

FIGS. 58 through 64 are cross-sectional views showing respective steps of the fabrication of the semiconductor device in sequential order according to a sixth preferred embodiment of the present invention. First, the structure of FIG. 53 is provided through fabrication steps similar to those of the fifth preferred embodiment (FIG. 58).

Figure 59:
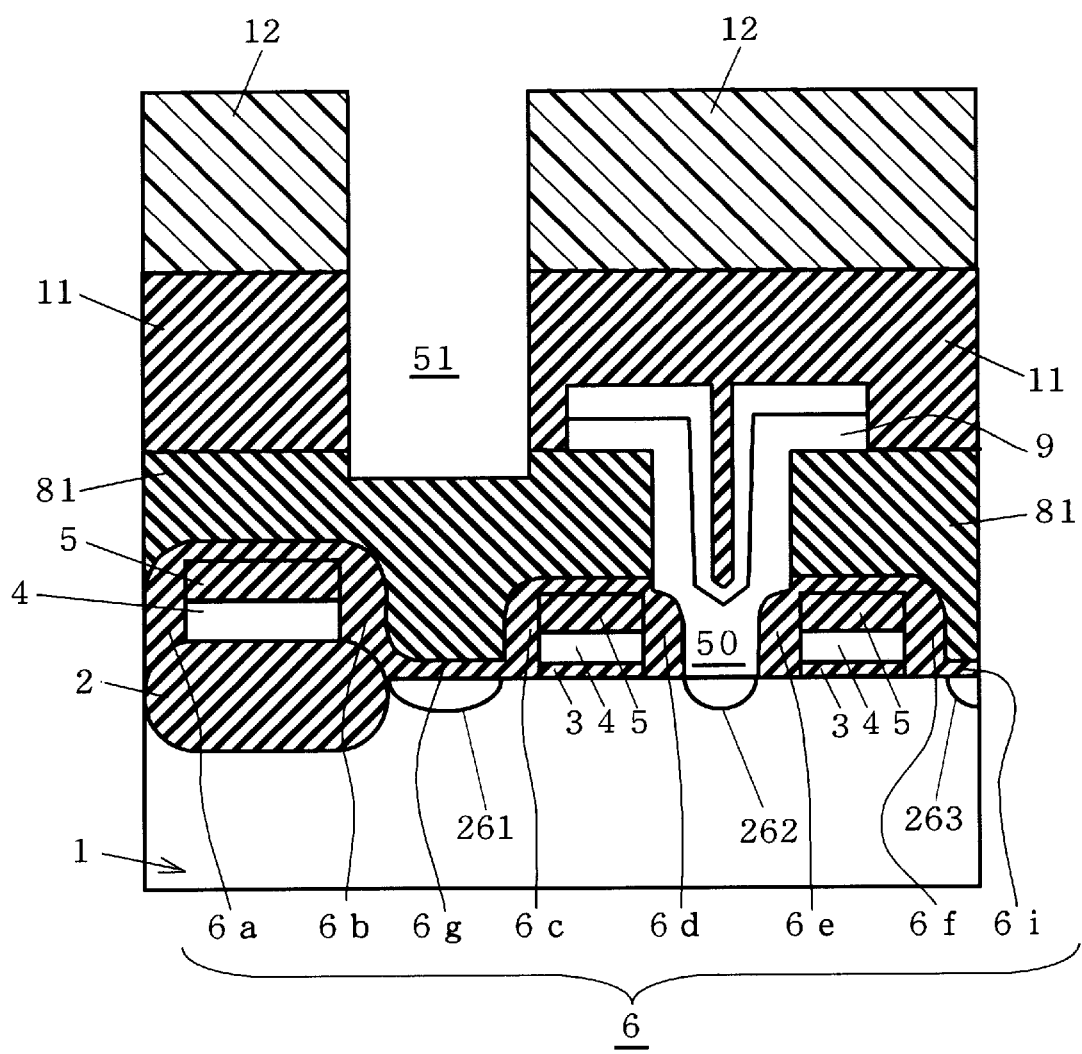

Using the photoresist 12 as a mask, anisotropic oxide etching is performed to etch the interlayer insulative film 11. Since the etching rate of the interlayer insulative film 81 is higher than that of the interlayer insulative film 11, the overetching during the etching of the interlayer insulative film 11 causes an upper part of the interlayer insulative film 81 to be etched in some amount (FIG. 59).

Figure 60:
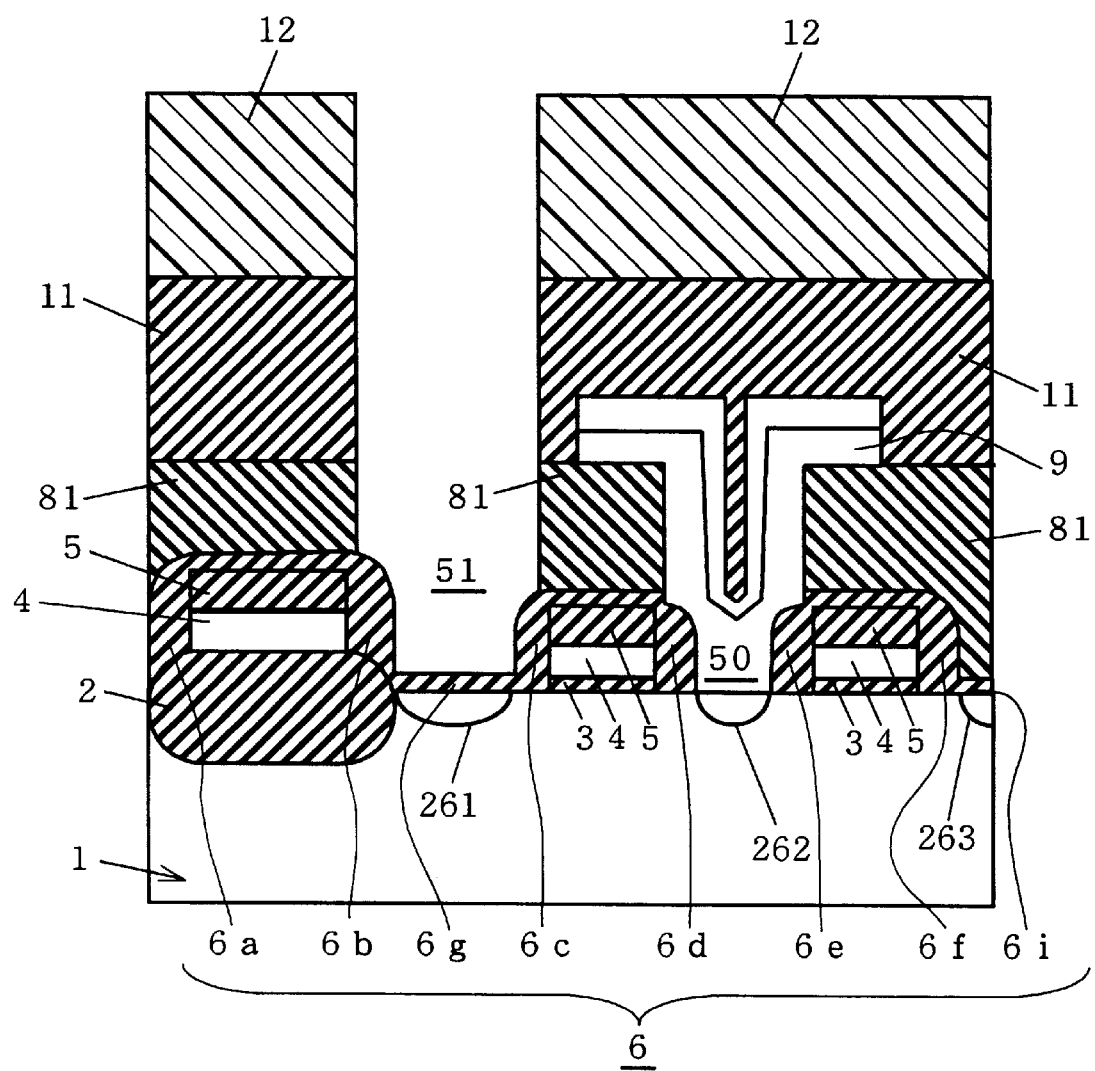

Only the interlayer insulative film 81 is etched using the photoresist 12 as a mask (FIG. 60). Since the etching rate of the silicon oxide film 6 is lower than that of the interlayer insulative film 81, small amounts of the sidewalls 6b, 6c and substrate protective oxide film 6g are overetched.

Figure 61:
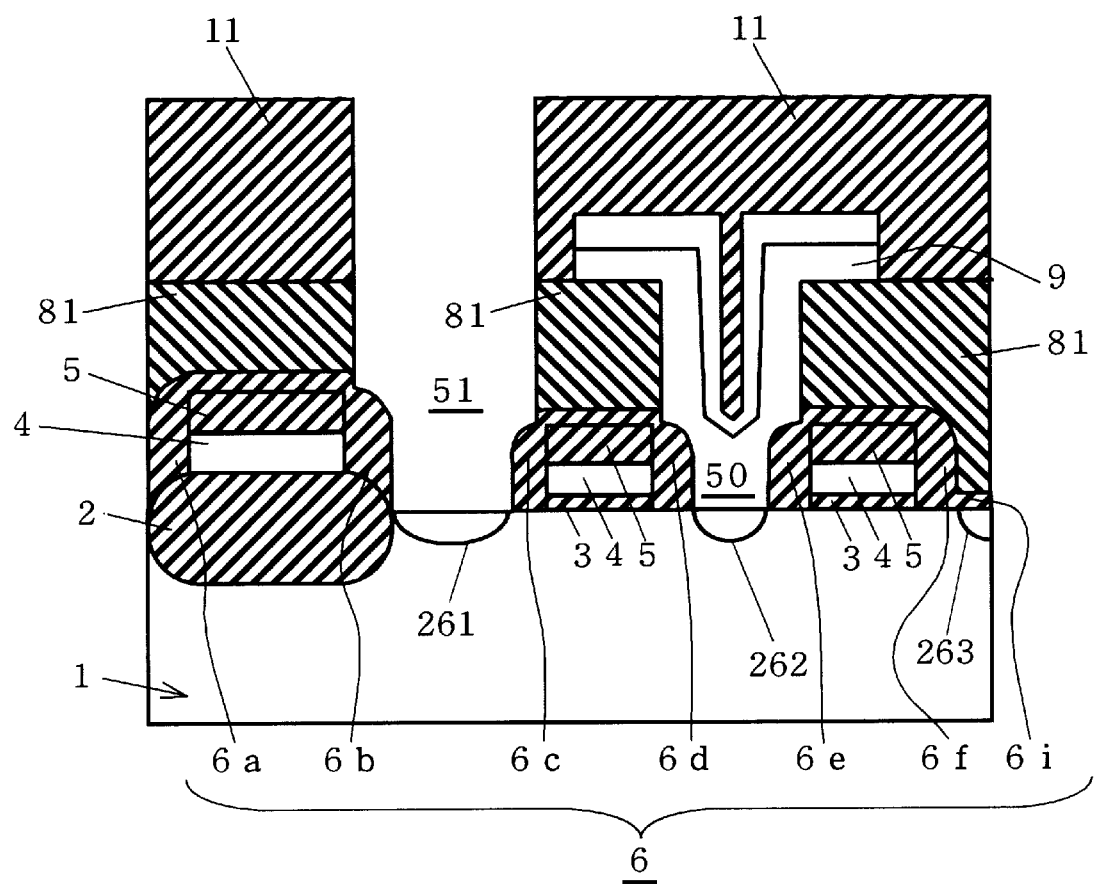

Anisotropic oxide etching using the photoresist 12 as a mask removes the substrate protective oxide film 6g to expose the source/drain region 261. Then, the photoresist 12 is removed (FIG. 61).

Figure 62:
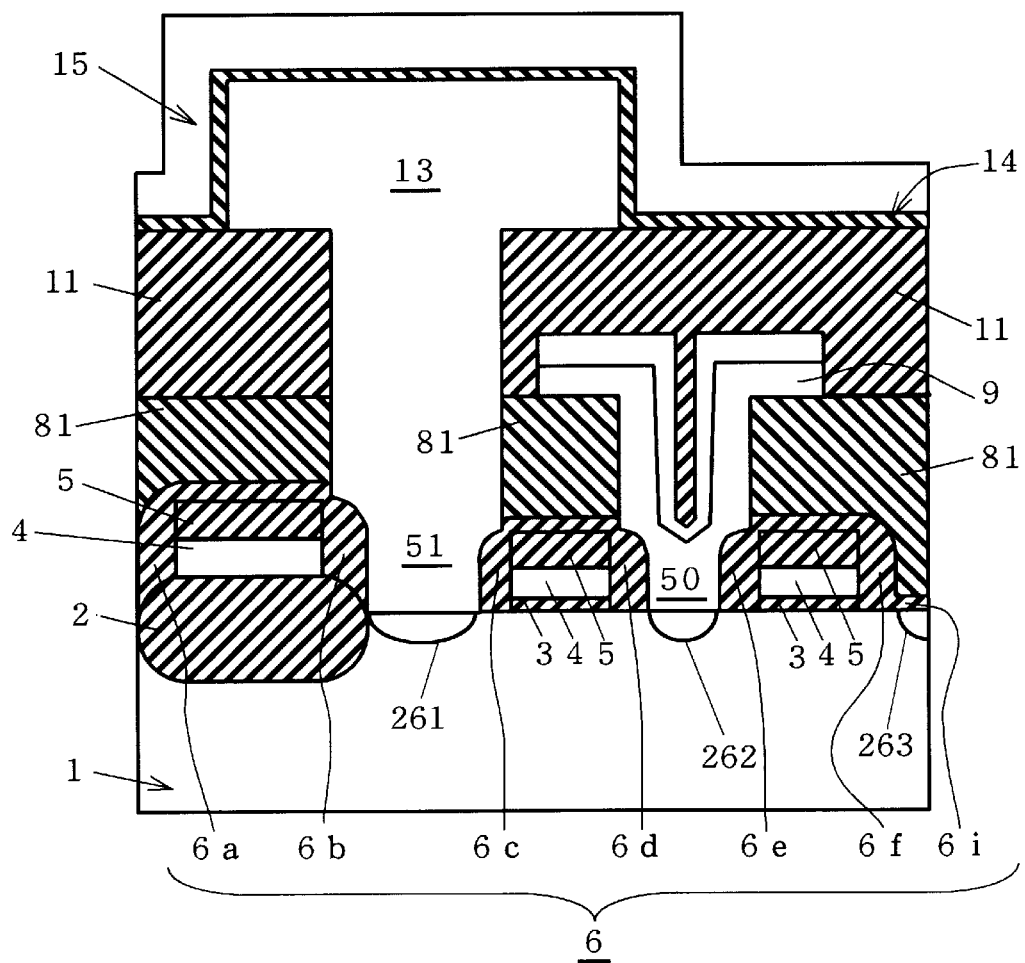
Figure 63:
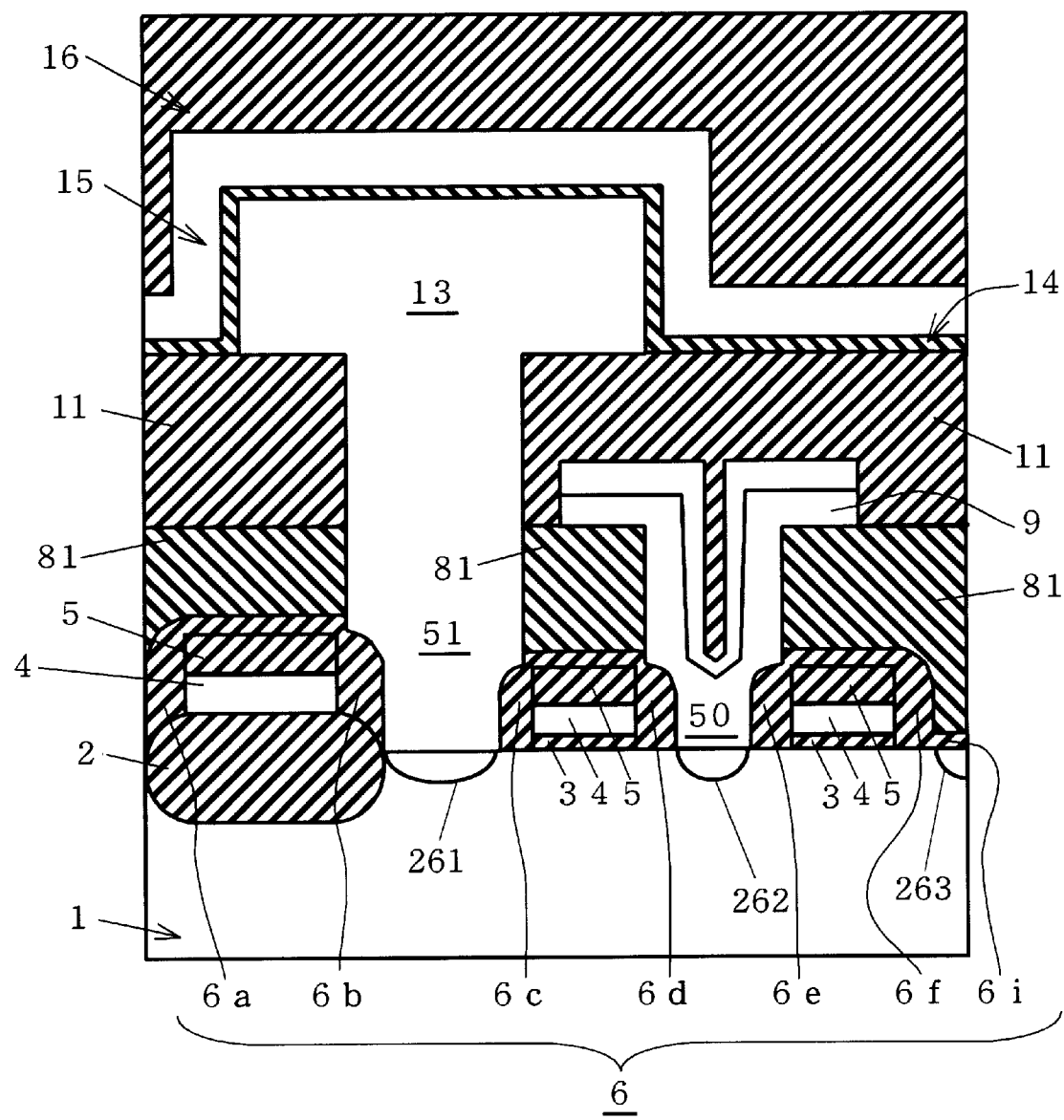
Figure 64:
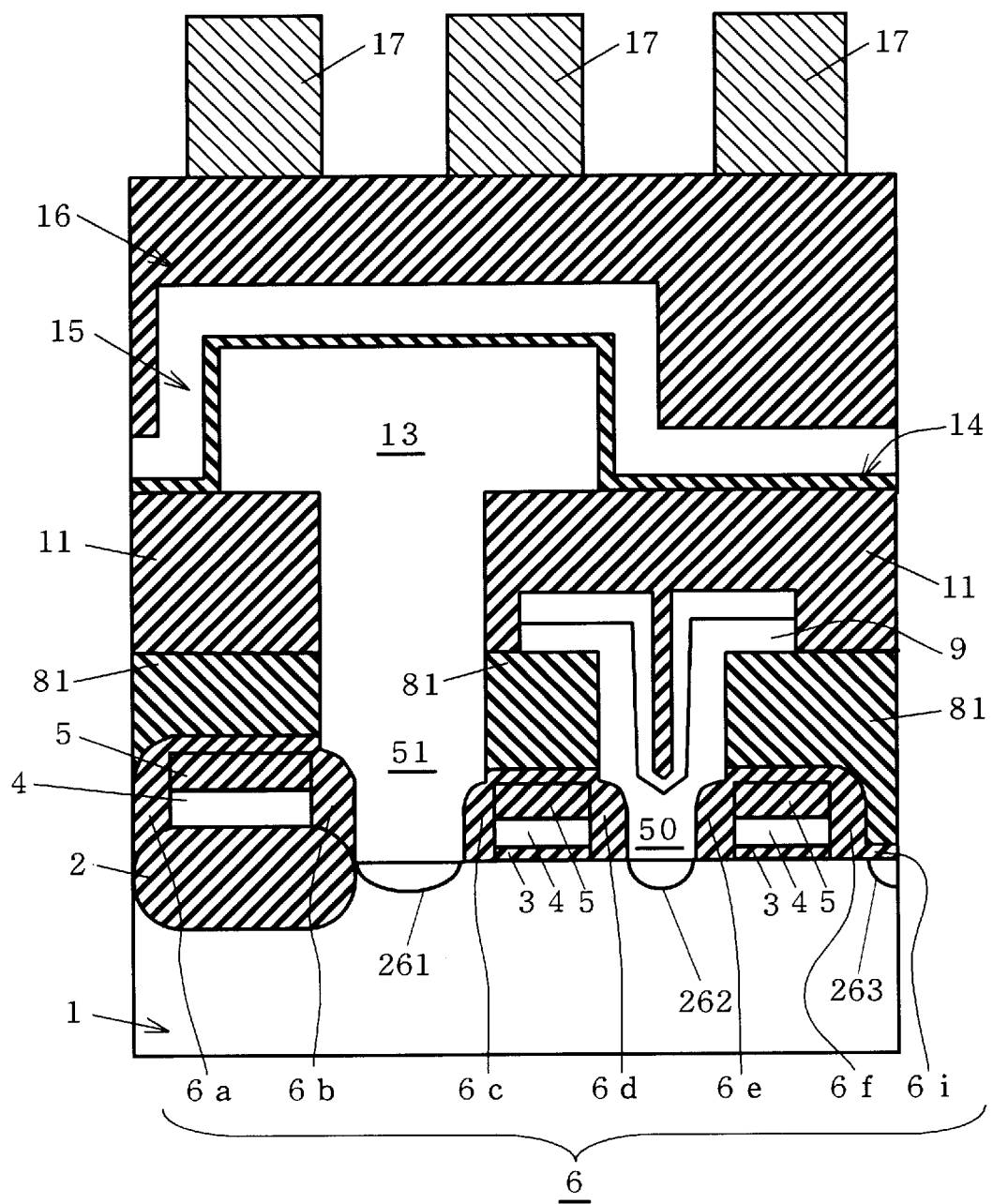

Thereafter, fabrication steps similar to those of the first preferred embodiment are performed until the interconnect layers 17 are formed. More specifically, the capacitor lower electrode 13 is formed for connection to the source/drain region 261 through the contact hole 51, and the capacitor dielectric film 14 and the capacitor upper electrode 15 are formed over the entire surface (FIG. 62). The interlayer insulative film 16 is formed over the top surface (FIG. 63). The interconnect layers 17 are selectively formed on the interlayer insulative film 16 (FIG. 64).

In the method of fabricating the semiconductor device according to the sixth preferred embodiment, as above described, only the interlayer insulative film 81 is etched once to expose the sidewalls 6b and 6c and the substrate protective oxide film 6g when the contact hole 51 is formed. Thus, the contact hole 51 may be formed in a self-aligned manner in non-contacting relation to the gate electrodes 4 for similar reasons to the fifth preferred embodiment, and the crystal defects 25 are suppressed.

In the fifth preferred embodiment, the contact hole 51 is formed by etching the interlayer insulative films 11 and 81 and the substrate protective oxide film 6g in the single step using the same etchant. This method causes difficulties in etching control because of the substantial thickness of the films to be removed. In the method of the sixth preferred embodiment, however, only the interlayer insulative film 11 is etched, and only the interlayer insulative film 81 is then etched. Thereafter, only the substrate protective oxide film 6g is etched. The thinness of the film to be removed in each of the steps facilitates control of the etching amount of, in particular, the substrate protective oxide film 6g. This decreases the amount of overetching of the semiconductor substrate 1 during the etching process for formation of the contact hole 51, causing a smaller amount of crystal defects 25 adjacent the source/drain region 261 than the method of the fifth preferred embodiment.

Preferred Embodiment 7

In the fifth preferred embodiment, only the source/drain region 262 is exposed once after the formation of the interlayer insulative film 81. However, the source/drain region 261 may be exposed at the same time.

Figure 65:
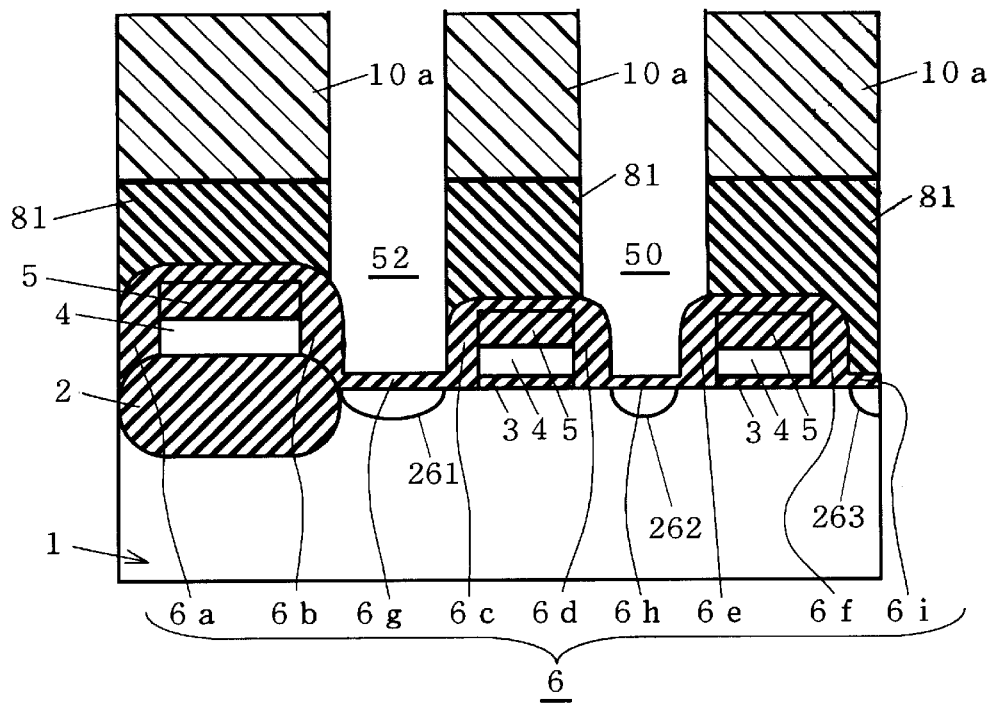
FIGS. 65 through 73 are cross-sectional views showing respective steps of the fabrication of the semiconductor device according to a seventh preferred embodiment of the present invention.

FIGS. 65 through 73 are cross-sectional views showing respective steps of the fabrication of the semiconductor device in sequential order according to a seventh preferred embodiment of the present invention. First, the structure of FIG. 48 is provided through fabrication steps similar to those of the fifth preferred embodiment. Then, the photoresist 10a having openings over the source/drain regions 261 and 262 is formed on the interlayer insulative film 81 by the conventional transfer process. Using the photoresist 10a as a mask, only the interlayer insulative film 81 is subjected to an etching process using the etchant of the fifth preferred embodiment which forms the contact holes 52 and 50 (FIG. 65). Since the etching rate of the silicon oxide film 6 is lower than that of the interlayer insulative film 81, small amounts of the sidewalls 6b, 6c, 6d, 6e and the substrate protective oxide films 6g, 6h are overetched.

Figure 66:
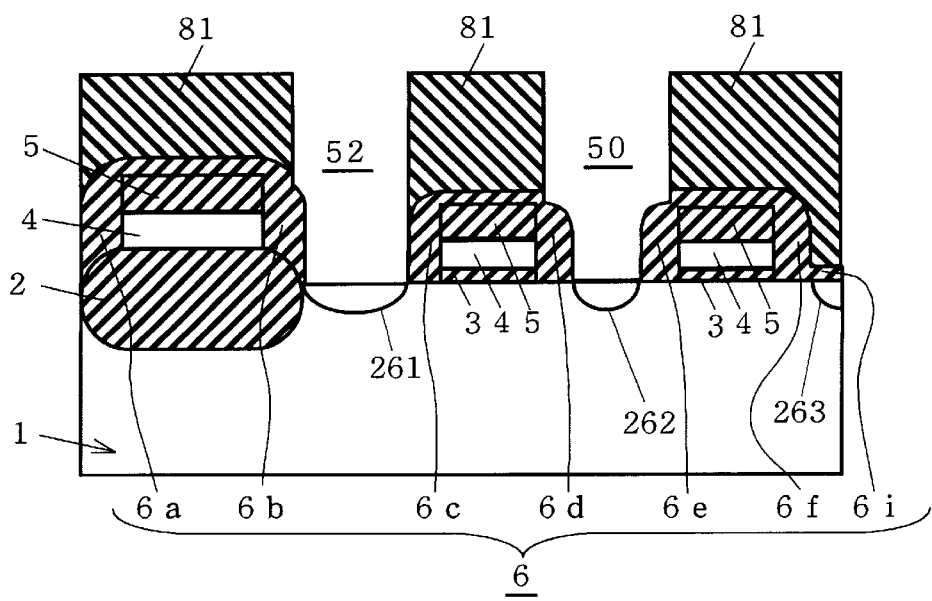

Using the photoresist 10a as a mask, anisotropic oxide etching removes the substrate protective oxide films 6g and 6h to expose the source/drain regions 261 and 262. Then, the photoresist 10a is removed (FIG. 66).

Figure 67:
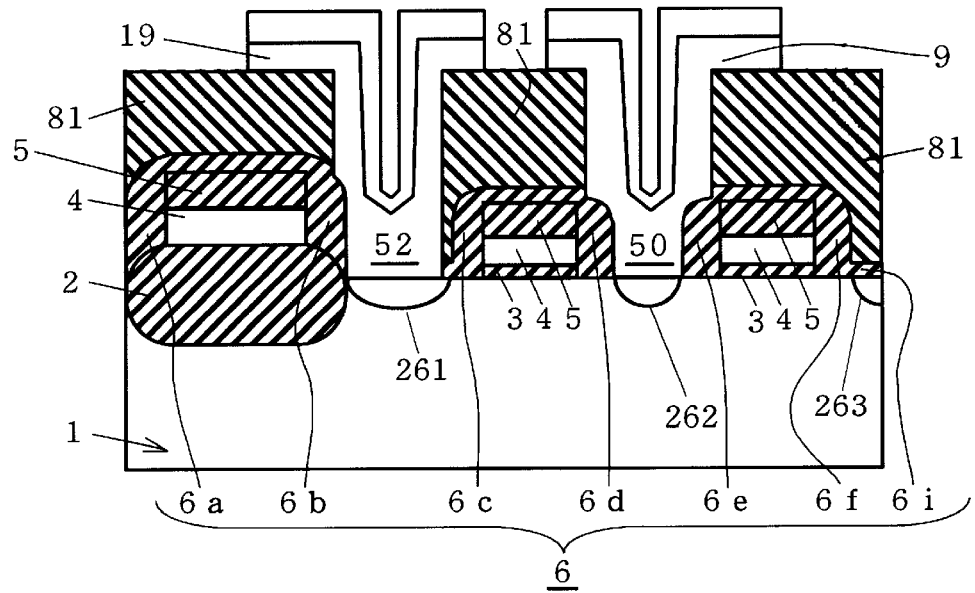

The conductive film 9 serving as the bit line is formed for connection to the source/drain region 262 through the contact hole 50. At the same time, the conductive film 19 similar in construction to the conductive film 9 is formed for connection to the source/drain region 261 through the contact hole 52 (FIG. 67). As mentioned above, the electrode 19 is to function as the connection electrode for establishing connection between the capacitor lower electrode 13 and the source/drain region 261.

Figure 68:
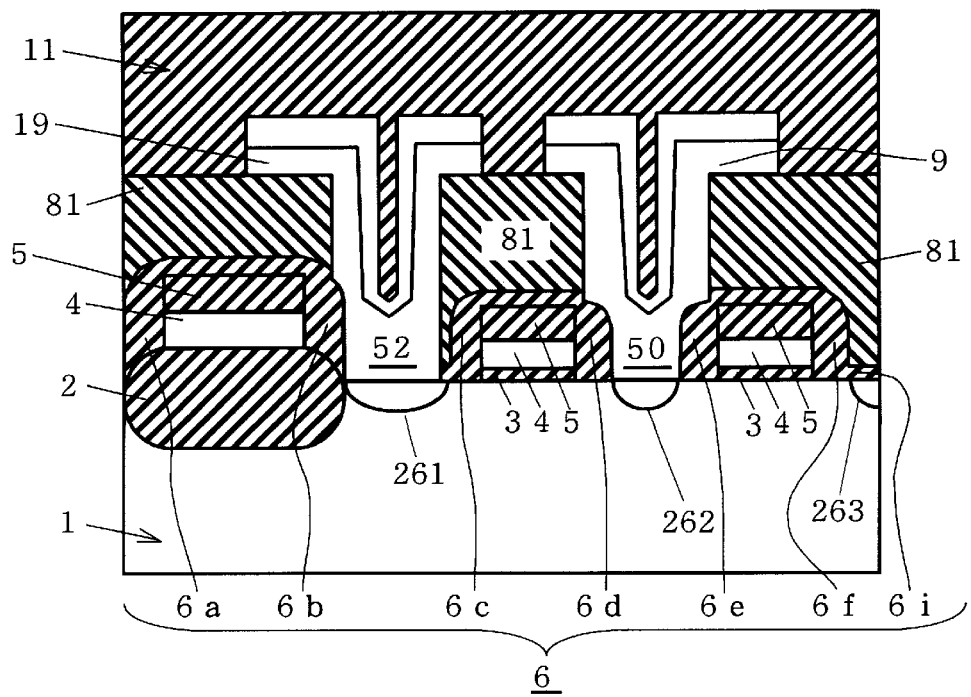
Figure 69:
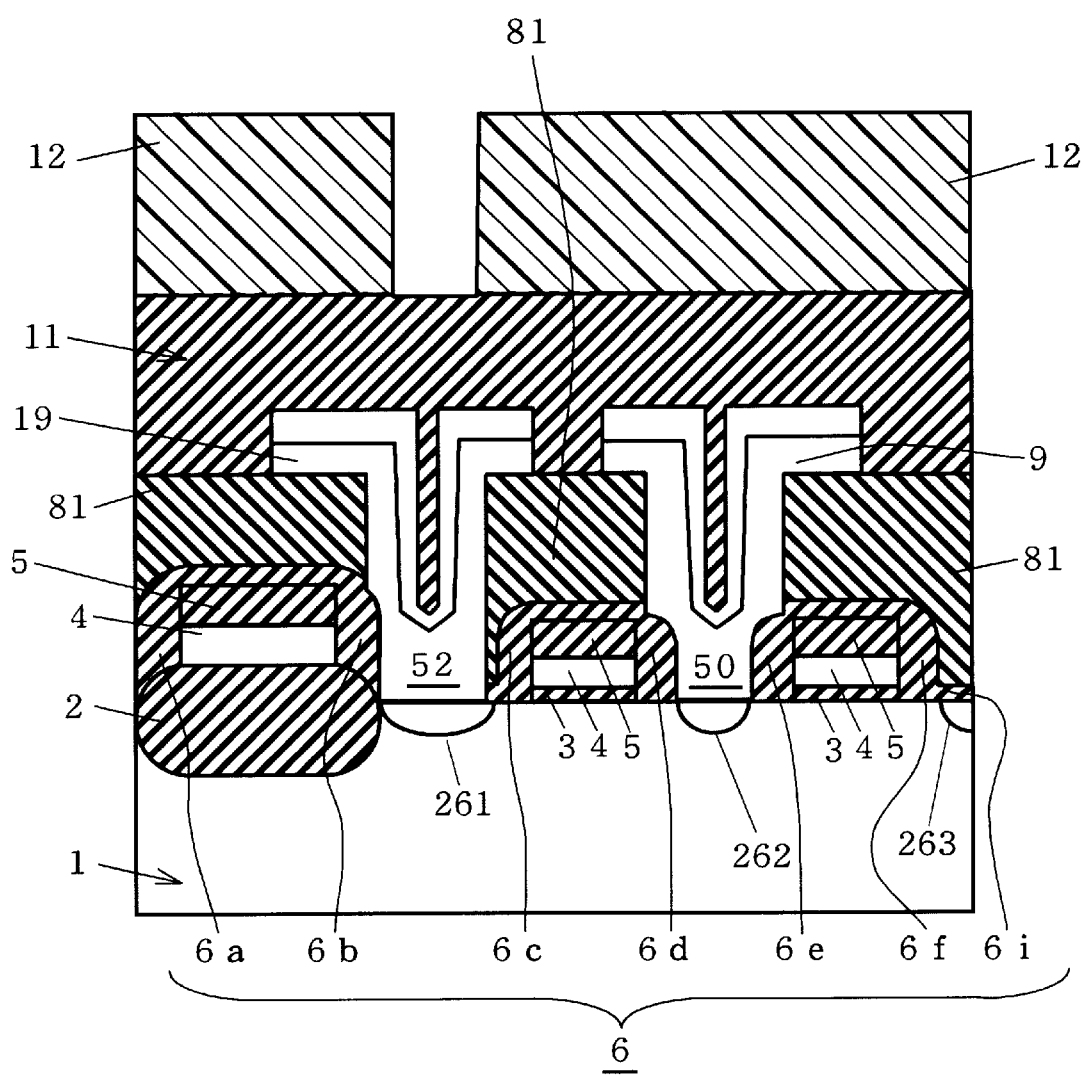

A silicon oxide film, for example, is deposited over the top surface by the CVD process to form the interlayer insulative film 11 (FIG. 68). The photoresist 12 having an opening over the source/drain region 261 is formed on the interlayer insulative film 11 by the conventional transfer process (FIG. 69).

Figure 70:
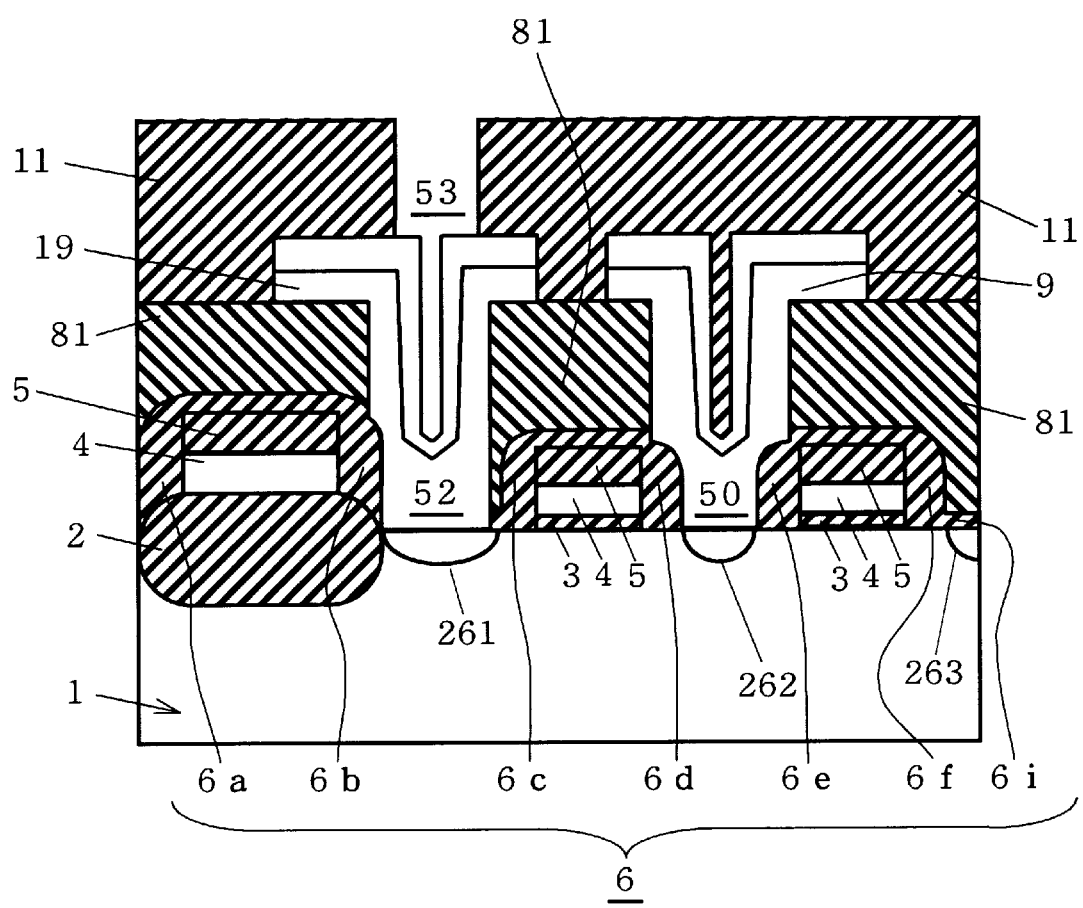

Using the photoresist 12 as a mask, the interlayer insulative film 11 is subjected to etching which forms the contact hole 53 to expose the conductive film 19. Then, the photoresist 12 is removed (FIG. 70).

Figure 71:
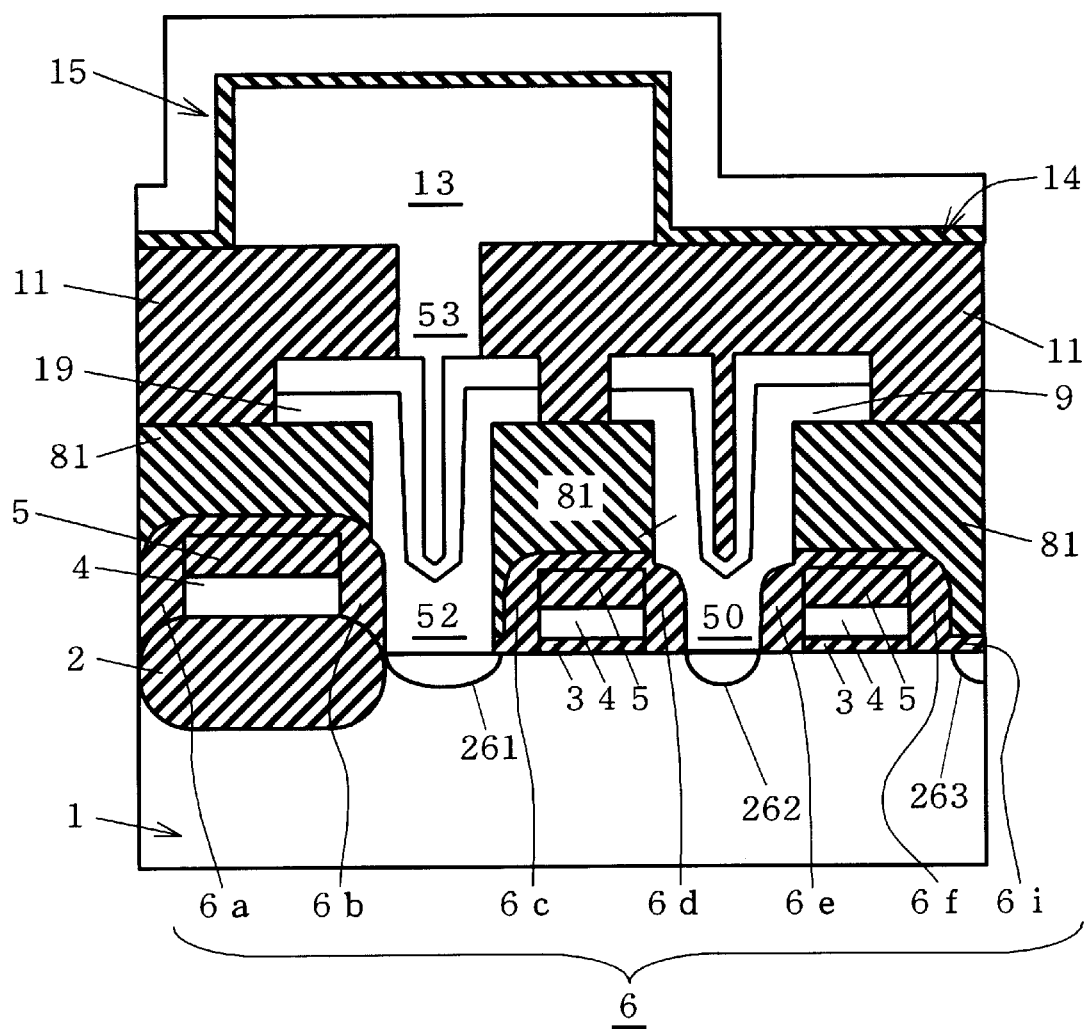
Figure 72:
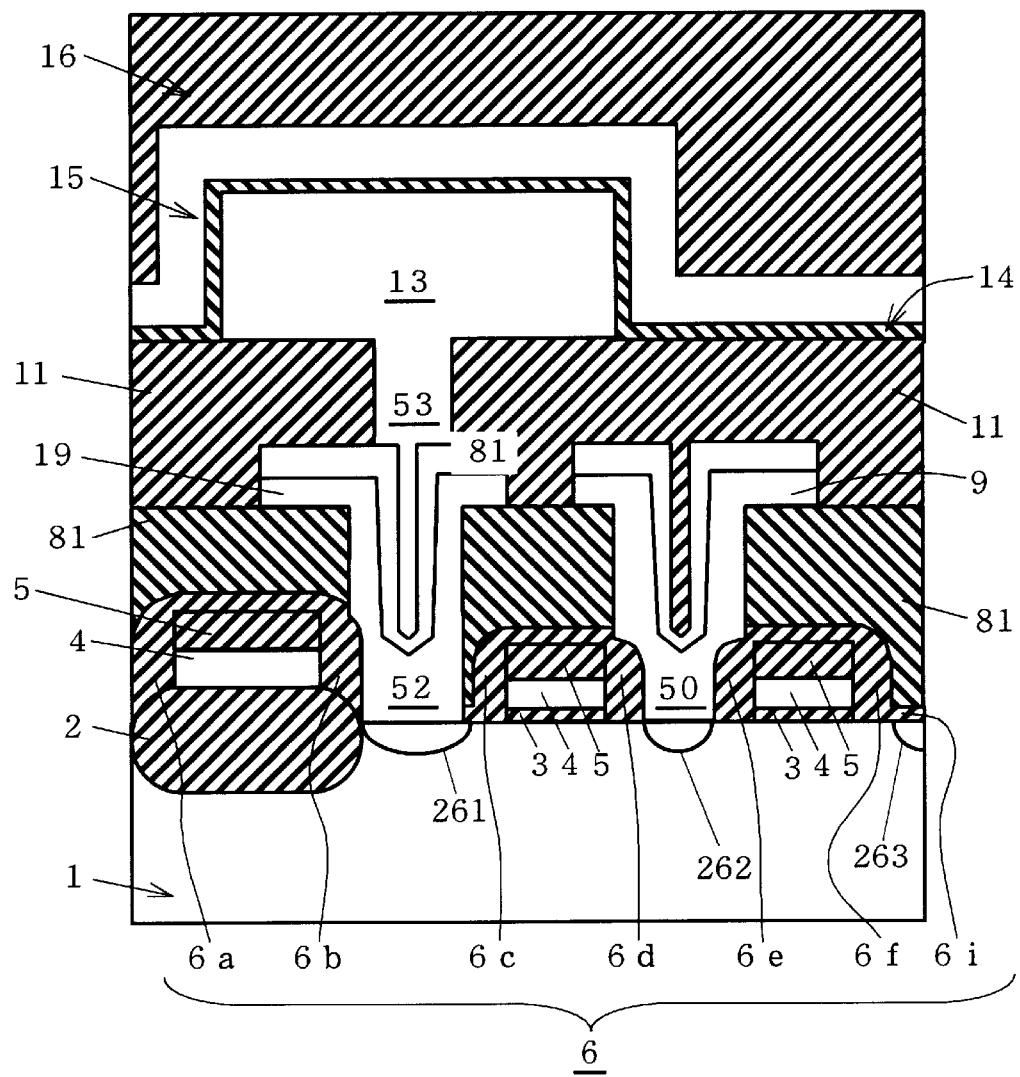
Figure 73:
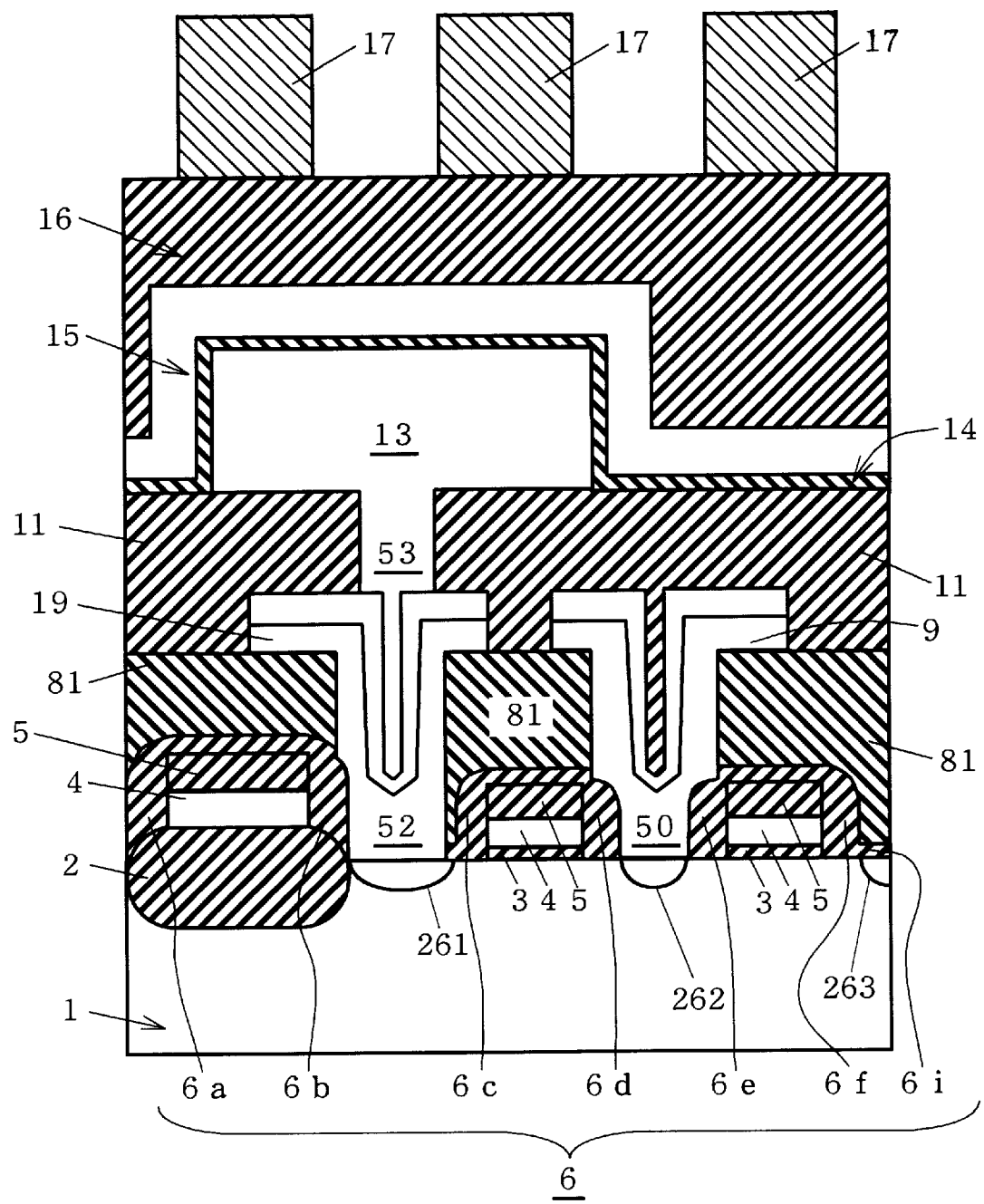

Thereafter, fabrication steps similar to those of the first preferred embodiment are performed until the interconnect layers 17 are formed. More specifically, the capacitor lower electrode 13 is formed for connection to the conductive film 19 through the contact hole 53, and the capacitor dielectric film 14 and the capacitor upper electrode 15 are formed over the entire surface (FIG. 71). The interlayer insulative film 16 is formed over the top surface (FIG. 72). The interconnect layers 17 are selectively formed on the interlayer insulative film 16 (FIG. 73).

In the method of fabricating the semiconductor device according to the seventh preferred embodiment, as above described, the contact holes 50 and 52 are formed by etching only the interlayer insulative film 81 by the oxide etching process to expose the sidewalls 6b, 6c, 6d, 6e and the substrate protective oxide films 6g, 6h once. Thus, the contact holes 50 and 52 may be formed in a self-aligned manner in non-contacting relation to the gate electrodes 4 for similar reasons to the fifth preferred embodiment, and the crystal defects 25 are suppressed.

In the sixth preferred embodiment, the overetching during the etching of the interlayer insulative film 11 causes the upper part of the interlayer insulative film 81 to be etched in some amount when the contact hole 51 is formed. Thus, for etching the interlayer insulative film 81 in the subsequent step, it is necessary to consider the etching amount of the upper part of the interlayer insulative film 81 due to the overetching. Additionally, the difference in etching rate between the interlayer insulative films 11 and 81 involves the need to accurately control the etching amount of the interlayer insulative film 81.

In the method of the seventh preferred embodiment, however, the etching of the interlayer insulative film 81 does not follow the etching of the interlayer insulative film 11. But the interlayer insulative film 81 is etched once prior to the formation of the interlayer insulative film 11 to expose the substrate protective oxide film 6g. Then, only the interlayer insulative film 11 is etched in the subsequent step. Thus, the upper part of the interlayer insulative film 81 is not removed before the interlayer insulative film 81 is etched. The etching amount of the interlayer insulative film 81 may be readily controlled.

Preferred Embodiment 8

In the first preferred embodiment, the capacitor lower electrode 13 is formed immediately after the contact hole 51 is formed. However, the step of forming an impurity diffusion layer in the semiconductor substrate 1 may be additionally inserted between the formation of the contact hole 51 and the formation of the capacitor lower electrode 13.

Figure 74:
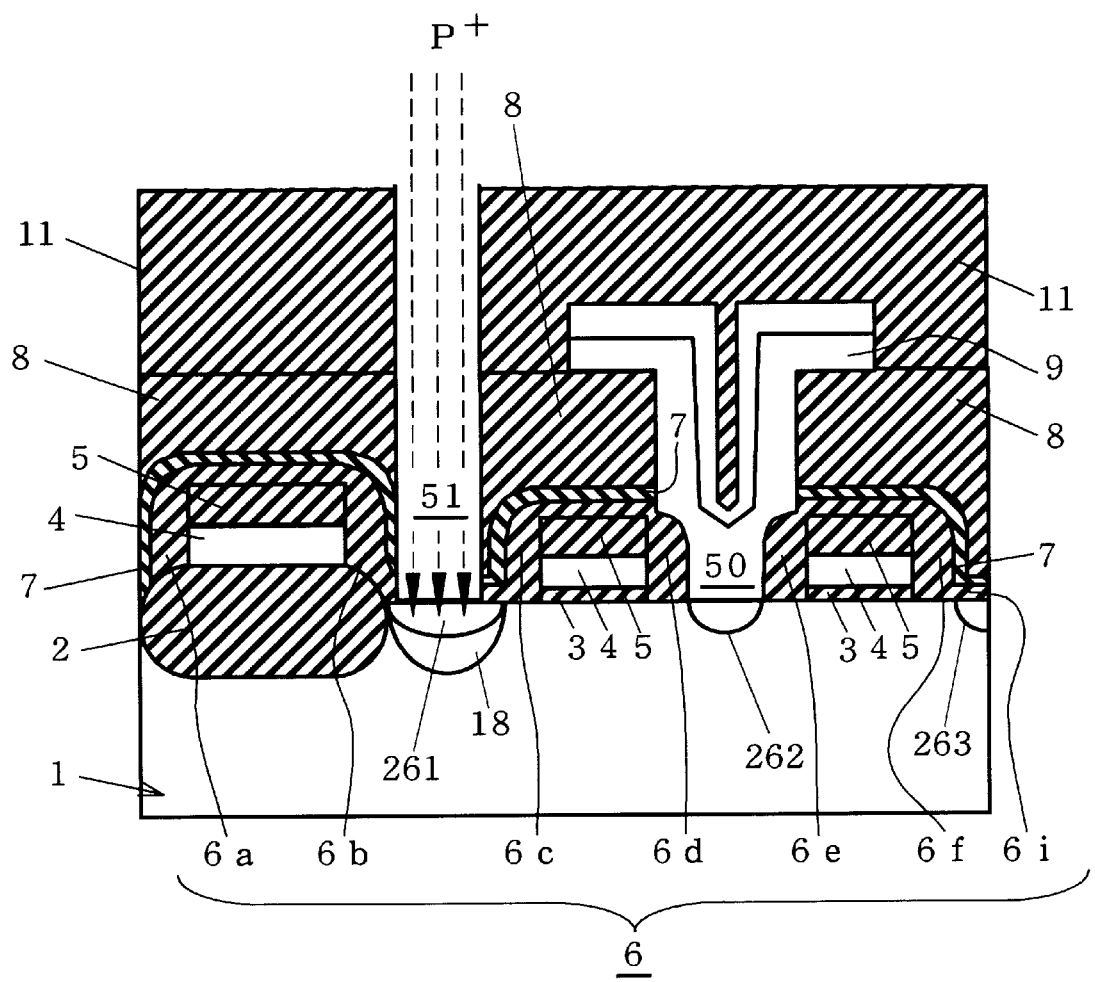
FIGS. 74 through 77 are cross-sectional views showing respective steps of the fabrication of the semiconductor device according to an eighth preferred embodiment of the present invention.

FIGS. 74 through 77 are cross-sectional views showing respective steps of the fabrication of the semiconductor device in sequential order according to an eighth preferred embodiment of the present invention. First, the structure of FIG. 11 is provided through fabrication steps similar to those of the first preferred embodiment. Using the photoresist 12 as a mask, impurities of a conductivity type opposite to that of the semiconductor substrate 1 (e.g., phosphorus and arsenic in the case where the conductivity type of the semiconductor substrate 1 is p type; and boron in the case where the conductivity type of the semiconductor substrate 1 is n type) are introduced into the semiconductor substrate 1 through the contact hole 51 by the ion implantation technique to form an impurity diffusion layer 18 which has a wider area and a lower concentration than the source/drain region 261 (FIG. 74).

Figure 75:
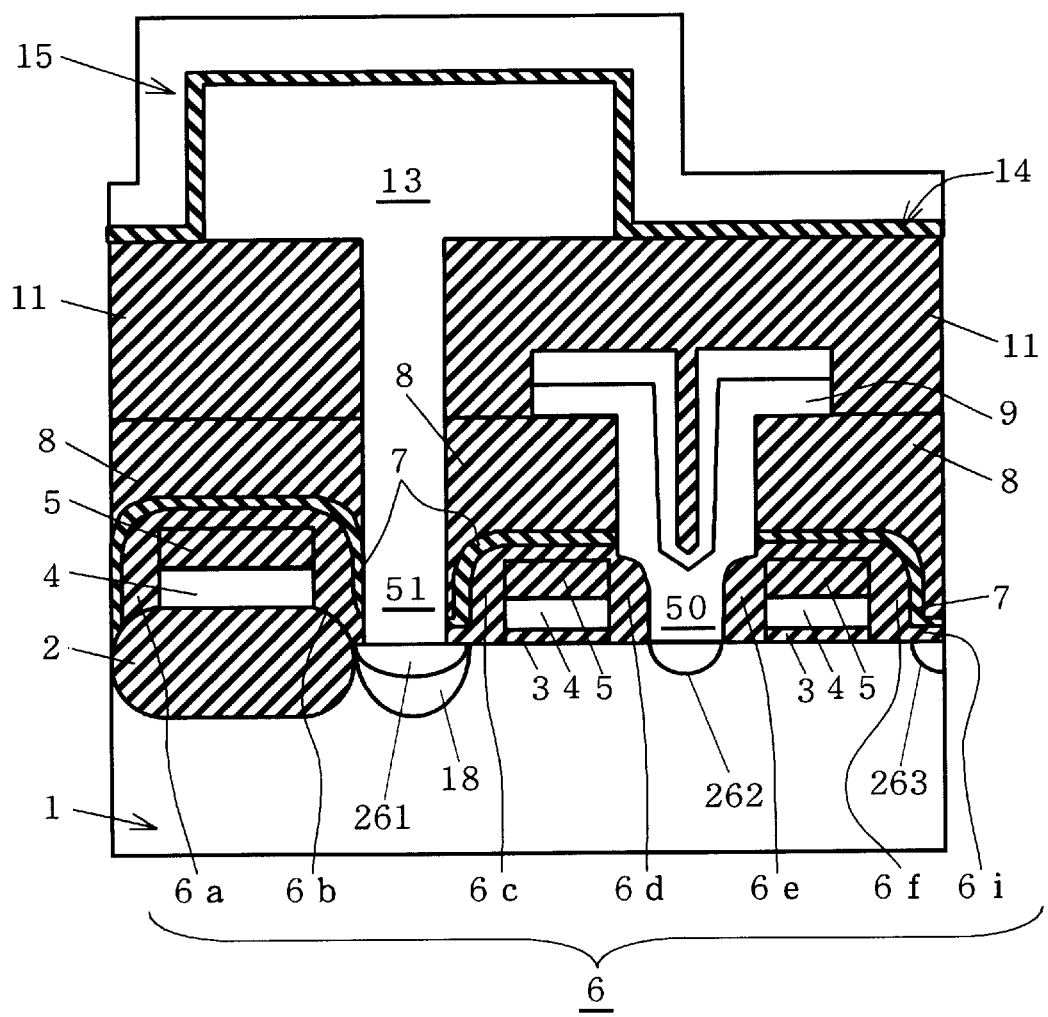
Figure 76:
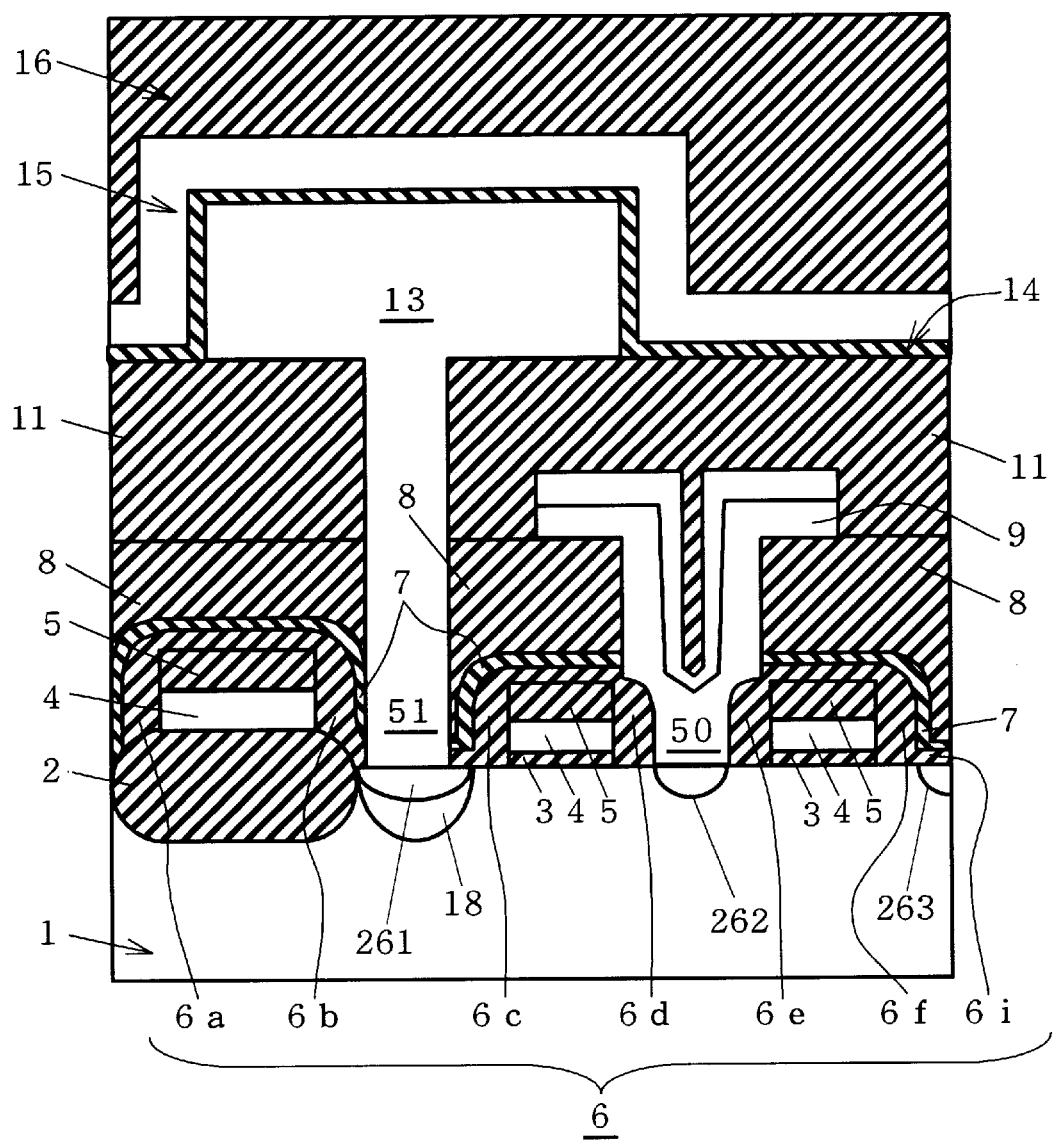
Figure 77:
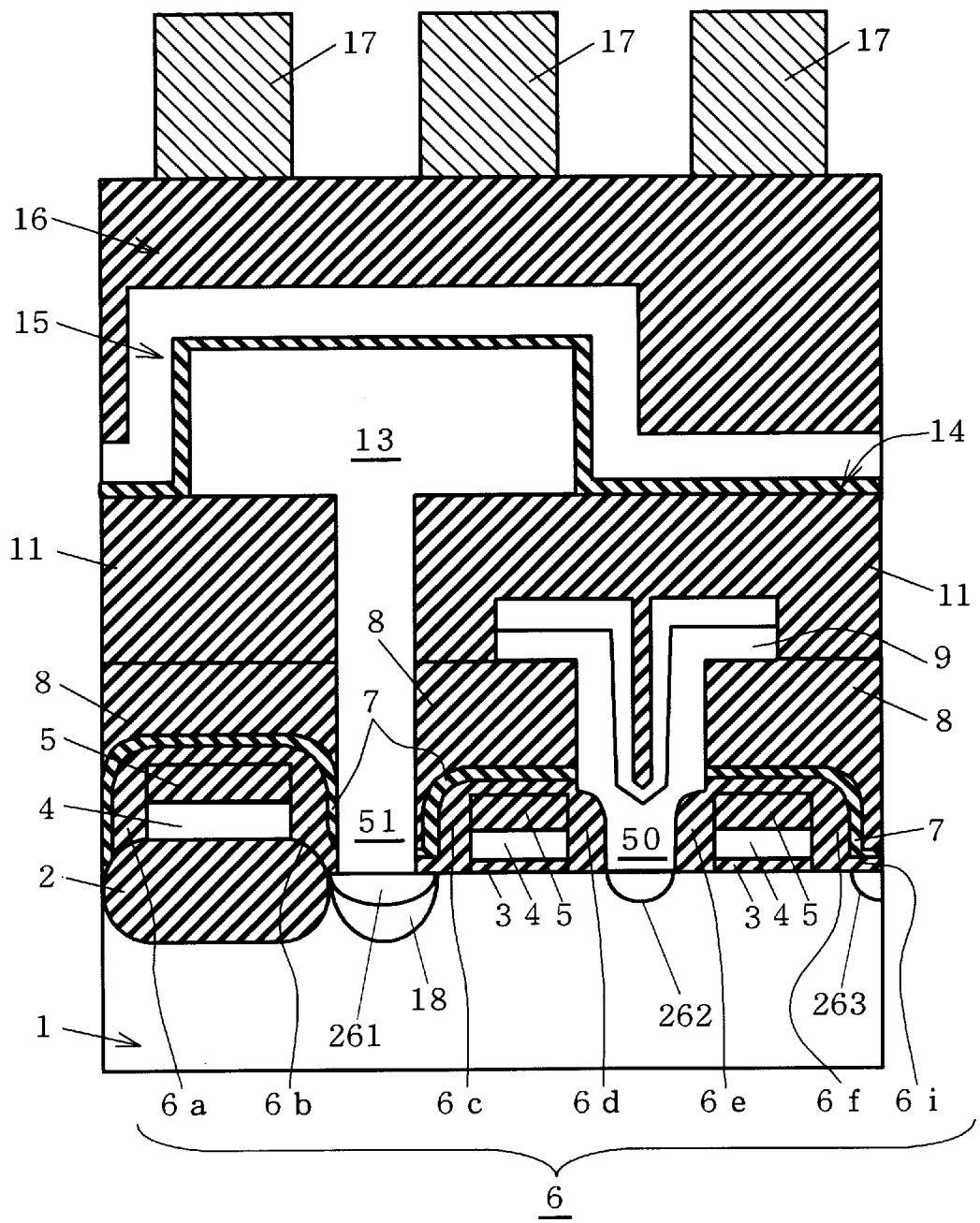

Thereafter, fabrication steps similar to those of the first preferred embodiment are performed until the interconnect layers 17 are formed. More specifically, the capacitor lower electrode 13 is formed for connection to the source/drain region 261 through the contact hole 51, and the capacitor dielectric film 14 and the capacitor upper electrode 15 are formed over the entire surface (FIG. 75). The interlayer insulative film 16 is formed over the top surface (FIG. 76). The interconnect layers 17 are selectively formed on the interlayer insulative film 16 (FIG. 77).

In the method of fabricating the semiconductor device of the eighth preferred embodiment, as above described, the impurity diffusion layer 18 of the conductivity type opposite to that of the semiconductor substrate 1 is additionally formed outside the source/drain region 261 to reduce the contact resistance of the capacitor lower electrode 13 and the semiconductor substrate 1. Further, a gentle impurity concentration gradient between the source/drain region 261 and the semiconductor substrate 1 and an alleviated electric field in the semiconductor substrate 1 under the capacitor lower electrode 13 may reduce the leakage current flowing from the capacitor lower electrode 13 into the semiconductor substrate 1.

Although the effects of the eighth preferred embodiment are described on the basis of the first preferred embodiment, similar effects may be provided on the basis of the method of the fifth preferred embodiment.

Preferred Embodiment 9

In the first preferred embodiment, the insulative film 7 is formed immediately after the step of partially etching the silicon oxide film 6 to form the substrate protective oxide films 6g to 6i. However, the step of forming impurity diffusion layers in the semiconductor substrate 1 may be additionally inserted prior to the formation of the insulative film 7.

Figure 78:
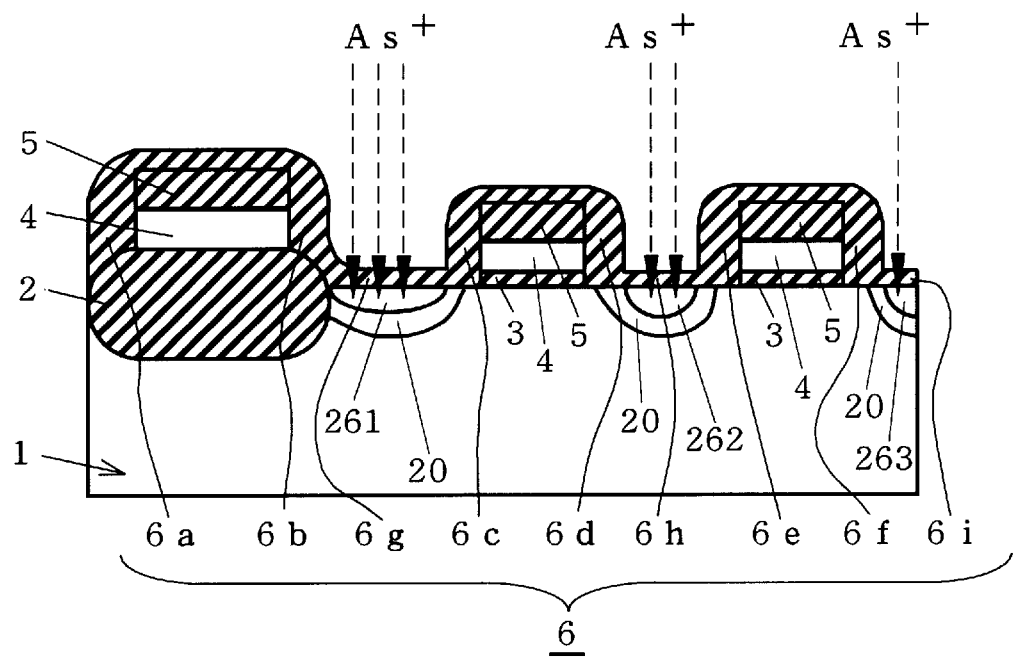
FIGS. 78 through 90 are cross-sectional views showing respective steps of the fabrication of the semiconductor device according to a ninth preferred embodiment of the present invention.
Figure 79:
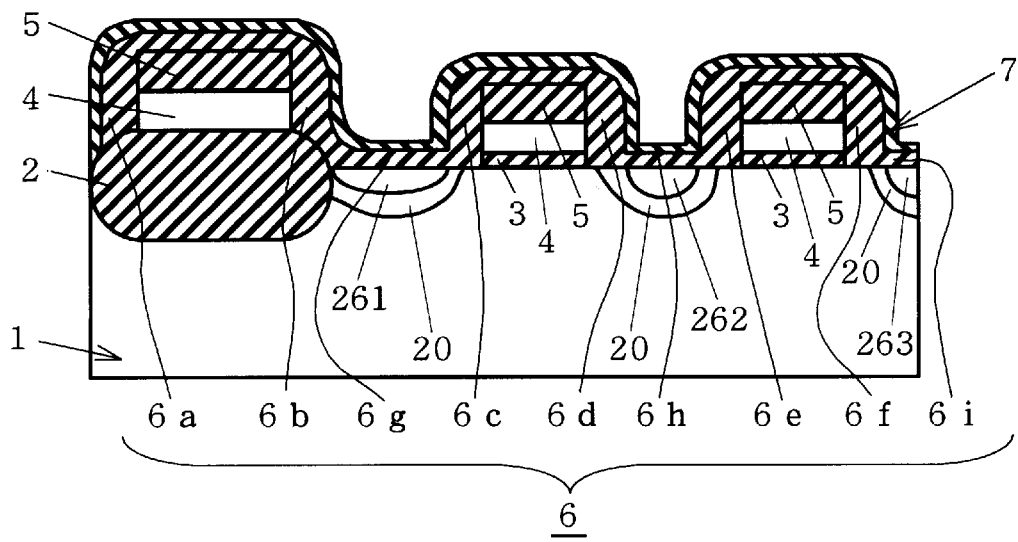

FIGS. 78 through 90 are cross-sectional views showing respective steps of the fabrication of the semiconductor device in sequential order according to a ninth preferred embodiment of the present invention. First, the structure of FIG. 3 is provided through fabrication steps similar to those of the first preferred embodiment. Impurities of the conductivity type opposite to that of the semiconductor substrate 1 are introduced into the semiconductor substrate 1 through the substrate protective oxide films 6g to 6i by the ion implantation technique to form impurity diffusion layers 20 which have a wider area and a lower concentration than the source/drain regions 261 and 262 (FIG. 78).

Figure 80:
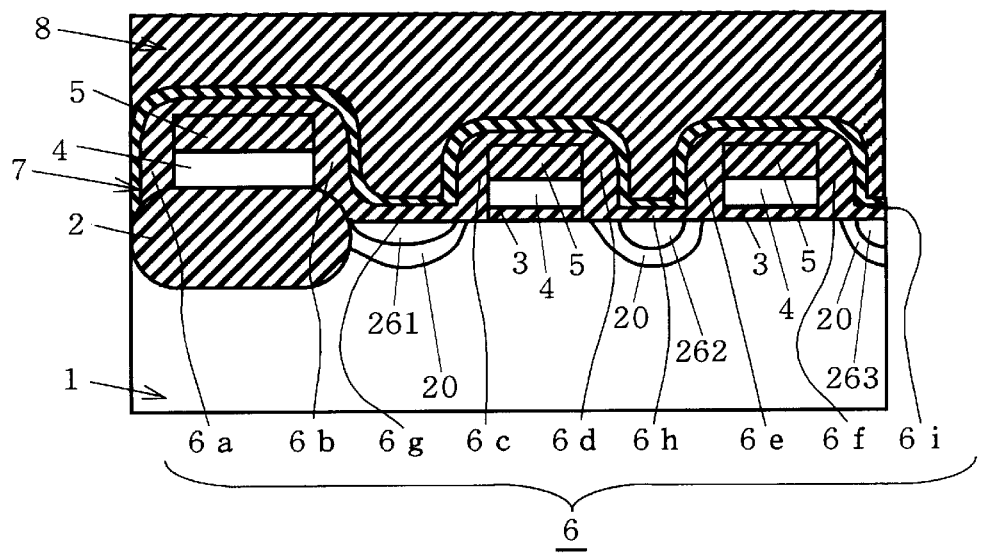
Figure 81:
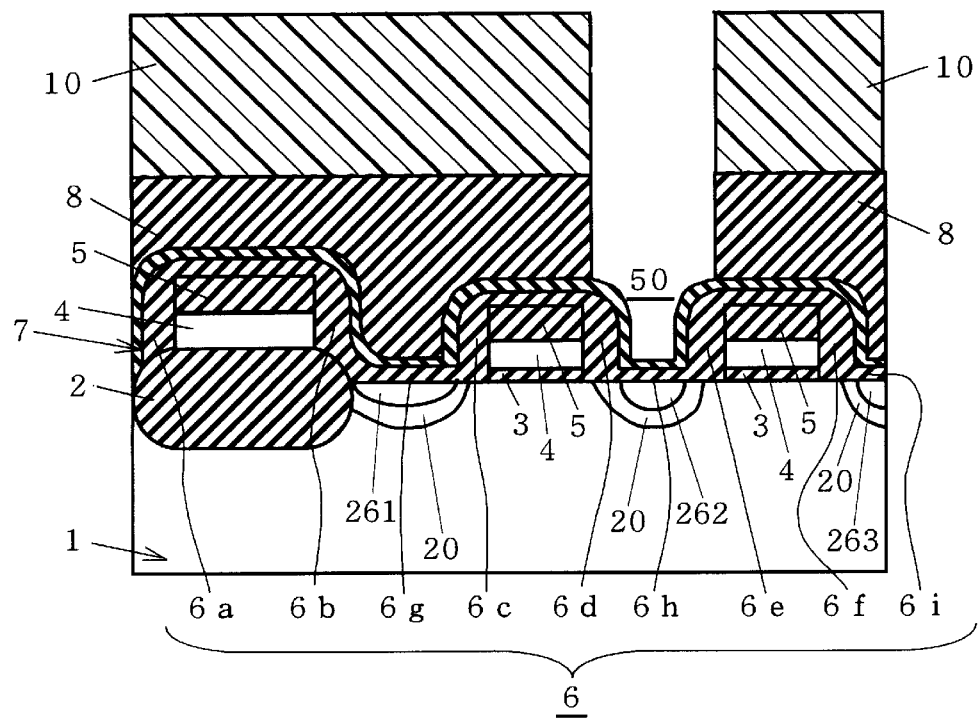
Figure 82:
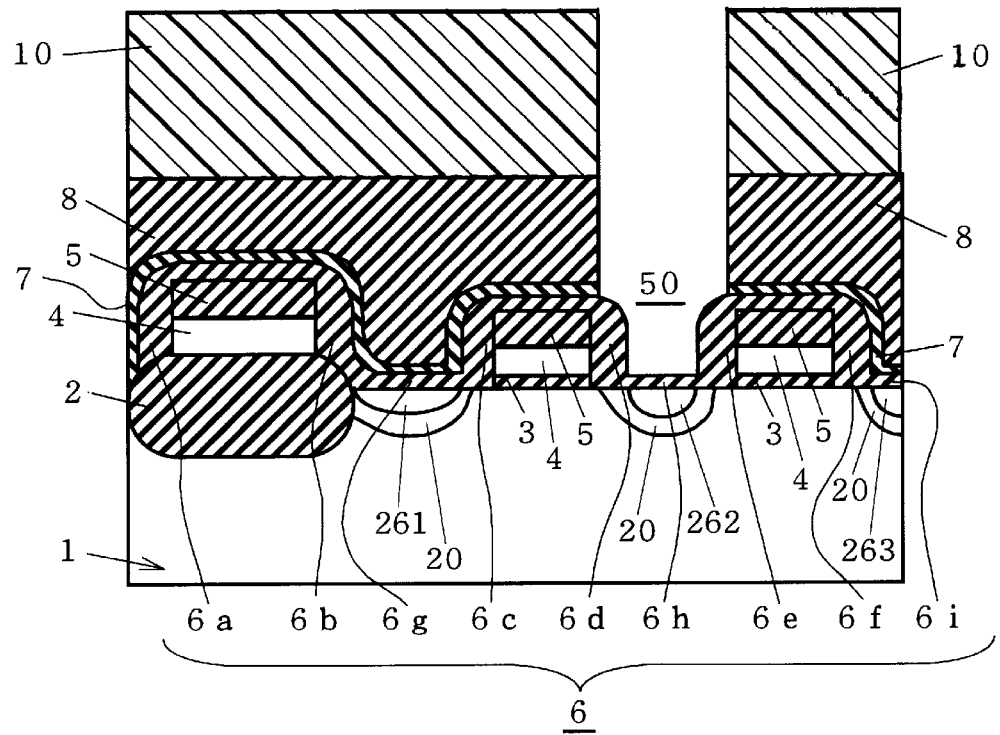
Figure 83:
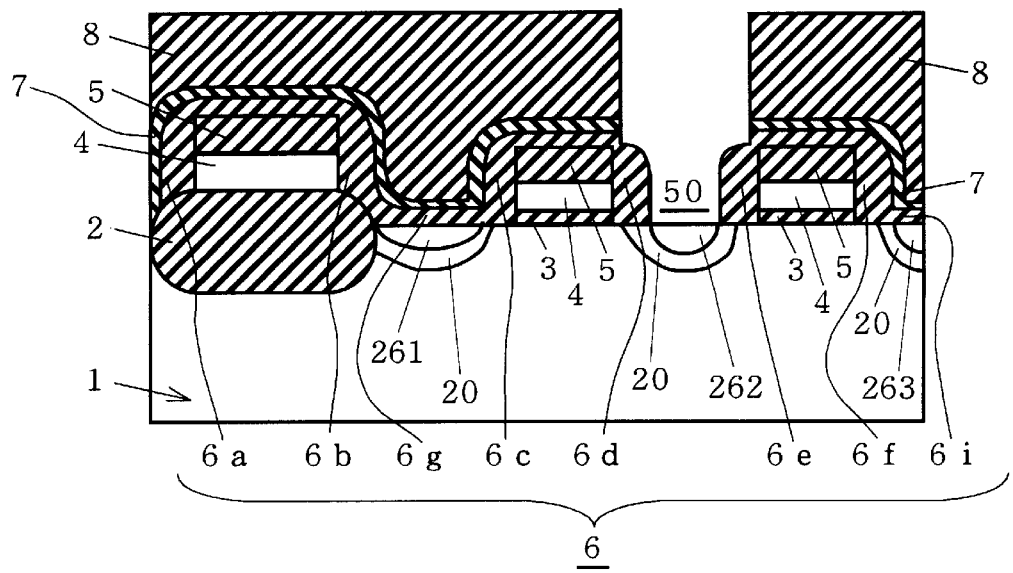
Figure 84:
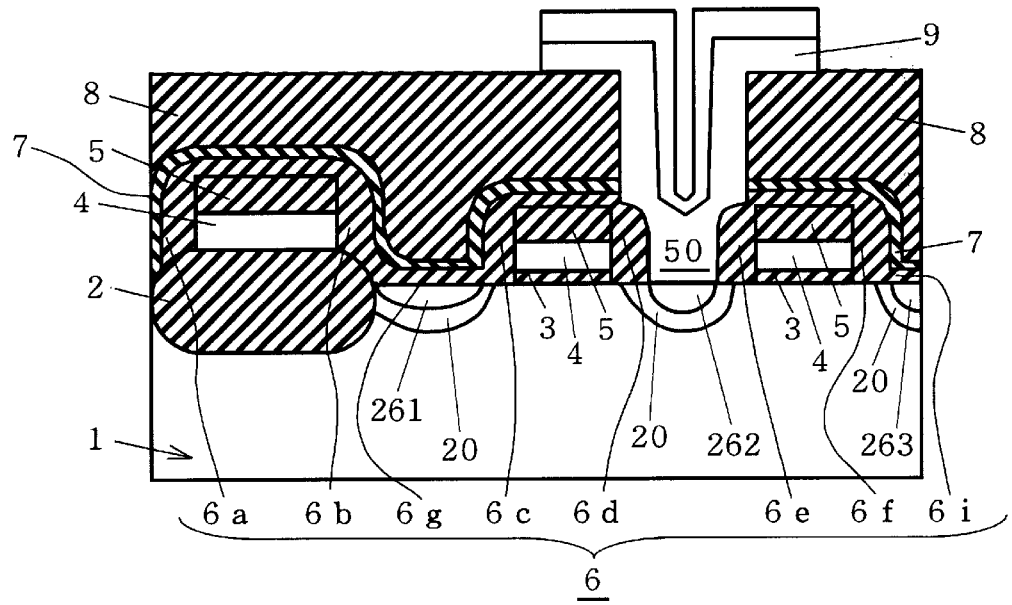
Figure 85:
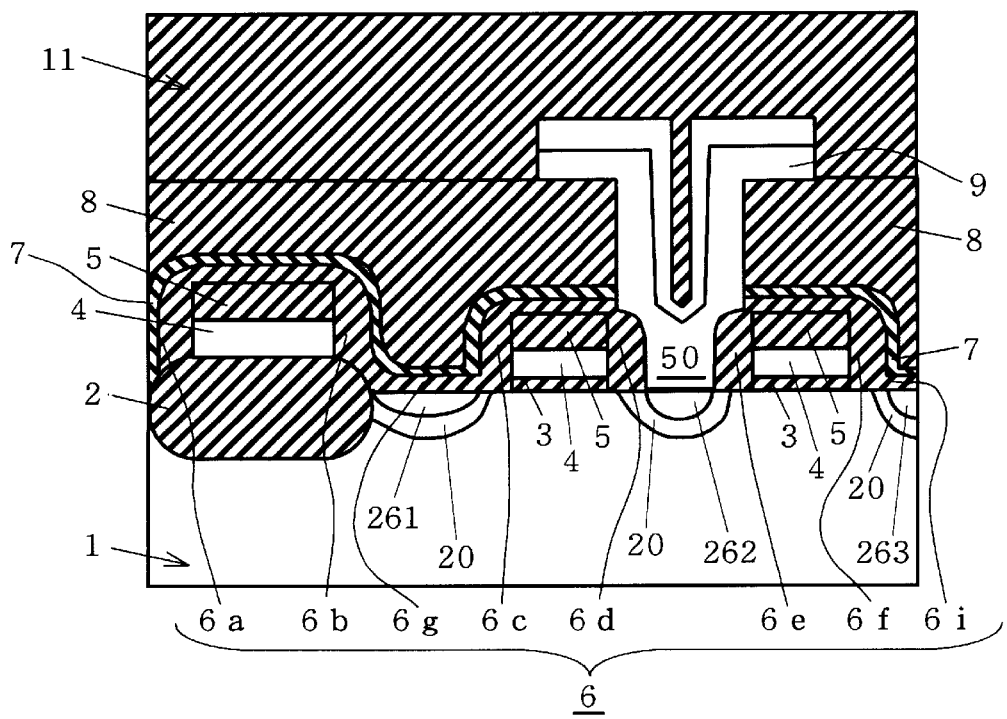
Figure 86:
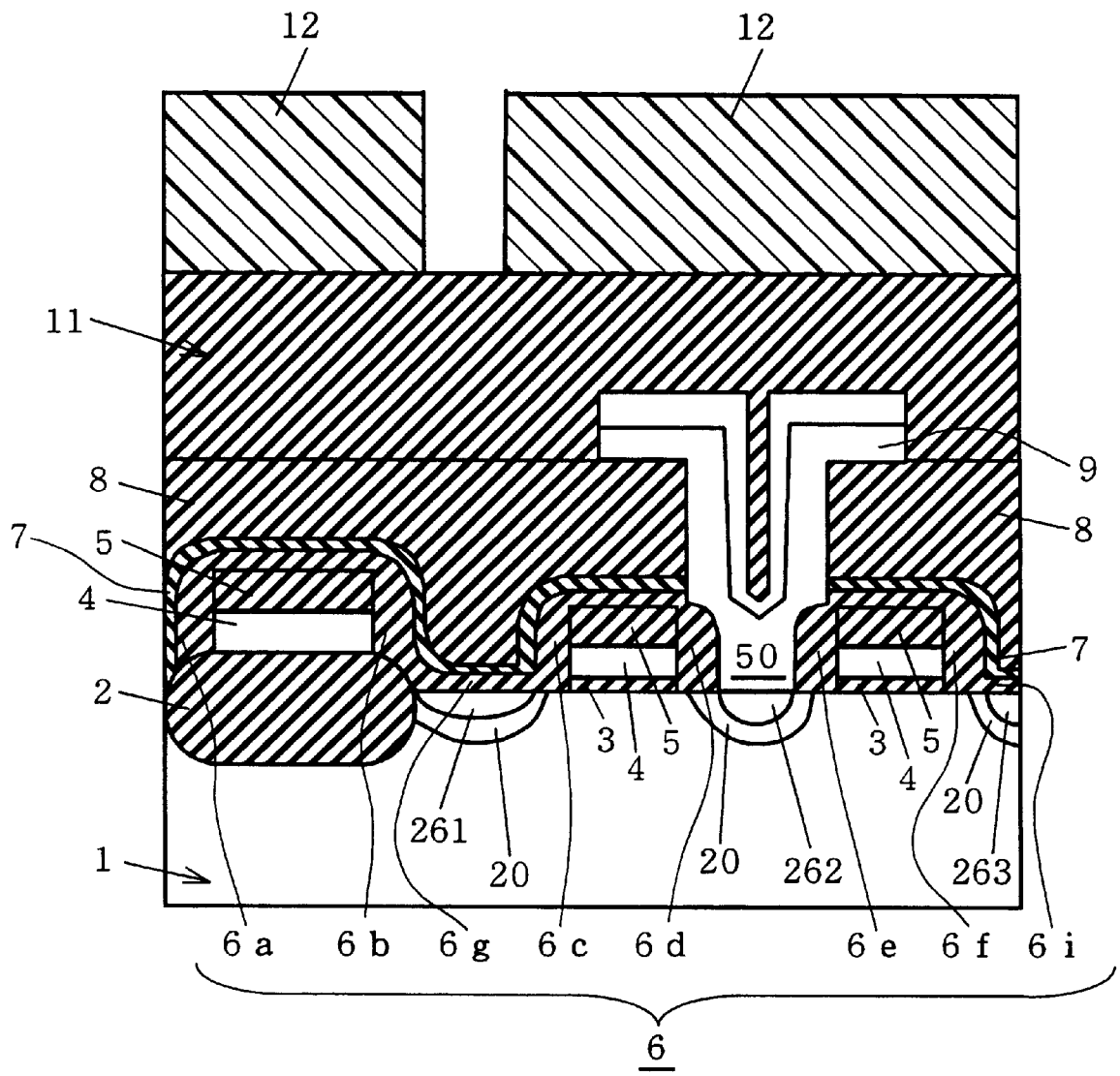
Figure 87:
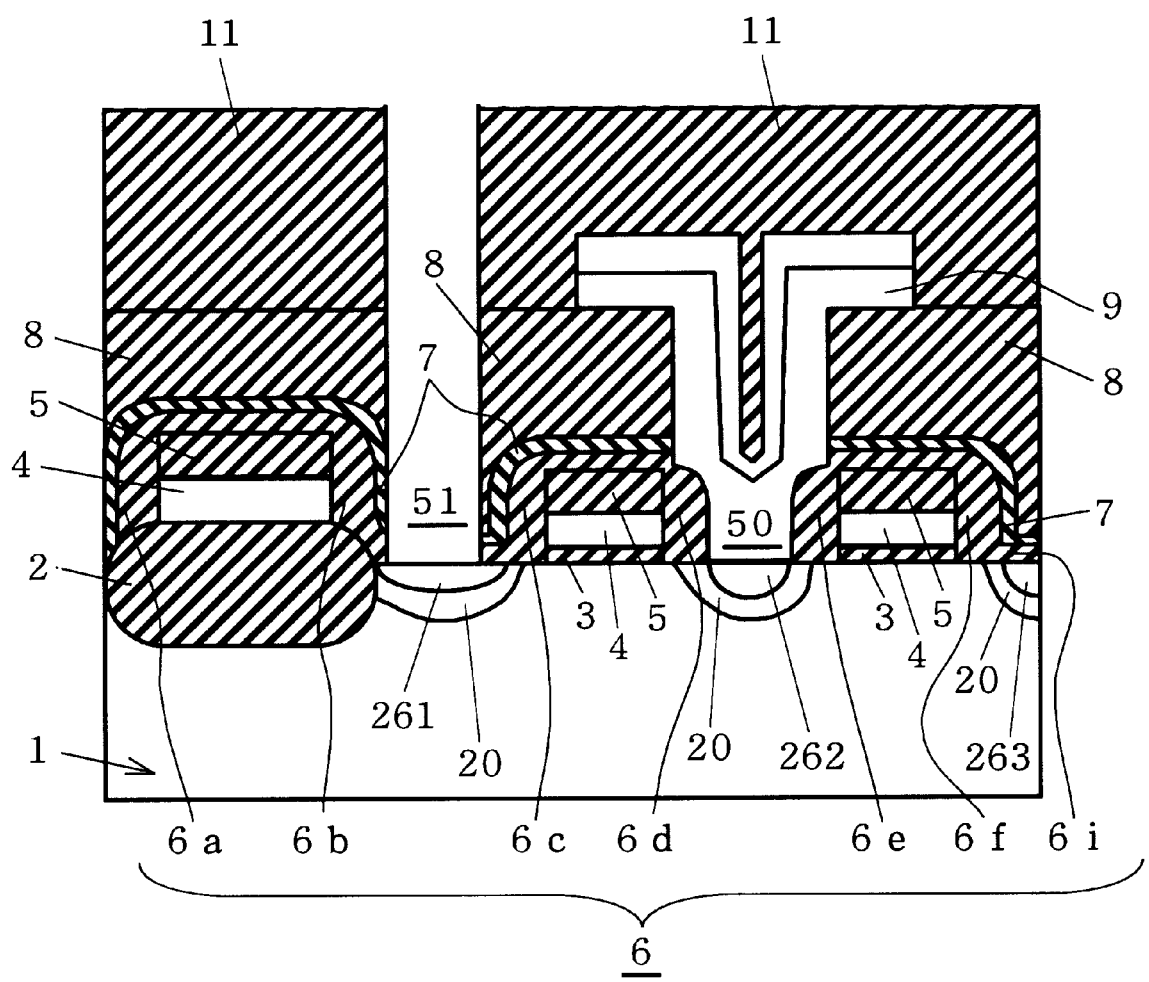
Figure 88:
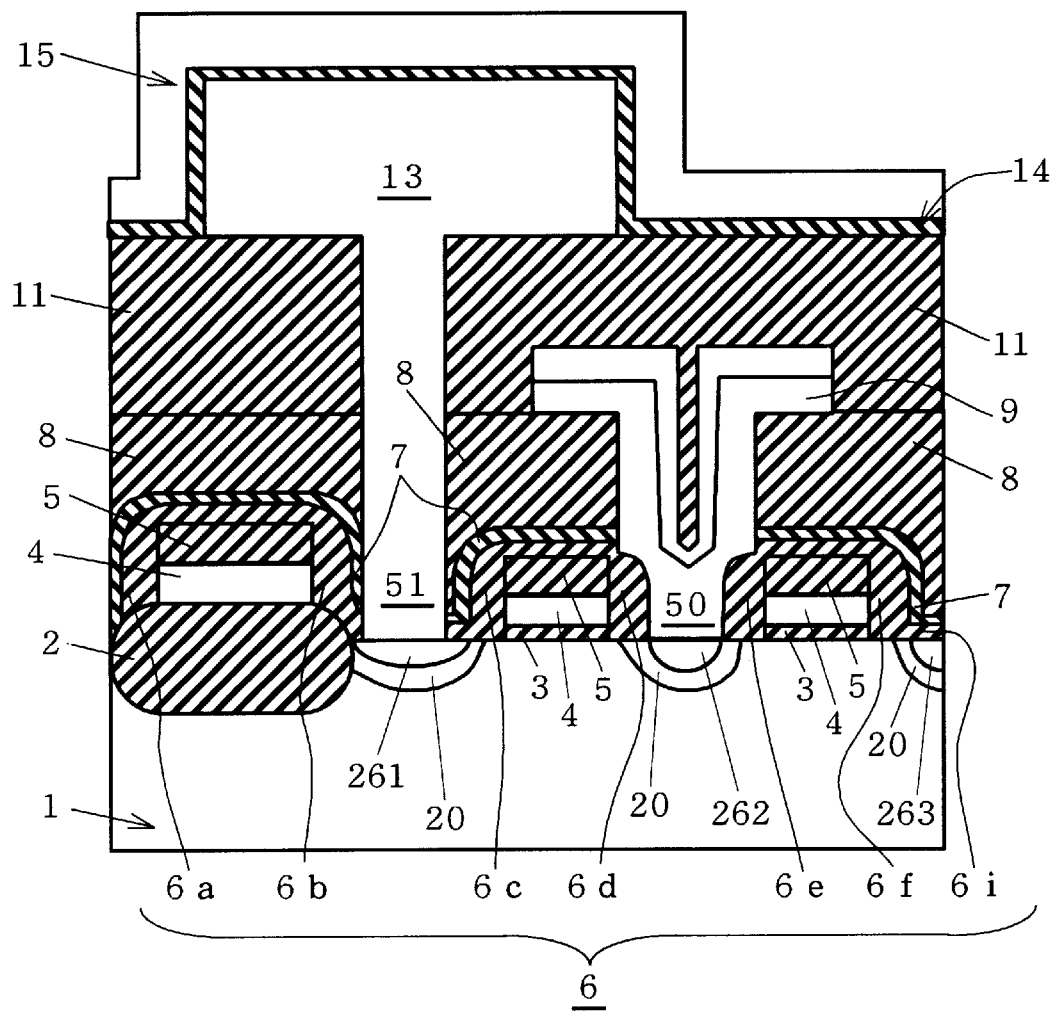
Figure 89:
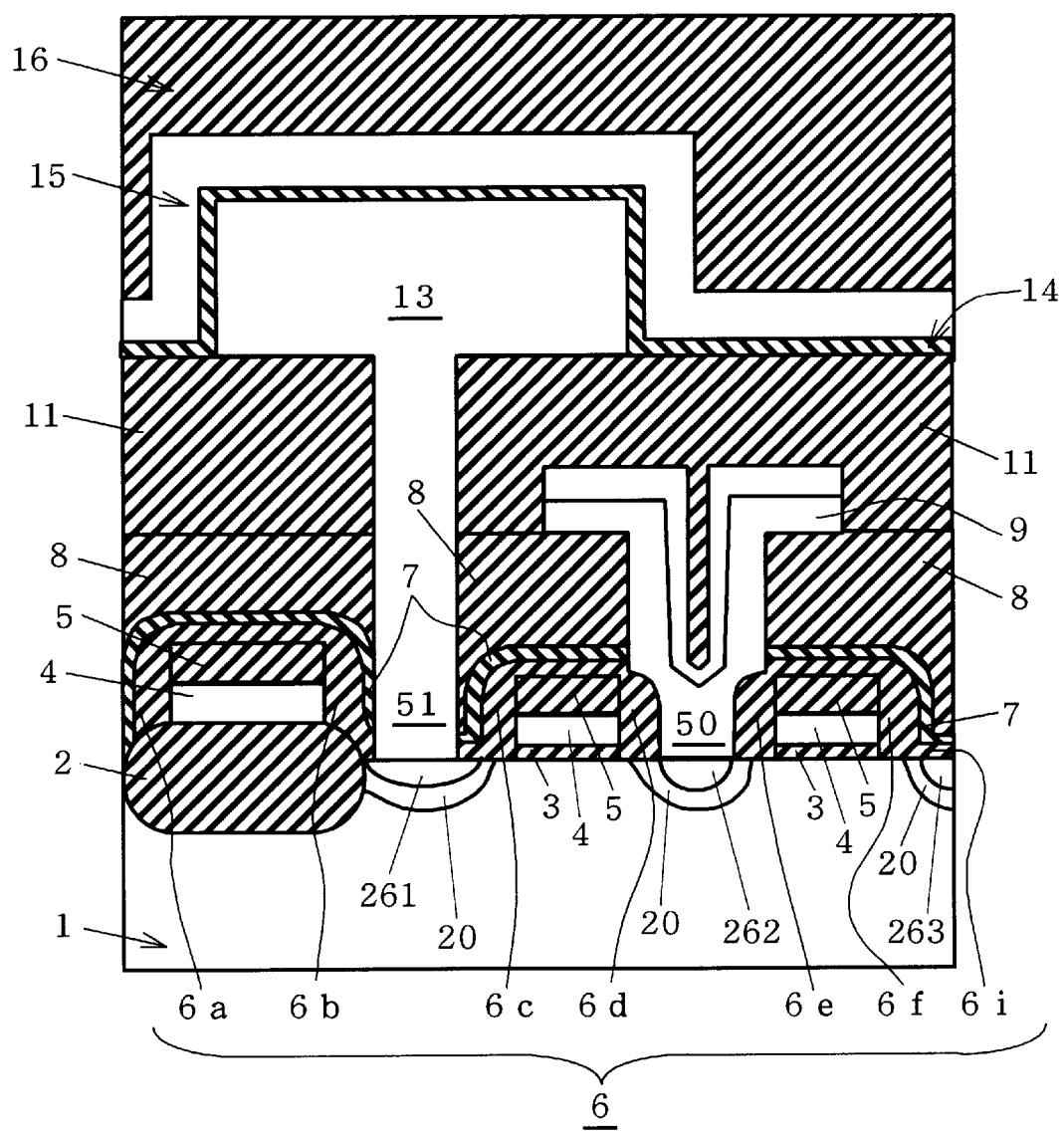
Figure 90:
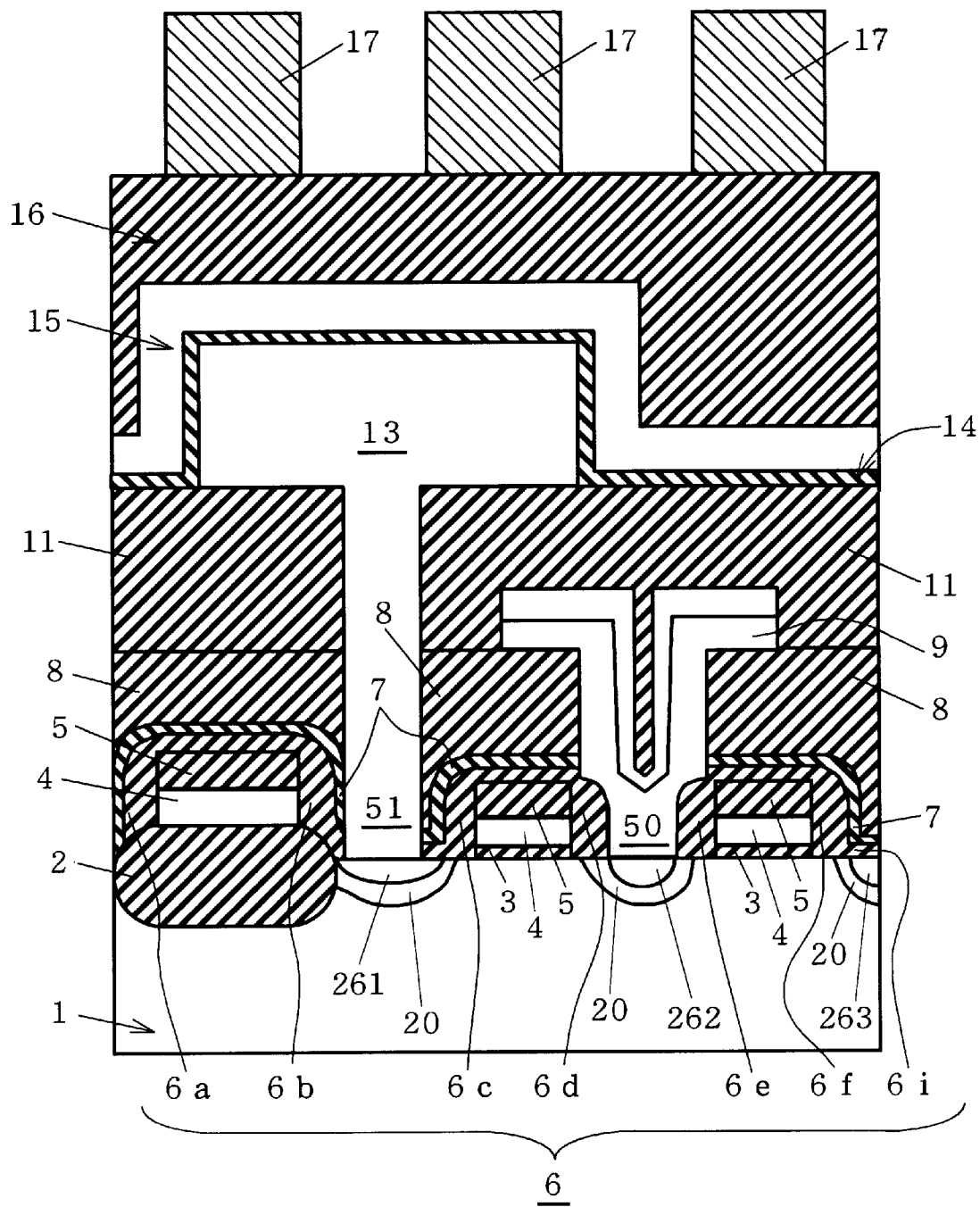

Thereafter, fabrication steps similar to those of the first preferred embodiment are performed until the interconnect layers 17 are formed. More specifically, the insulative film 7 is formed over the top surface (FIG. 79), and the interlayer insulative film 8 is formed on the insulative film 7 (FIG. 80). Using as a mask the photoresist 10 formed on the interlayer insulative film 8, the oxide etching process using the $C_4F_8$ gas and the like etches the interlayer insulative film 8 to form the contact hole 50 (FIG. 81). Using the photoresist 10 as a mask, the insulative film 7 is etched (FIG. 82), and the substrate protective oxide film 6h is then removed (FIG. 83). The conductive film 9 is formed for connection to the source/drain region 262 through the contact hole 50 (FIG. 84), and the interlayer insulative film 11 is formed over the top surface (FIG. 85). The photoresist 12 is formed on the interlayer insulative film 11 (FIG. 86). Using the photoresist 12 as a mask, the interlayer insulative films 11 and 8, the insulative film 7, and the substrate protective oxide film 6g are subjected to etching which forms the contact hole 51 to expose the source/drain region 261 (FIG. 87). The capacitor lower electrode 13 is formed for connection to the source/drain region 261 through the contact hole 51, and the capacitor dielectric film 14 and the capacitor upper electrode 15 are formed over the entire surface (FIG. 88). The interlayer insulative film 16 is formed over the top surface (FIG. 89). The interconnect layers 17 are selectively formed on the interlayer insulative film 16 (FIG. 90).

In the method of fabricating the semiconductor device of the ninth preferred embodiment, as above described, the impurity diffusion layers 20 of the conductivity type opposite to that of the semiconductor substrate 1 are additionally formed outside the source/drain regions 261 and 262 to reduce the contact resistance of the capacitor lower electrode 13 and the semiconductor substrate 1 and the contact resistance of the conductive film 9 and the semiconductor substrate 1. Similar to the eighth preferred embodiment, the ninth preferred embodiment may reduce the leakage current flowing from the capacitor lower electrode 13 into the semiconductor substrate 1. Furthermore, the semiconductor substrate 1 which is not exposed during the ion implantation process for formation of the impurity diffusion layers 20 is prevented from being damaged.

Although the effects of the ninth preferred embodiment are described on the basis of the first preferred embodiment, similar effects may be provided on the basis of the method of the fifth preferred embodiment.

Preferred Embodiment 10

Figure 91:
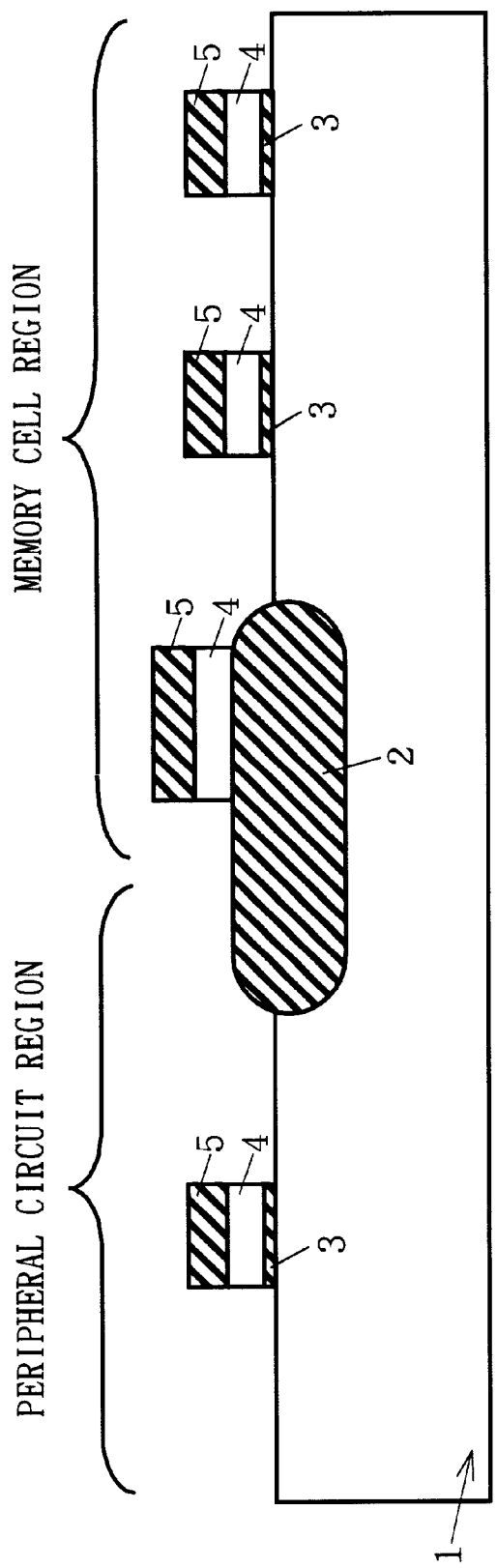
FIGS. 91 through 108 are cross-sectional views showing respective steps of the fabrication of the semiconductor device according to a tenth preferred embodiment of the present invention.

FIGS. 91 through 108 are cross-sectional views showing respective steps of the fabrication of the semiconductor device in sequential order according to a tenth preferred embodiment of the present invention. First, the isolation insulative film 2 is formed on the semiconductor (e.g., Si) substrate 1 by the LOCOS technique, and laminated structures each comprised of the gate oxide film 3, the gate electrode 4, and the insulative film 5 stacked in this order are selectively formed on the semiconductor substrate 1 except where the isolation insulative film 2 is formed (FIG. 91). The semiconductor substrate 1 of the tenth preferred embodiment is divided into a peripheral circuit region and a memory cell region as illustrated in FIG. 91. The gate oxide film 3 is not shown in FIG. 1 as formed under the gate electrode 4 overlying the isolation insulative film 2, but the above described laminated structure is formed behind the isolation insulative film 2 as viewed in a direction perpendicular to the plane of the figure.

Figure 92:
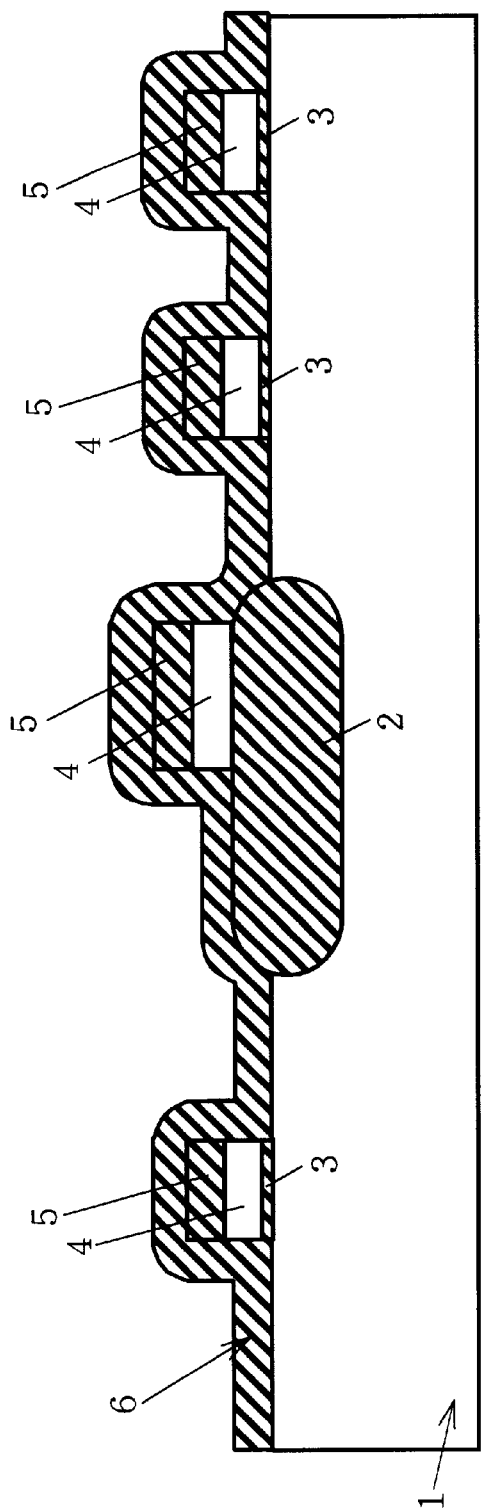
Figure 93:
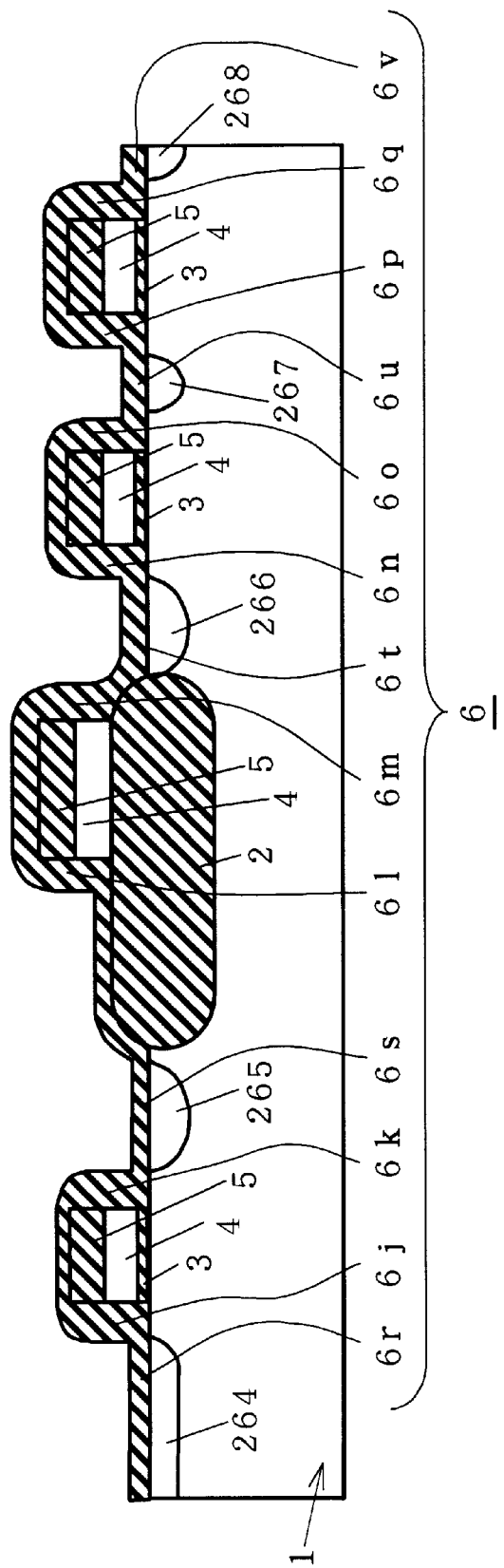

The silicon oxide film 6 is formed over the top surface by the CVD process (FIG. 92). Anisotropic oxide etching which provides a high etching rate in the direction perpendicular to the semiconductor substrate 1 is performed to etch the silicon oxide film 6. This etching causes parts of the silicon oxide film 6 to be left on side walls of the gate oxide films 3, gate electrodes 4, and insulative films 5 to form sidewalls 6j to 6q. It should be noted that, during this etching process, parts of the silicon oxide film 6 having a predetermined thickness are left on the semiconductor substrate 1 to form substrate protective oxide films 6r to 6v so that the semiconductor substrate 1 is not exposed. The thickness of the substrate protective oxide films 6r to 6v is set within a range which may prevents the semiconductor substrate 1 from being damaged by anisotropic oxide etching. For example, the thickness of the substrate protective oxide films 6r to 6v is 5 to 20 nm in this preferred embodiment. Ions are implanted into the semiconductor substrate 1 through the substrate protective oxide films 6r to 6v to form source/drain regions 264 to 268 (FIG. 93).

Figure 94:
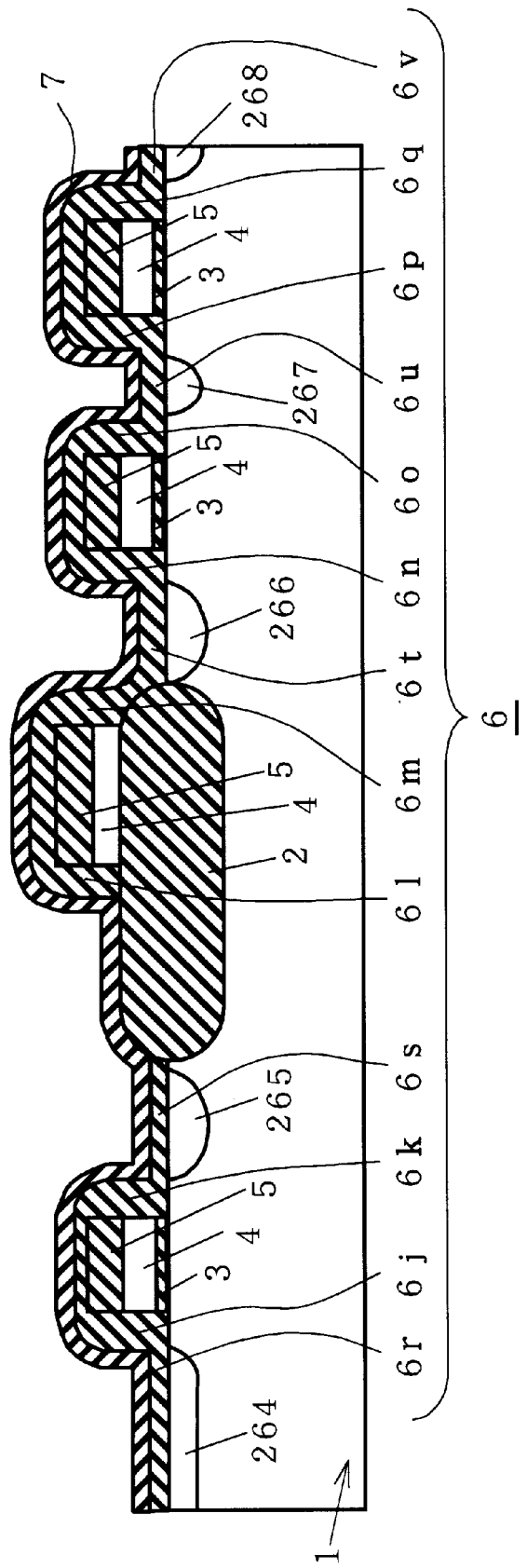

The insulative film 7 made of $Si_3N_4$, SiON and the like is deposited to a thickness of 5 to 100 nm over the top surface by the CVD process (FIG. 94).

Figure 95:
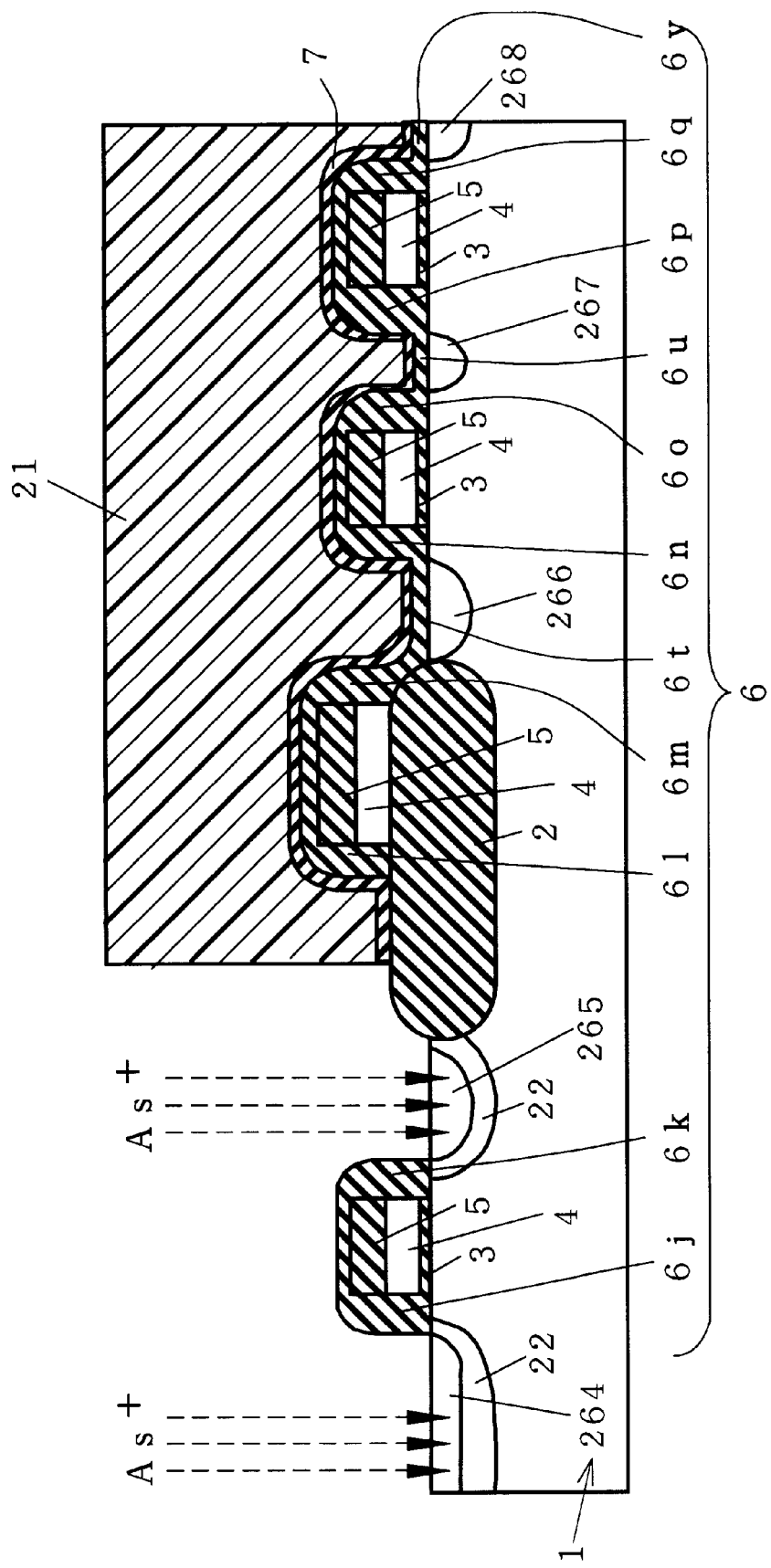
Figure 96:
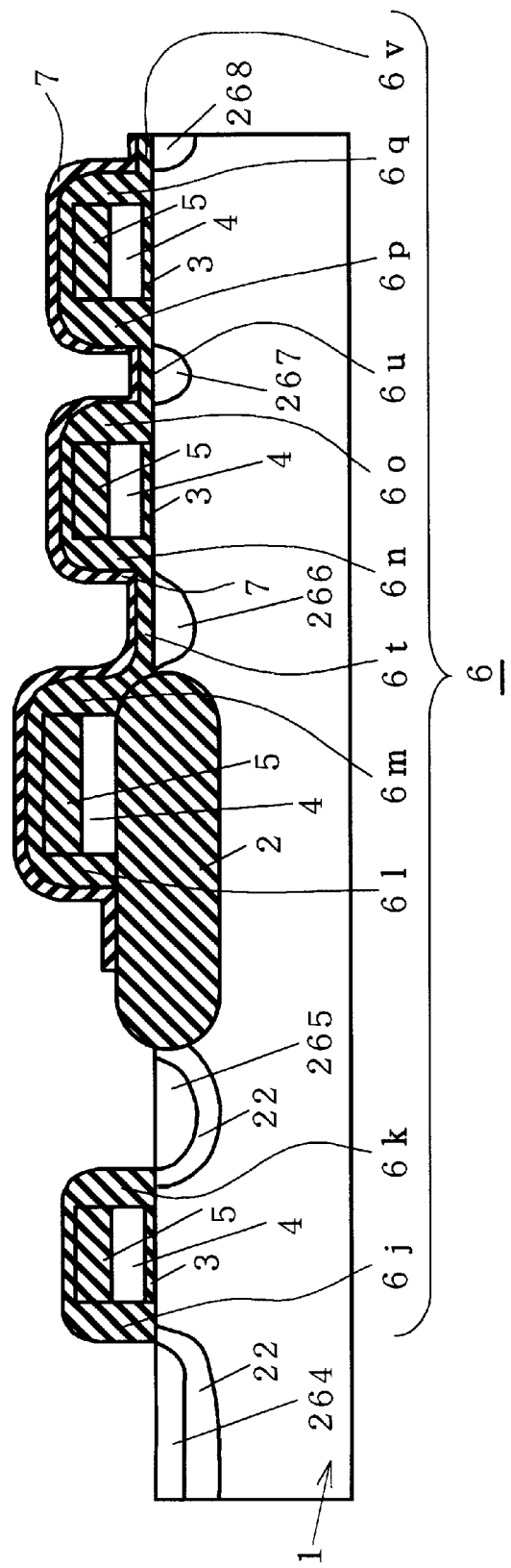

A photoresist 21 is formed on the insulative film 7 in the memory cell region by the conventional transfer process, and parts of the insulative film 7 and the substrate protective oxide films 6r and 6s which are not covered with the photoresist 21 are removed. Impurities of the conductivity type opposite to that of the semiconductor substrate 1 (e.g., phosphorus and arsenic in the case where the conductivity type of the semiconductor substrate 1 is p type; and boron in the case where the conductivity type of the semiconductor substrate 1 is n type ) are introduced into the semiconductor substrate 1 by the ion implantation technique to form impurity diffusion layers 22 which are wider than the source/drain regions 264 and 265 (FIG. 95). Then, the photoresist 21 is removed (FIG. 96).

Figure 97:
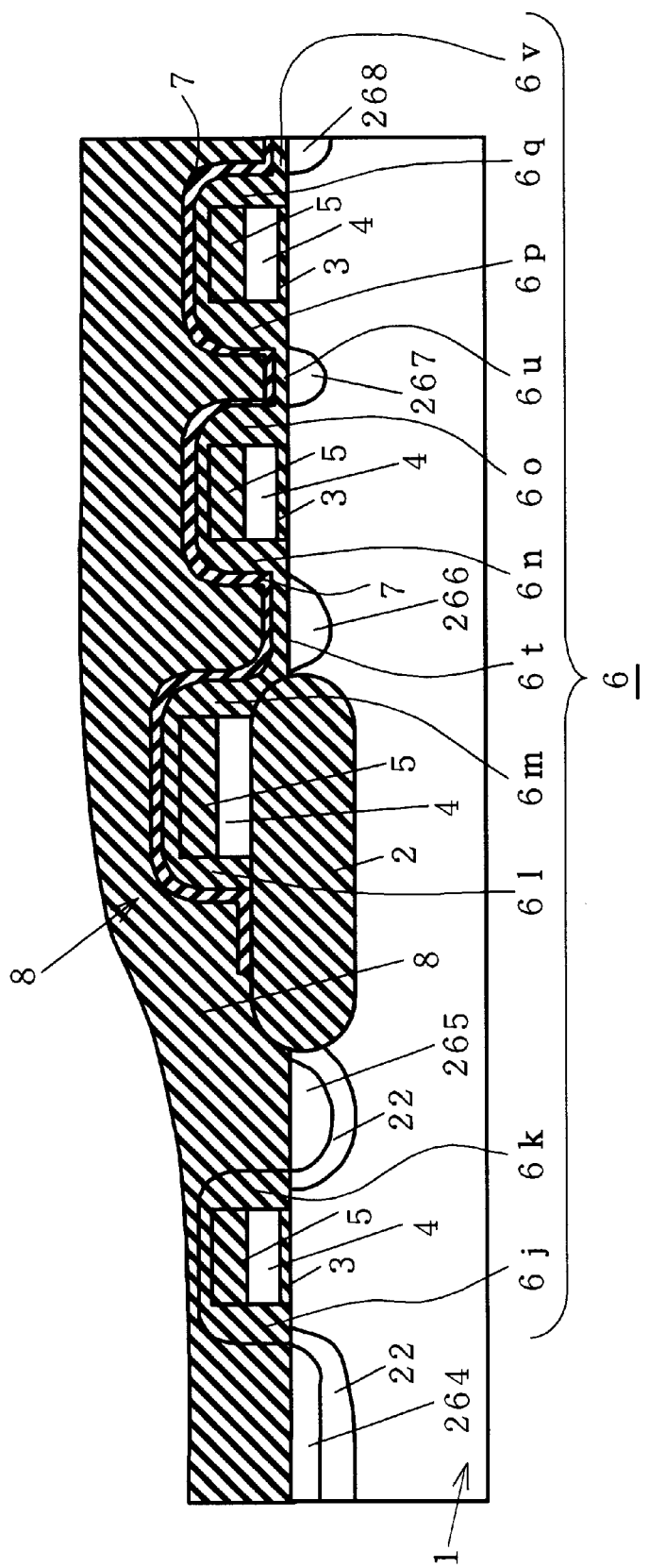
Figure 98:
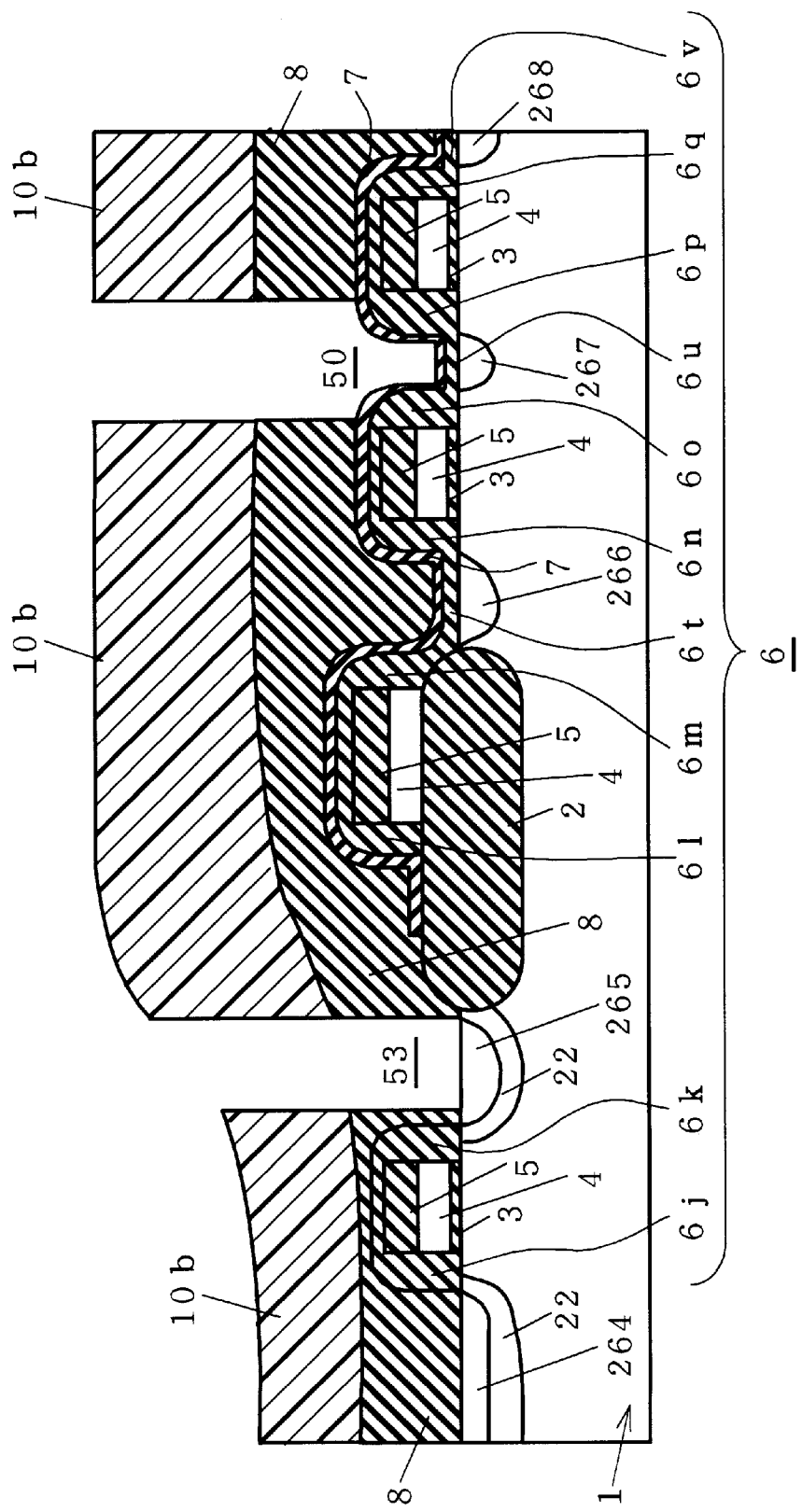

A silicon oxide film is deposited over the top surface by the CVD process to form the interlayer insulative film 8 (FIG. 97). A photoresist 10b having openings over the source/drain regions 265 and 267 is formed on the interlayer insulative film 8 by the conventional transfer process. Using the photoresist 10b as a mask, an oxide etching process which provides a high etching rate to the insulative film 7 is performed to etch the interlayer insulative film 8, thereby forming the contact holes 53 and 50 (FIG. 98). Difference in etching rate allows the etching of the contact hole 50 to be stopped at the time when the insulative film 7 is exposed.

Figure 99:
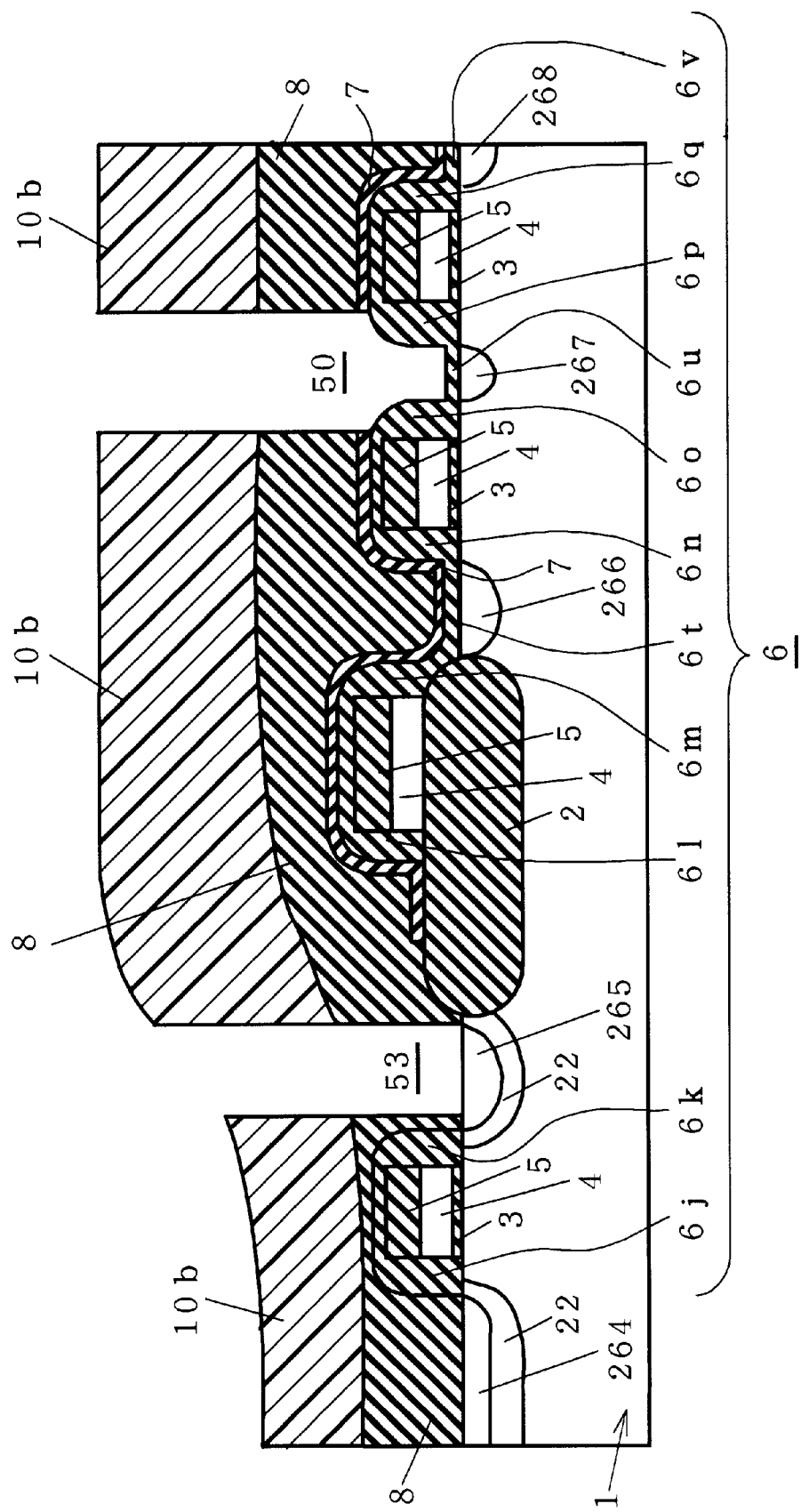

An etching process using the $CF_4$ gas and the like removes only the insulative film 7 in the contact hole 50 (FIG. 99).

Figure 100:
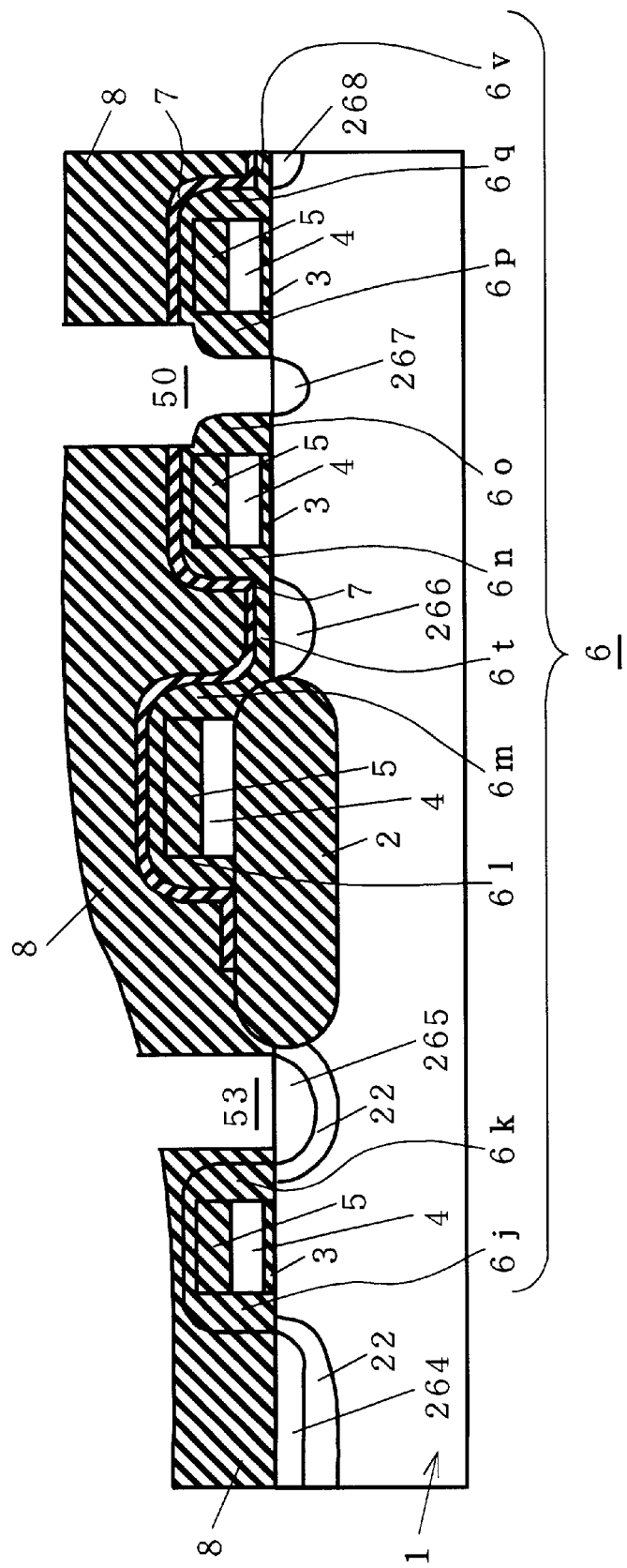

Anisotropic oxide etching is performed using the photoresist 10b as a mask to remove the substrate protective oxide film 6u and to dig down the contact hole 50 until the source/drain region 267 is exposed. Then, the photoresist 10b is removed (FIG. 100).

Figure 101:
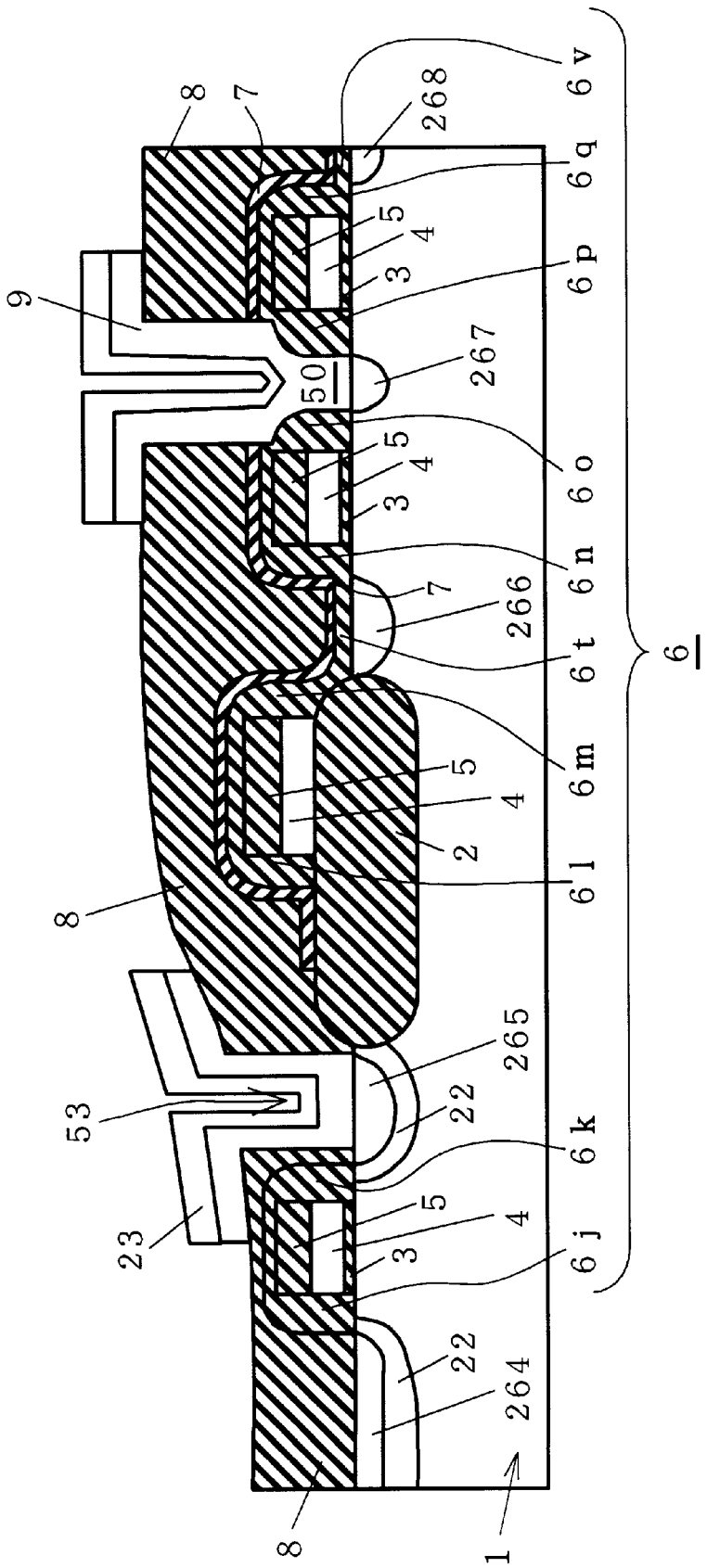

The conductive film 9 is formed for connection to the source/drain region 267 through the contact hole 50. At the same time, an interconnect layer 23 similar in construction to the conductive film 9 is formed for connection to the source/drain region 265 through the contact hole 53 (FIG. 101).

Figure 102:
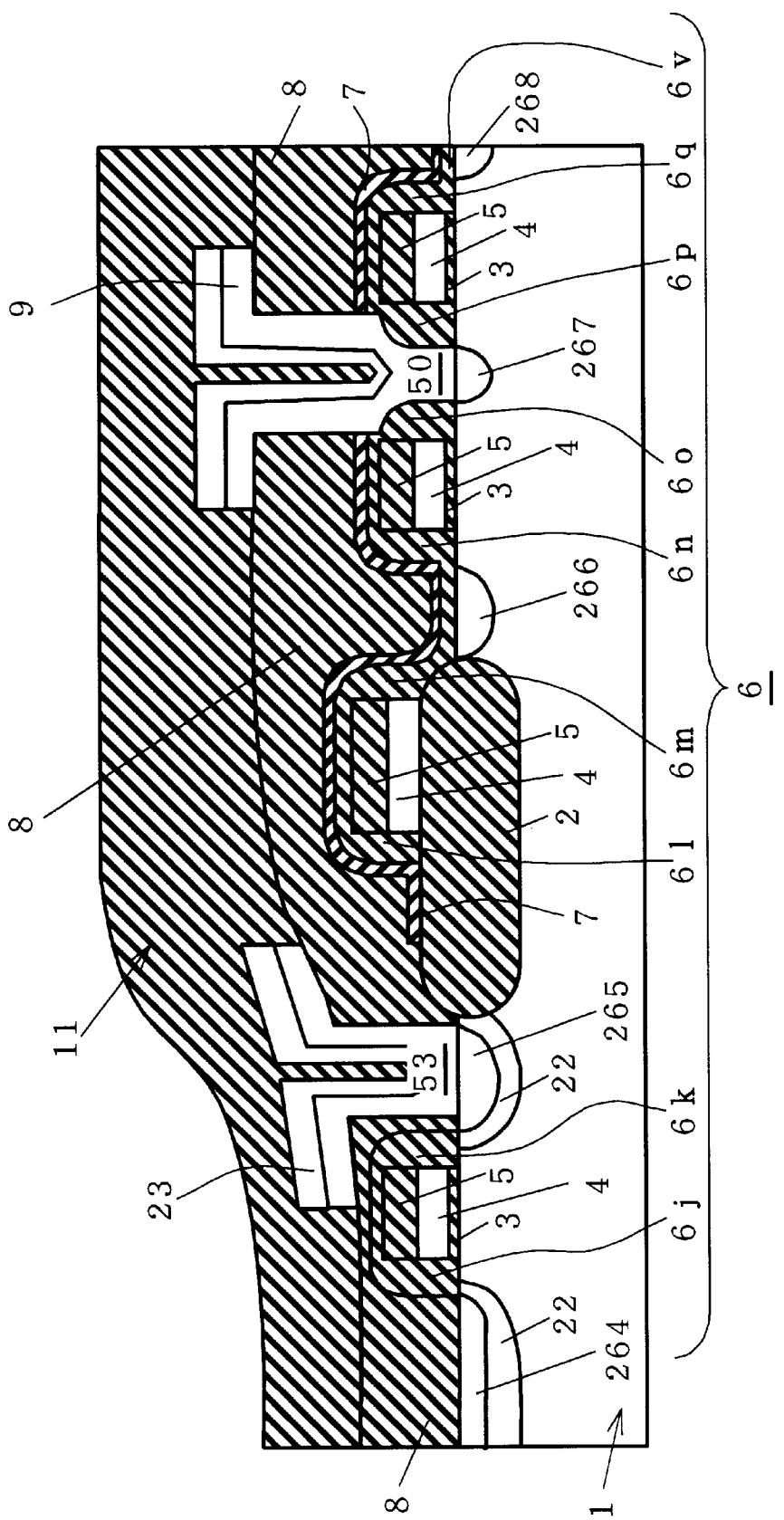
Figure 103:
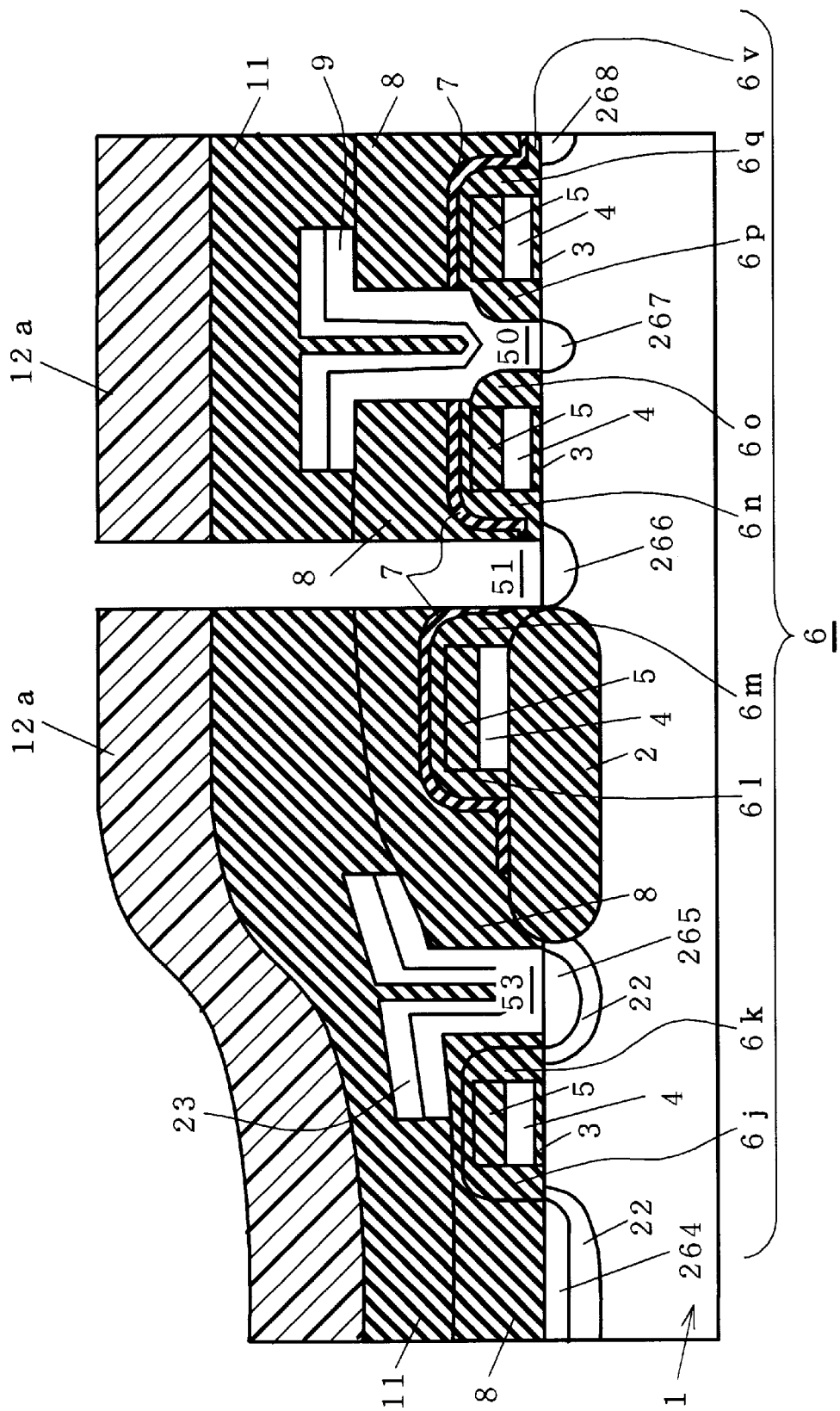
Figure 104:
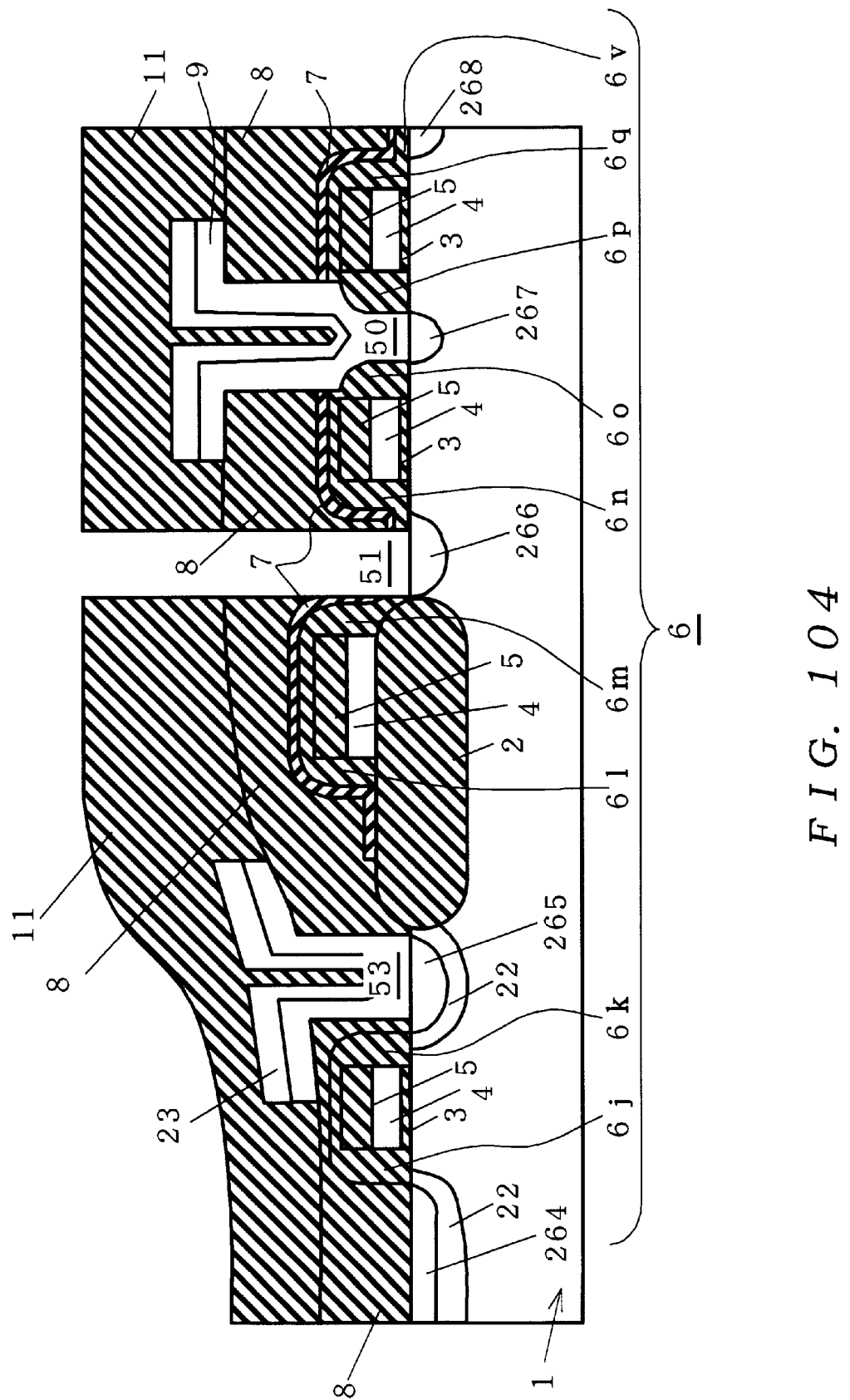

A silicon oxide film, for example, is deposited over the top surface by the CVD process to form the interlayer insulative film 11 (FIG. 102). A photoresist 12a having an opening over the source/drain region 266 is formed on the interlayer insulative film 11 by the conventional transfer process. With the photoresist 12a used as a mask, the interlayer insulative films 11 and 8, the insulative film 7, and the substrate protective oxide film 6t are subjected to etching using the same etchant which forms the contact hole 51 to expose the source/drain region 266 (FIG. 103). Then, the photoresist 12a is removed (FIG. 104).

Figure 105:
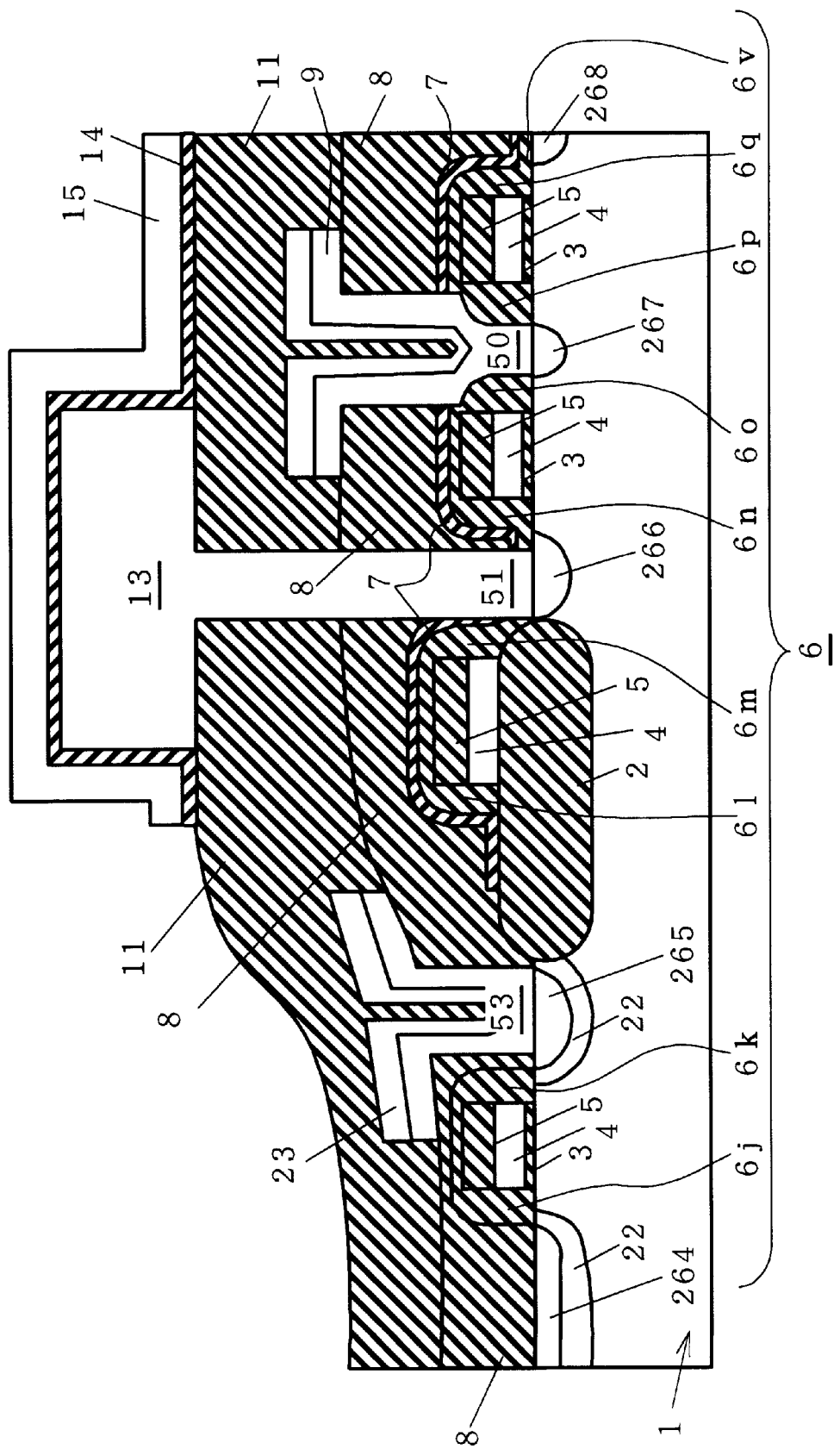

Poly Si is deposited by the CVD process so as to fill the contact hole 51 to form the capacitor lower electrode 13. A $Si_3N_4$ film is deposited only in the memory cell region to form the capacitor dielectric film 14. Further, poly Si is deposited on the capacitor dielectric film 14 by the CVD process to form the capacitor upper electrode 15 (FIG. 105).

Figure 106:
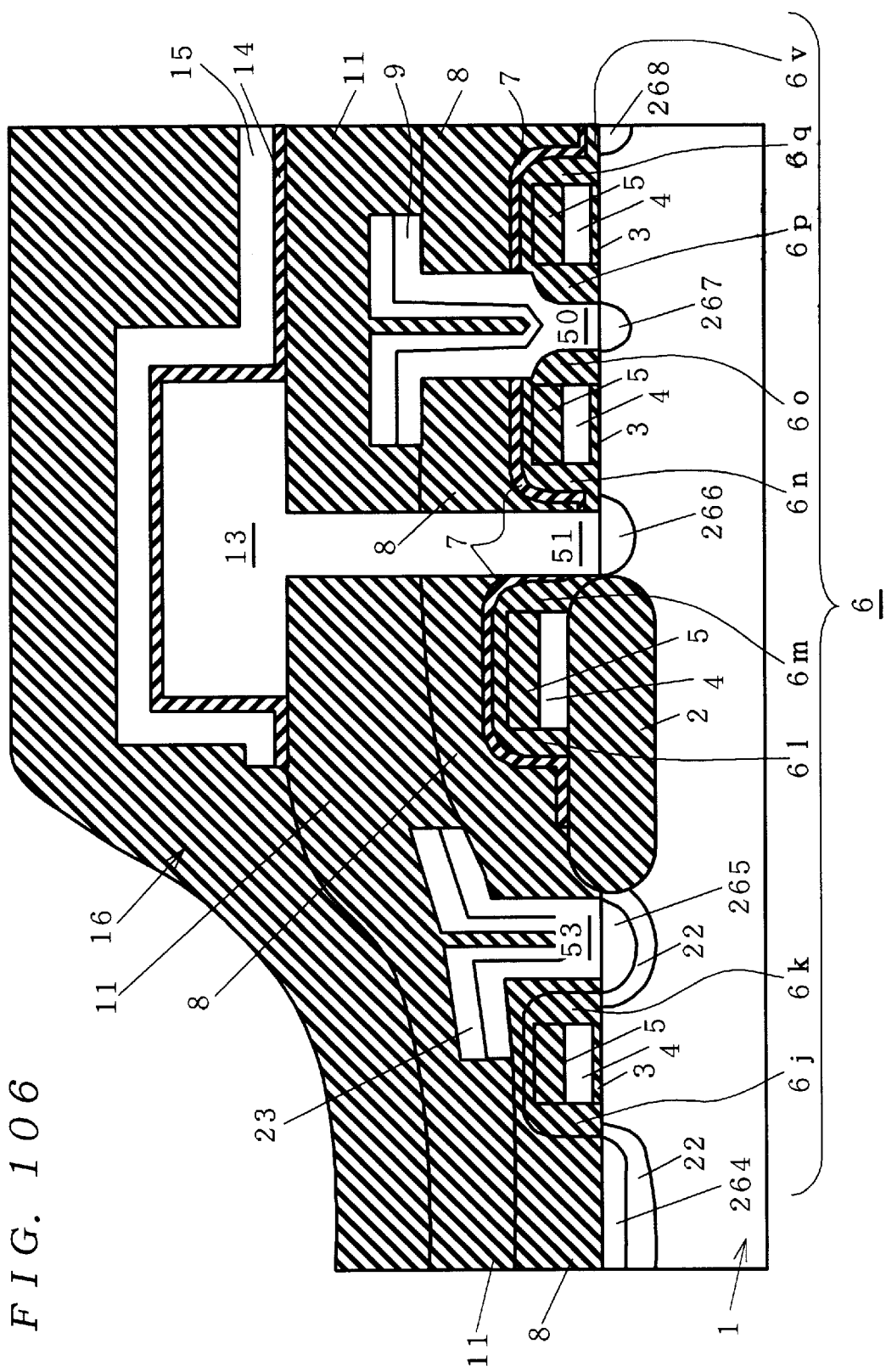
Figure 107:
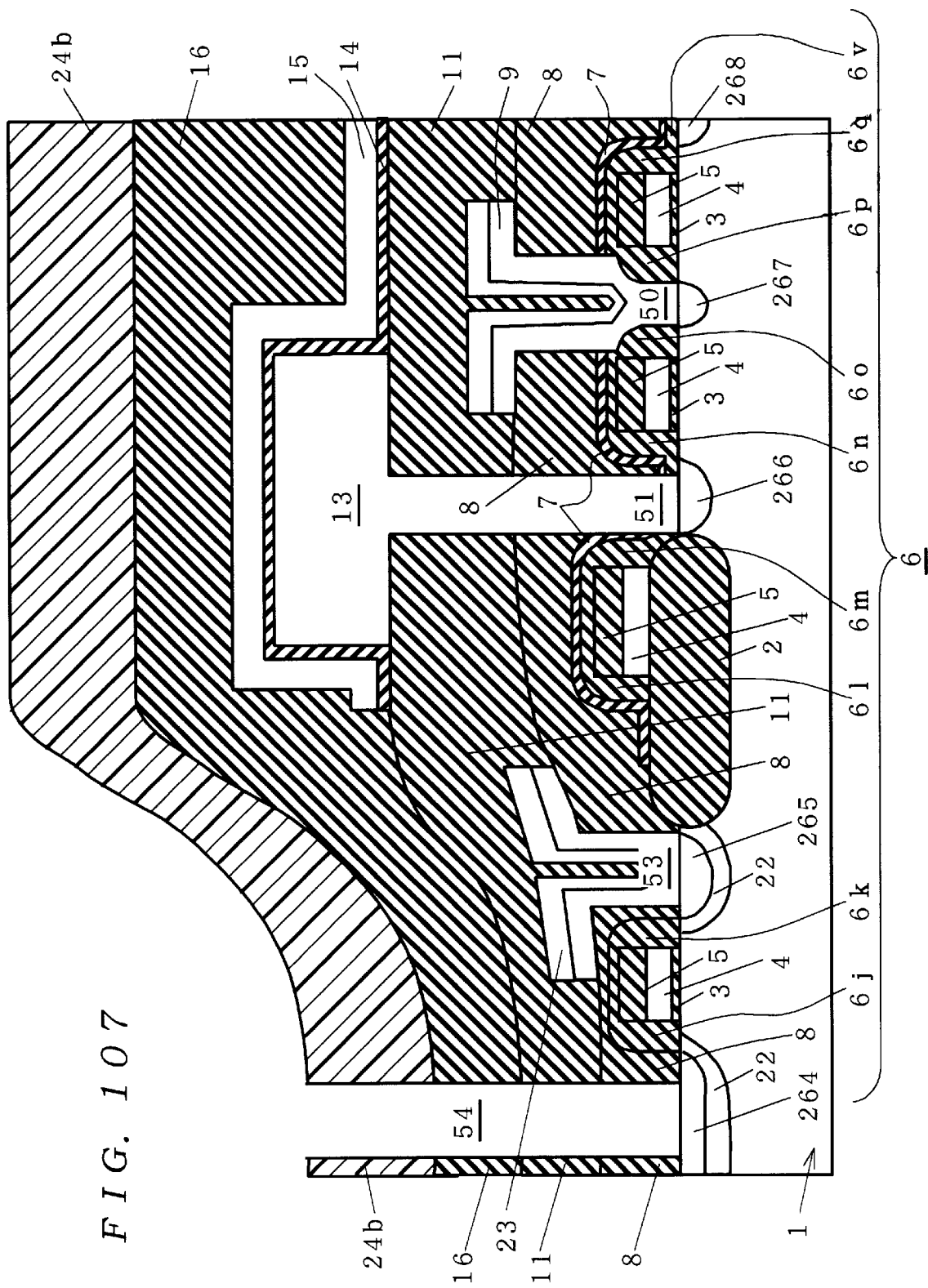

A silicon oxide film, for example, is deposited over the top surface by the CVD process to form the interlayer insulative film 16 (FIG. 106). A photoresist 24b having an opening over the source/drain region 264 is formed on the interlayer insulative film 16 by the conventional transfer process. Using the photoresist 24b as a mask, the interlayer insulative films 16, 11 and 8 are subjected to etching which forms a contact hole 54 to expose the source/drain region 264 (FIG. 107). Then, the photoresist 24b is removed.

Figure 108:
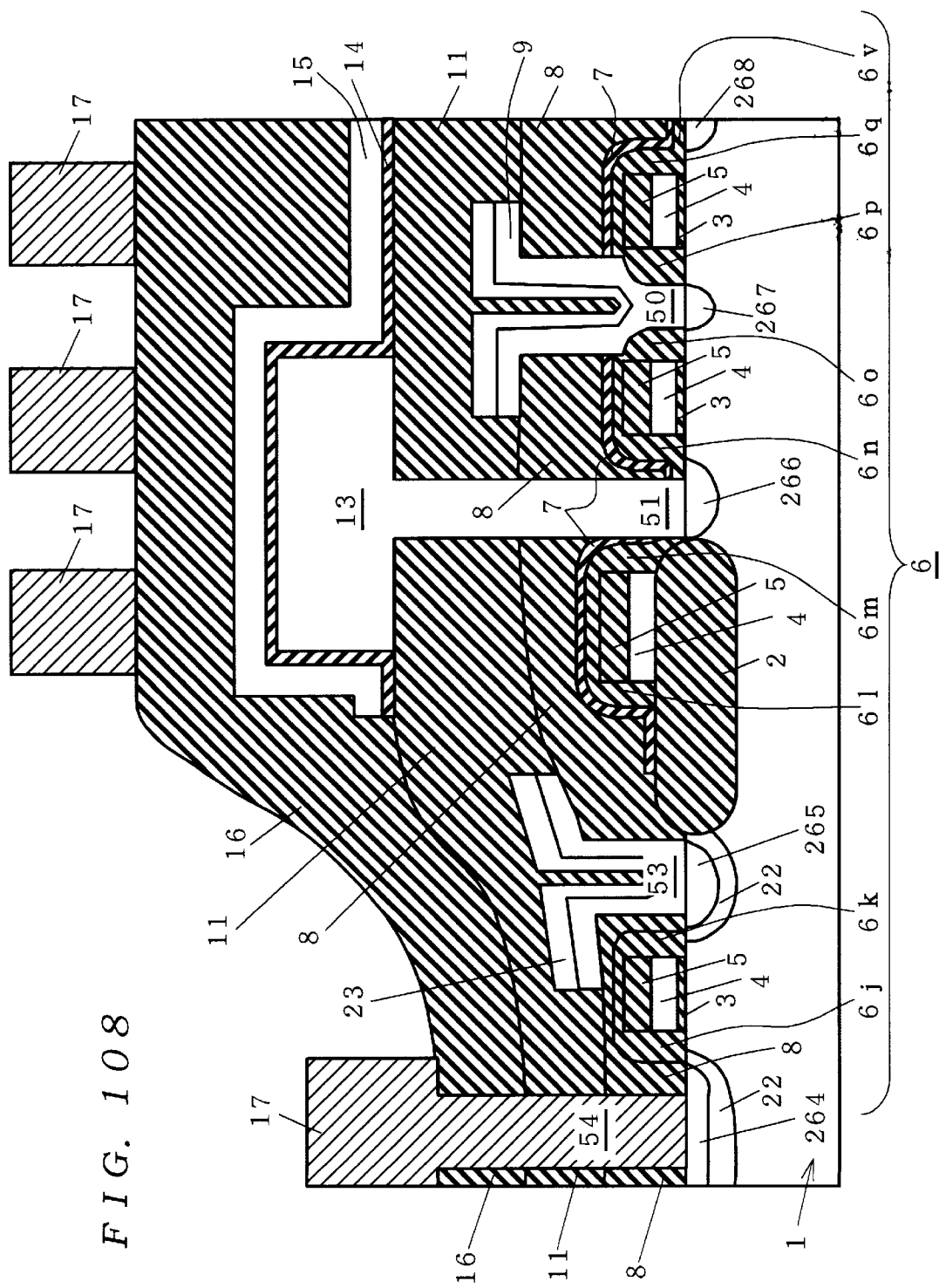

The interconnect layers 17 are selectively formed on the interlayer insulative film 16. One of the interconnect layers 17 is formed for connection to the source/drain region 264 through the contact hole 54 (FIG. 108).

In the method of fabricating the semiconductor device according to the tenth preferred embodiment, as above described, only the interlayer insulative film 8 is etched once using the insulative film 7 as an etch stopper when the contact hole 50 is formed. At this stage, the substrate protective oxide film 6u has not yet been etched. Thus, the etching of the interlayer insulative film 8 does not damage the source/drain region 267. Further, the thinness of the substrate protective oxide film 6u facilitates control of the etching amount thereof, preventing damages to the source/drain region 267. Small amounts of the insulative film 5 and the sidewalls 6o and 6p are removed relative to the total etching amounts. Therefore, the contact hole 50 may be formed in a self-aligned fashion in non-contacting relation to the gate electrodes 4.

There is no need to etch the insulative film 7 having a low etching rate when the contact holes 53 and 54 are formed, facilitating control of the etching amount during the formation of the contact holes 53 and 54.

The additional provision of the impurity diffusion layers 22 of the conductivity type opposite to that of the semiconductor substrate 1 and having a wider area than the source/drain regions 264 and 265 may reduce the contact resistance of the interconnect layers 17 and the semiconductor substrate 1 and the contact resistance of the interconnect layer 23 and the semiconductor substrate 1.

Preferred Embodiment 11

In the tenth preferred embodiment, the impurity diffusion layers 22 are formed after the etching of the insulative film 7 and the substrate protective oxide films 6r and 6s in the peripheral circuit region. However, the impurity diffusion layers 22 may be formed by introducing impurities through the substrate protective oxide films 6r and 6s after only the insulative film 7 is etched.

Figure 109:
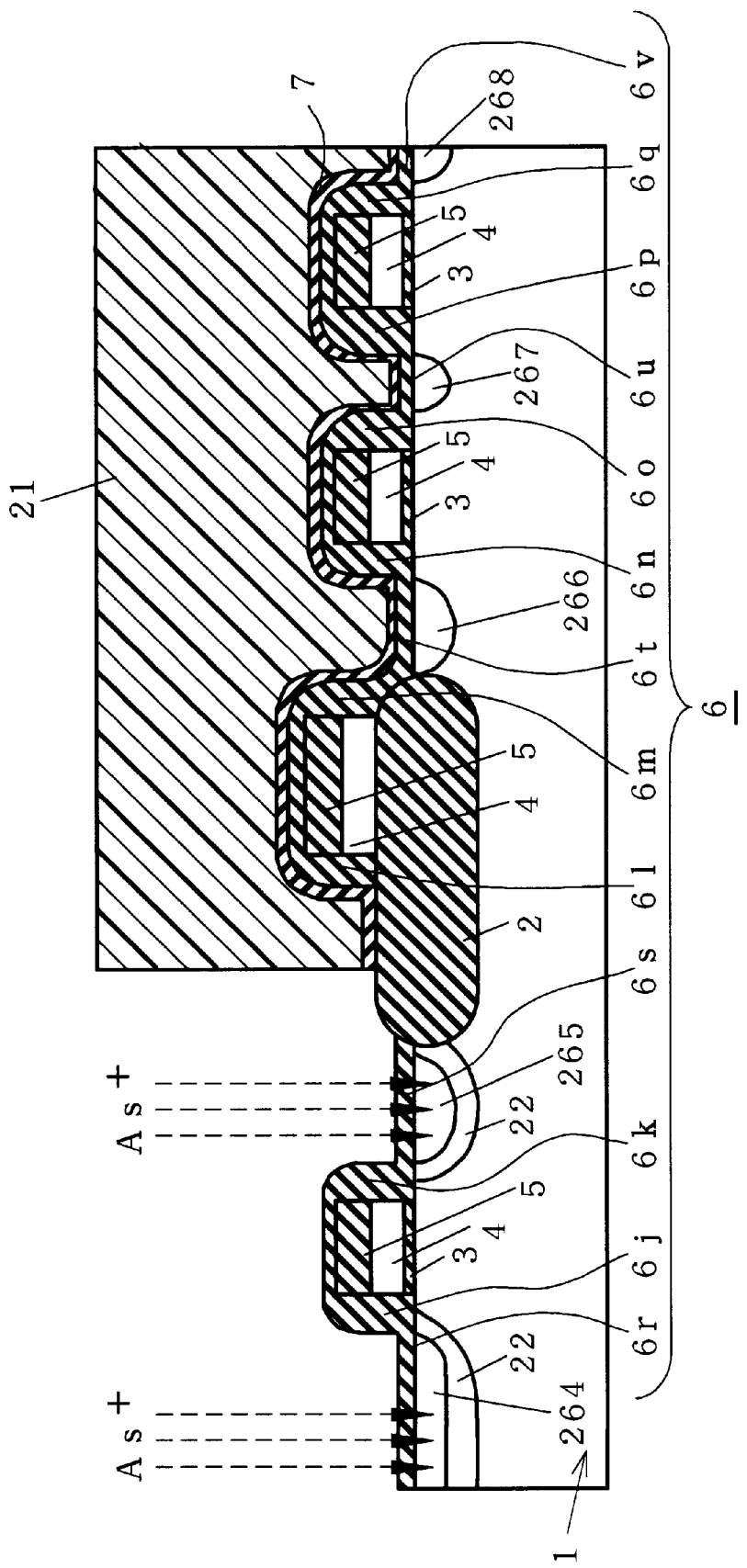
FIGS. 109 and 110 are cross-sectional views showing respective steps of the fabrication of the semiconductor device according to an eleventh preferred embodiment of the present invention.
Figure 110:
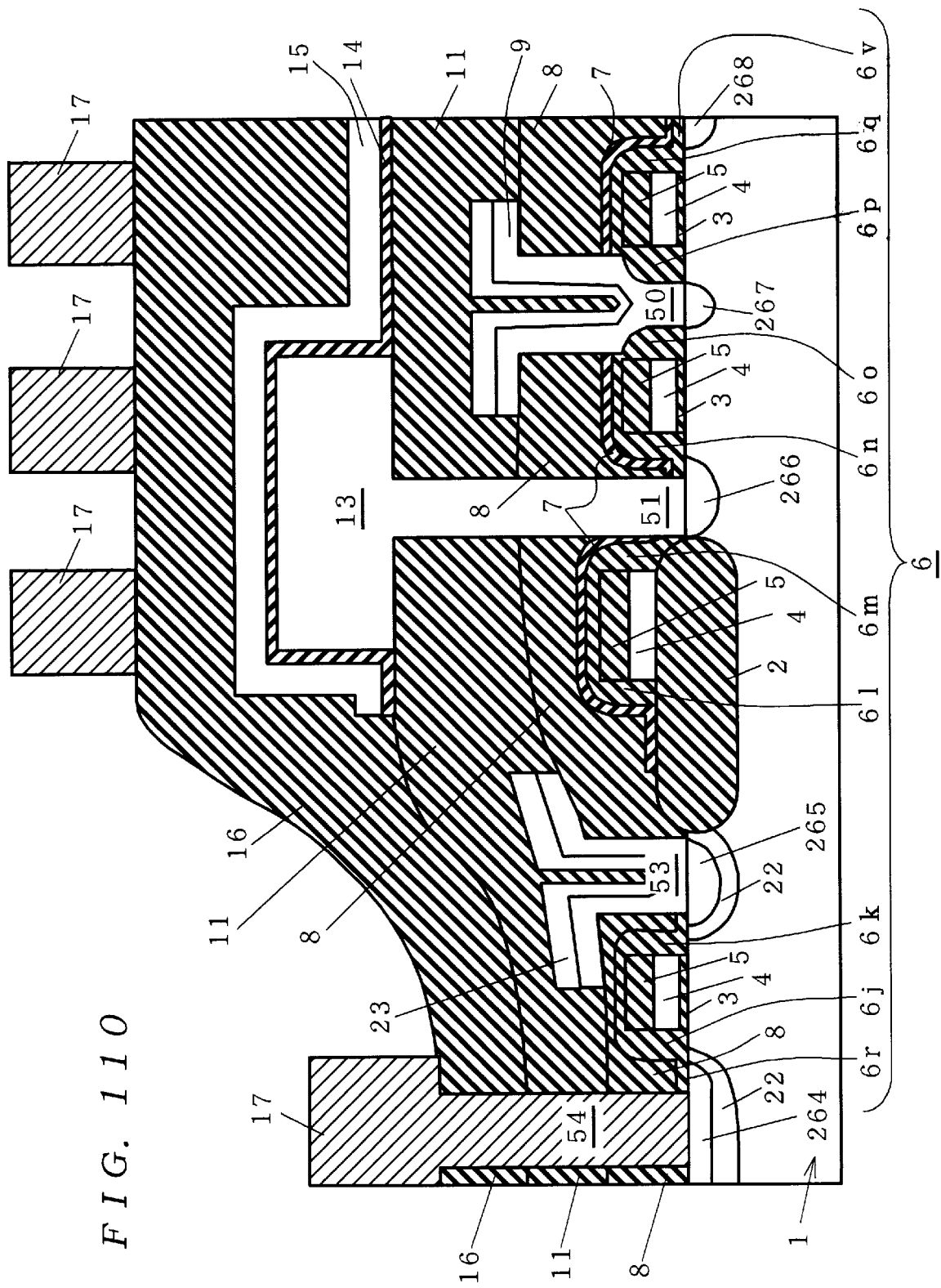
Figure 111:
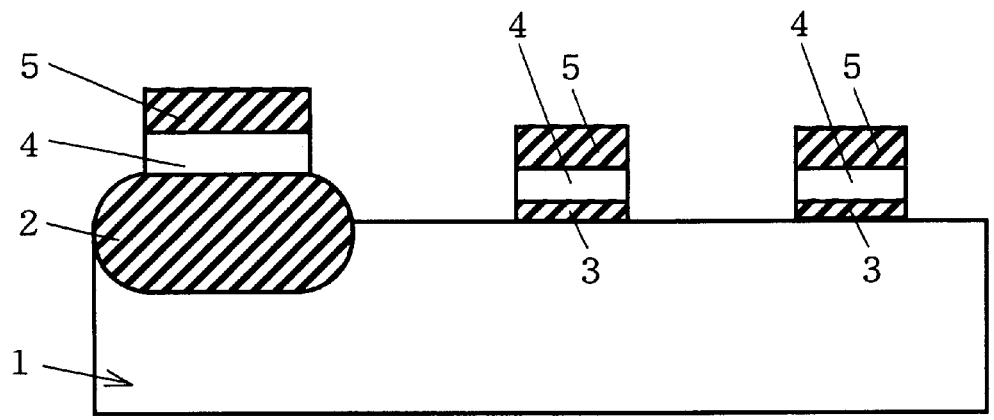
FIGS. 111 through 122 are cross-sectional views showing respective background art steps of the fabrication of a semiconductor device.
Figure 112:
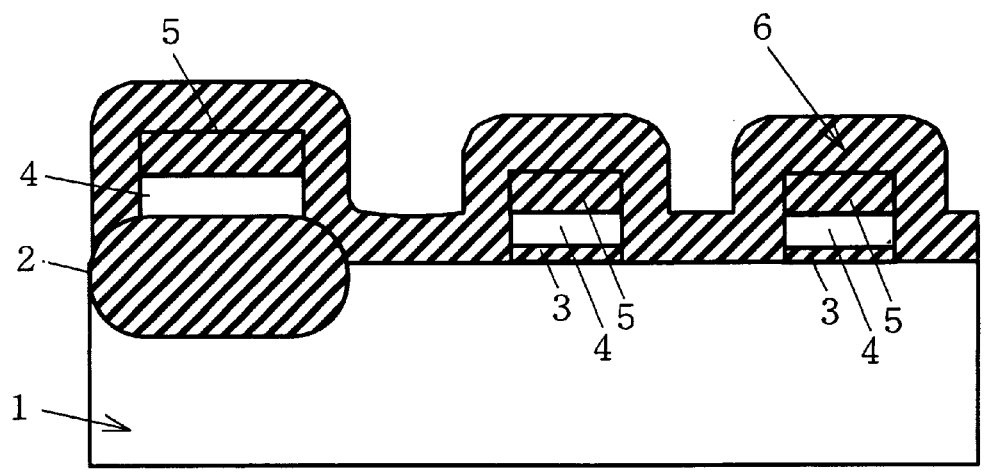
Figure 113:
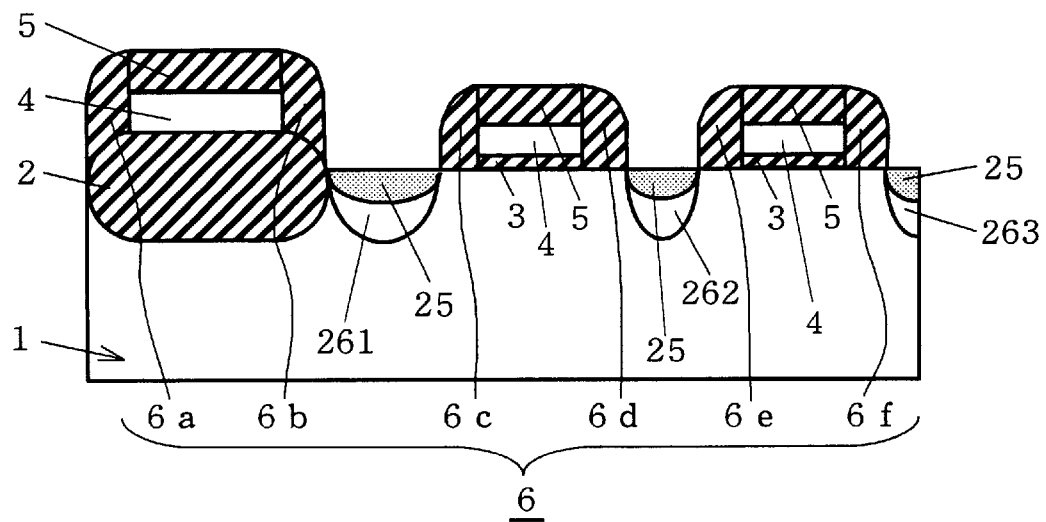
Figure 114:
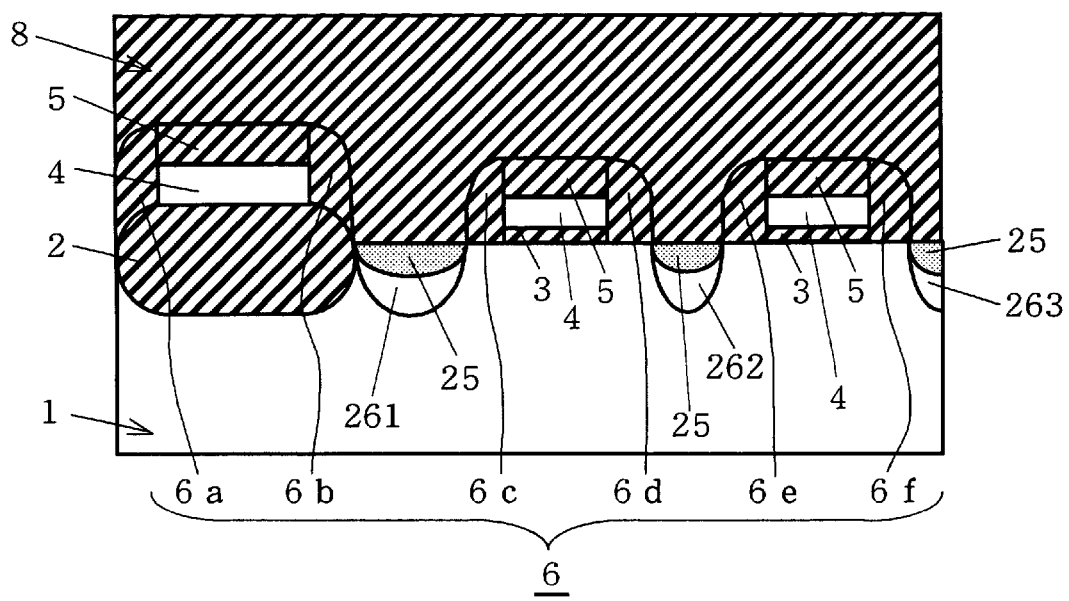
Figure 115:
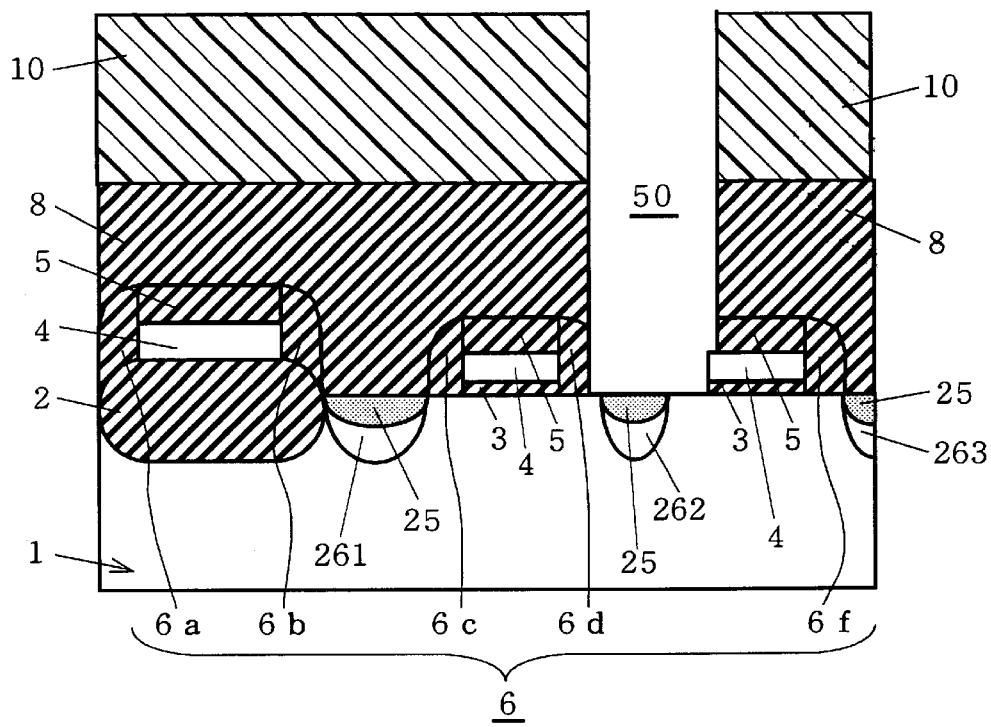
Figure 116:
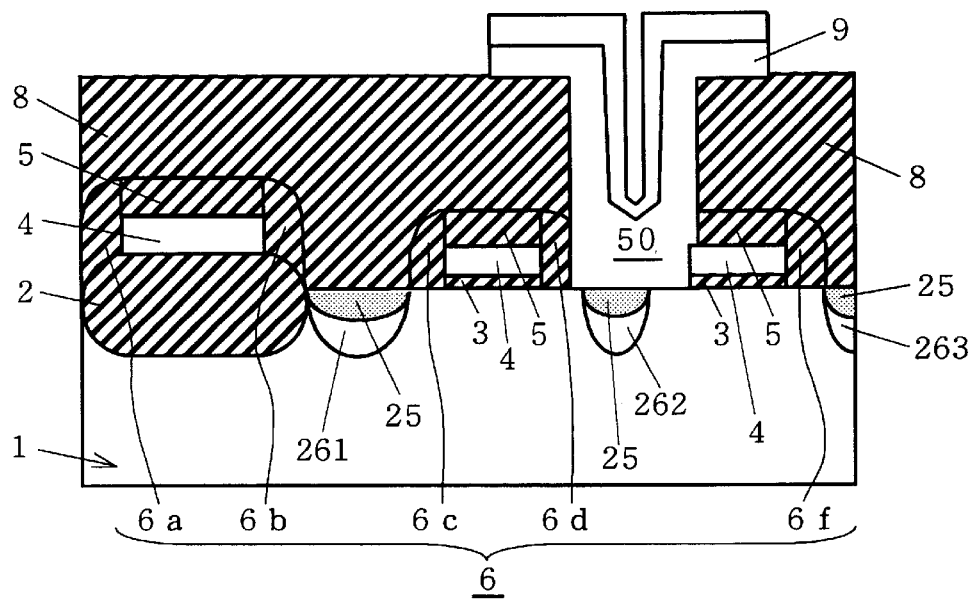
Figure 117:
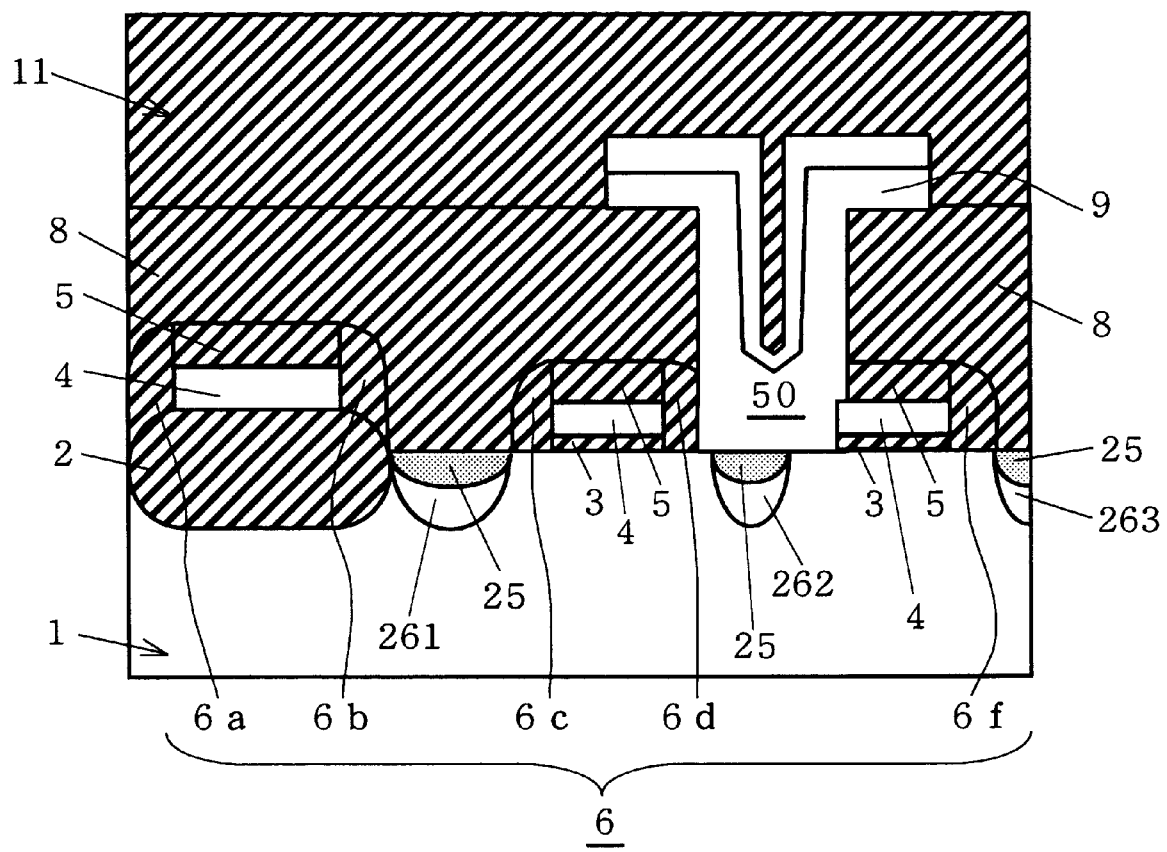
Figure 118:
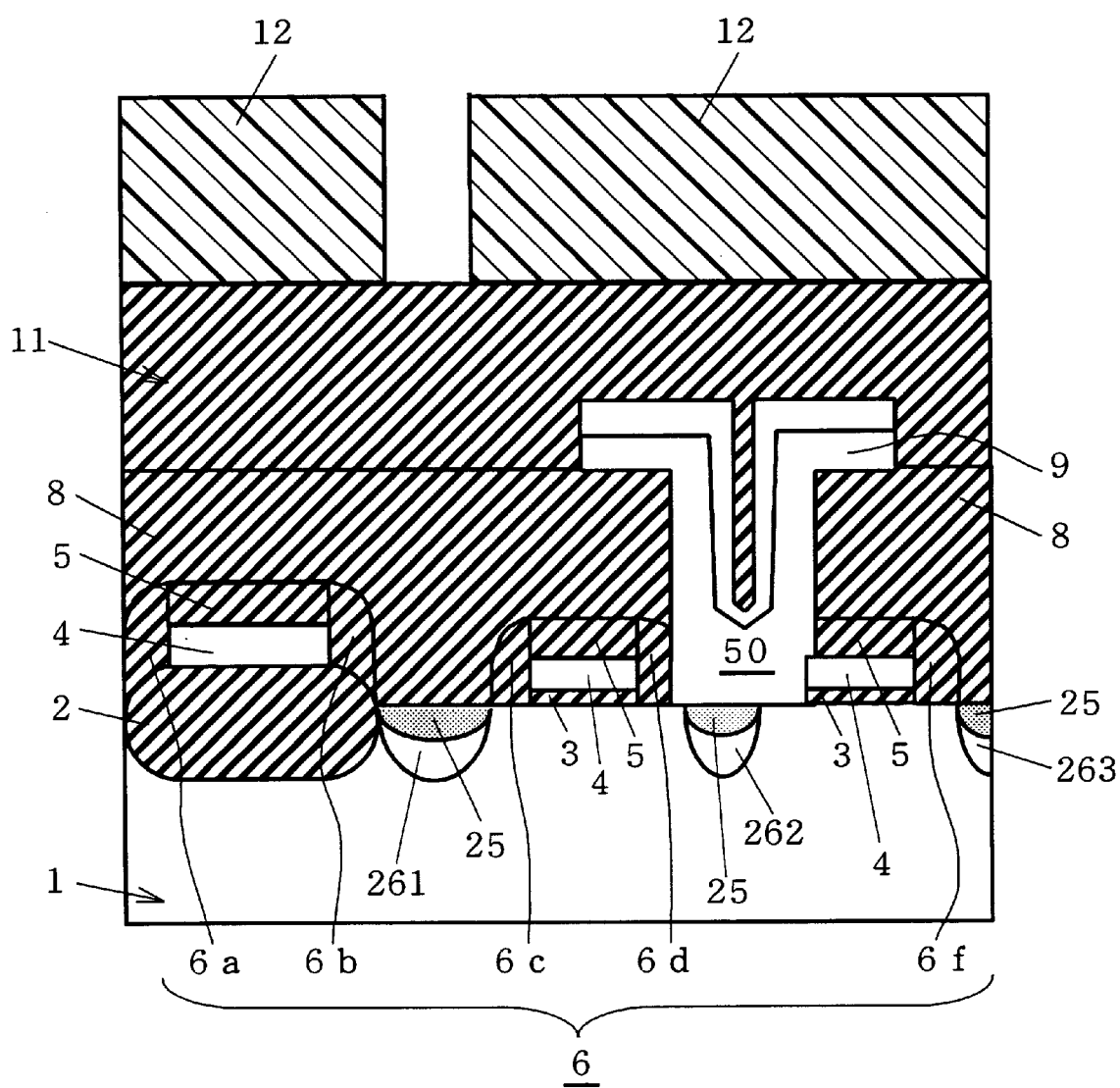
Figure 119:
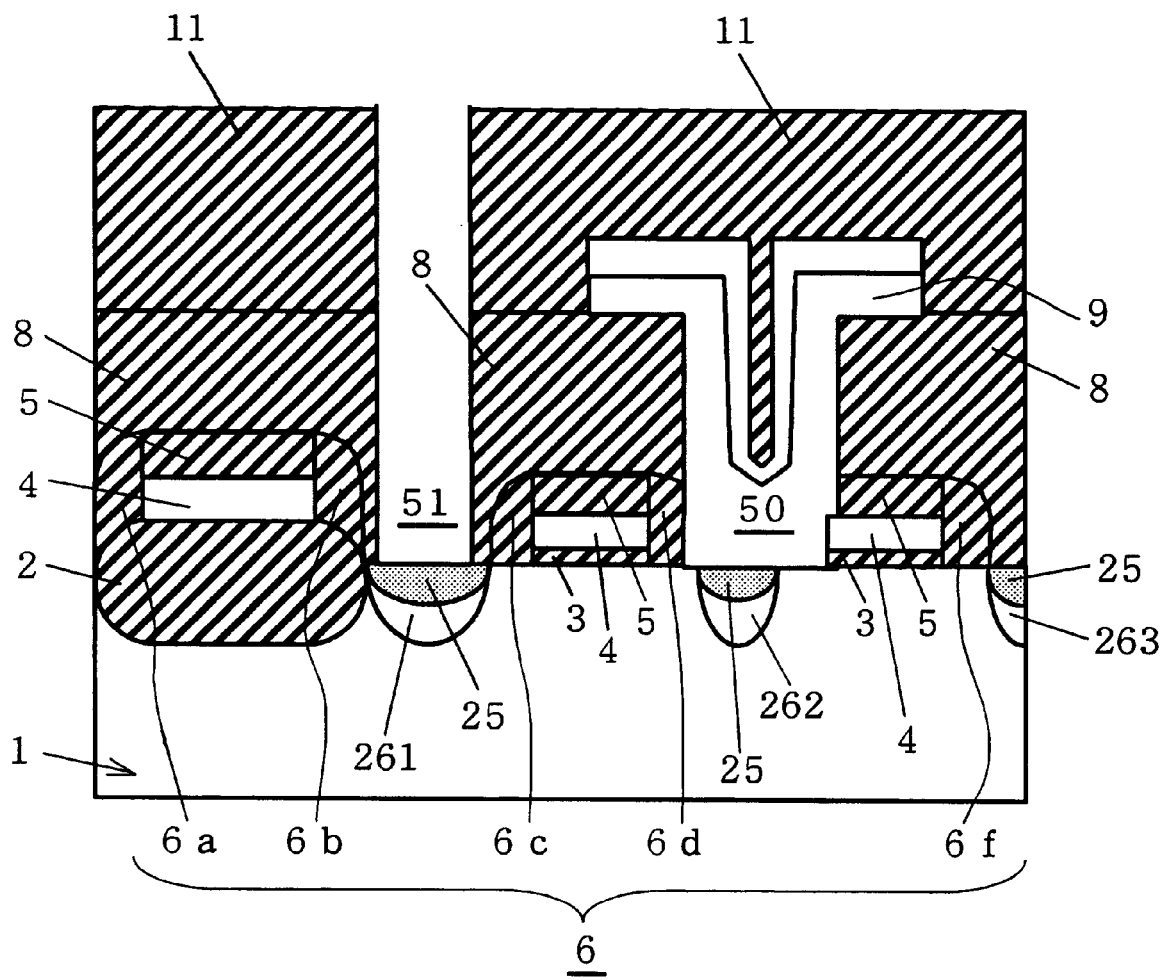
Figure 120:
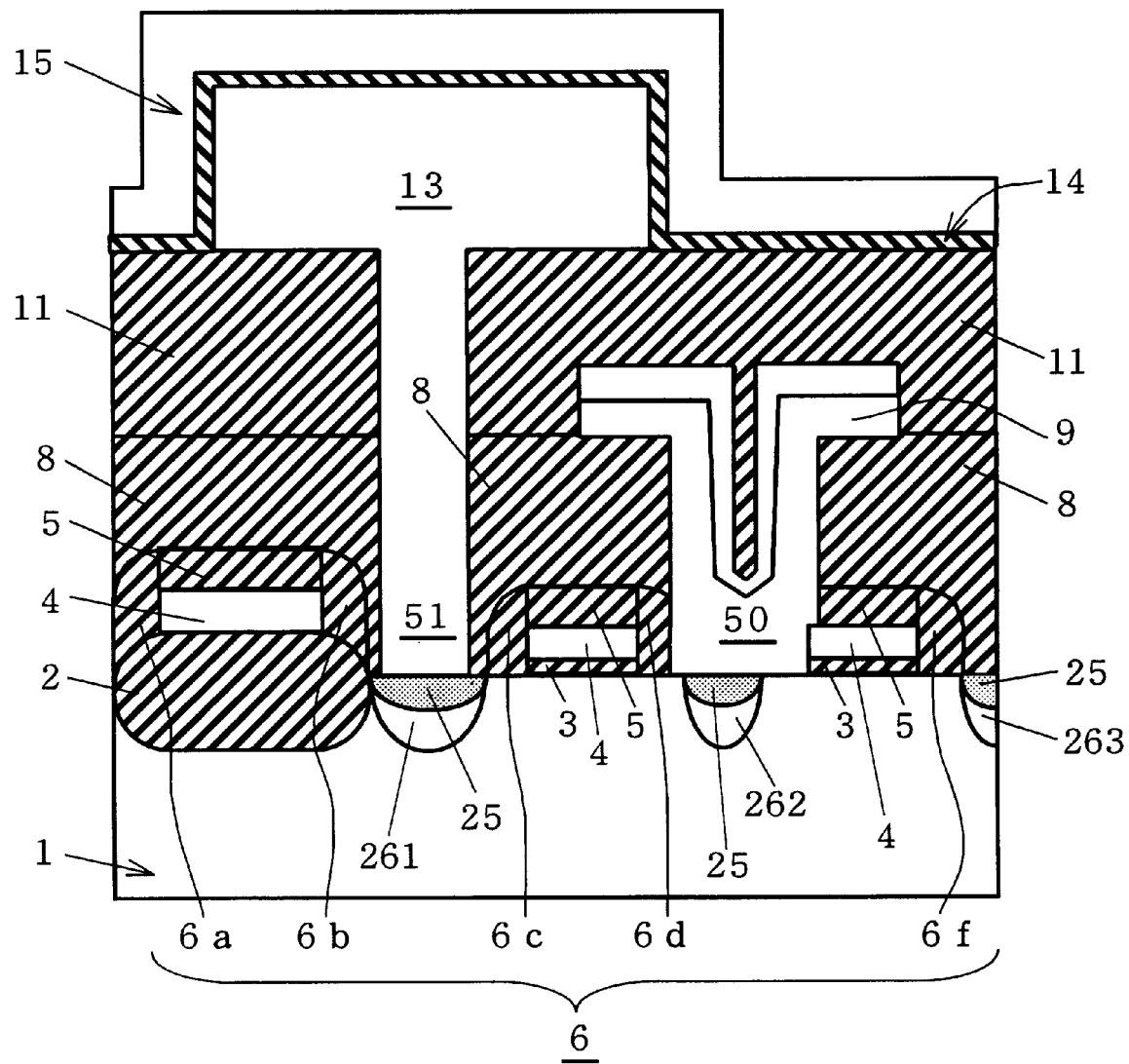
Figure 121:
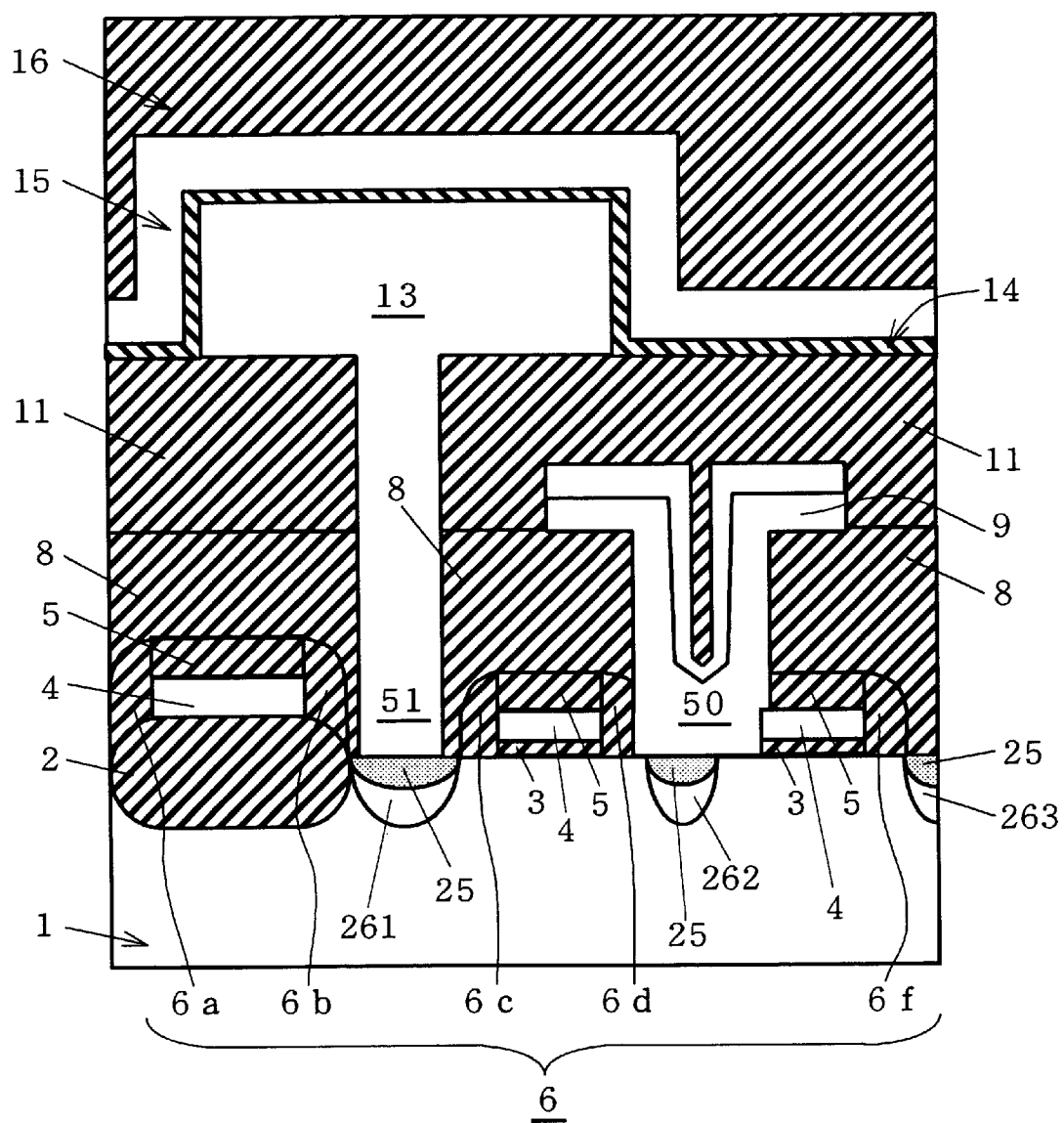
Figure 122:
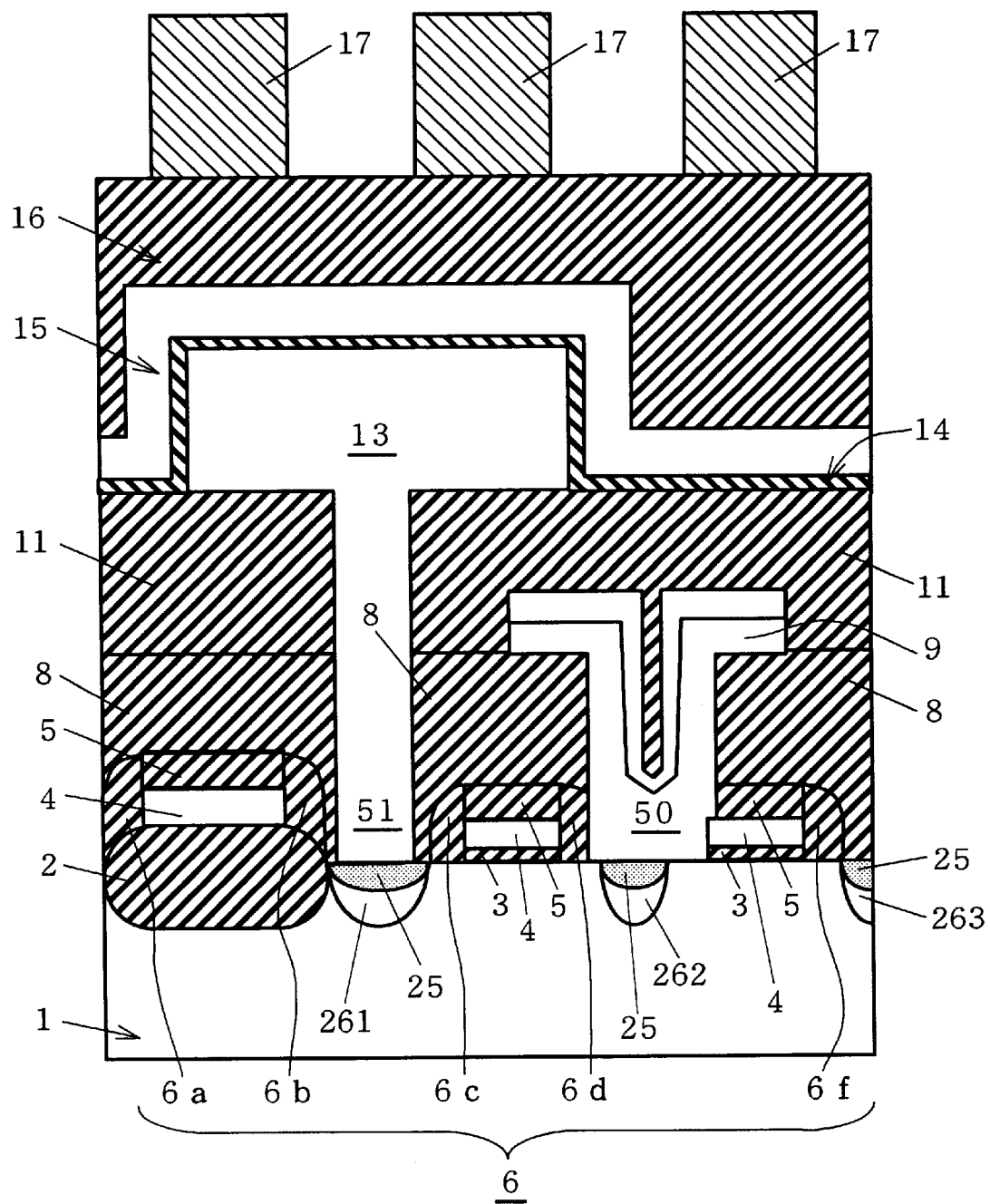

FIGS. 109 and 110 are cross-sectional views showing respective steps of the fabrication of the semiconductor device in sequential order according to an eleventh preferred embodiment of the present invention. First, the structure of FIG. 94 is provided through fabrication steps similar to those of the tenth preferred embodiment. The photoresist 21 is formed on the insulative film 7 in the memory cell region by the conventional transfer process. With the photoresist 21 used as a mask, only the insulative film 7 is etched using the $CF_4$ gas and the like. Impurities of the conductivity type opposite to that of the semiconductor substrate 1 are introduced into the semiconductor substrate 1 through the substrate protective oxide films 6r and 6s by the ion implantation technique to form the impurity diffusion layers 22 which are wider than the source/drain regions 264 and 265 (FIG. 109).

Thereafter, fabrication steps similar to those of the tenth preferred embodiment are performed until the interconnect layers 17 are formed (FIG. 110).

The conditions of the source/drain regions 264 and 265 are noted below. In the fabrication method of the tenth preferred embodiment, the semiconductor substrate 1 is overetched in two fabrication steps of forming the impurity diffusion layers 22 and forming the contact holes 53 and 54, causing the significant surface crystal defects 25. In the method of fabricating the semiconductor device according to the eleventh preferred embodiment, on the other hand, the substrate protective oxide films 6r and 6s are left when the impurity diffusion layers 22 are formed, preventing the semiconductor substrate 1 from being overetched by the etching and precluding the crystal defects 25 adjacent the surface. Thus, the method of the eleventh preferred embodiment causes a smaller amount of crystal defects 25 adjacent the source/drain regions 264 and 265 than the method of the tenth preferred embodiment, thereby suppressing the leakage currents which are induced when the interconnect layers 23 and 17 are connected respectively to the source/drain regions 264 and 265 through the contact holes 53 and 54 and which causes the device to malfunction.

While the invention has been described in detail, the foregoing description is in all aspects illustrative and not restrictive. It is understood that numerous other modifications and variations can be devised without departing from the scope of the invention.

I claim:

1. A method of fabricating a semiconductor device, comprising the steps of:

(a) selectively forming a first conductive film on a surface of a semiconductor substrate;

(b) forming a first insulative film on said first conductive film;

(c) forming a second insulative film on a structure provided by said steps (a) and (b);

(d) forming a third insulative film on said second insulative film;

(e) forming a fourth insulative film on said third insulative film;

(f) selectively and individually etching said fourth insulative film, said third insulative film, and said second insulative film in this order to expose a part of said surface of said semiconductor substrate which is located in a first position where said first conductive film is not formed, wherein etching said second insulative film forms side walls formed by unetched portions of said second insulative film contacting said first conductive film and said first insulative film on respective side surfaces of said first conductive film and said first insulative film; and (g) forming a second conductive film for electrically contacting said semiconductor substrate in said first position, wherein the etching rate of said third insulative film is lower than that of said fourth insulative film.

2. The method of claim 1, wherein said second insulative film is present in a first region located on side walls of said first conductive film and said first insulative film, and in a second region located on said surface of said semiconductor substrate except where said first conductive film is formed, and wherein the width of said second insulative film in said first region is greater than the thickness of said second insulative film in said second region.

3. The method of claim 2, further comprising the steps of:

(h) introducing a first impurity of a conductivity type opposite to that of said semiconductor substrate through said second insulative film into a part of said surface of said semiconductor substrate which is located in a second position where said first conductive film is not formed to form a first impurity region, said second position being different from said first position, said step (h) being performed between said steps (c) and (d);

(i) removing said third insulative film over said second position, said step (i) being performed between said steps (d) and (e);

(j) introducing a second impurity of the conductivity type opposite to that of said semiconductor substrate through said second insulative film into the part of said surface of said semiconductor substrate which is located in said second position to form a second impurity region, said step (j) being performed between said steps (i) and (e);

(k) etching said fourth insulative film and said second insulative film over said second position in this order in succession to expose the part of said surface of said semiconductor substrate which is located in said second position, said step (k) being performed simultaneously with said step (f); and (l) forming a third conductive film for electrically contacting said semiconductor substrate in said second position, said step (l) being performed simultaneously with said step (g), wherein said second impurity region has a wider area and a lower impurity concentration than said first impurity region.

4. The method of claim 2, further comprising the steps of:

(x) removing said third insulative film over a part of said surface of said semiconductor substrate which is located in a second position where said first conductive film is not formed, said second position being different from said first position, said step (x) being performed between said steps (d) and (e);

(y) etching said fourth insulative film and said second insulative film over said second position in this order in succession to expose the part of said surface of said semiconductor substrate which is located in said second position, said step (y) being performed after said step (e); and (z) forming a third conductive film for electrically contacting said semiconductor substrate in said second position.

5. The method of claim 4, further comprising the steps of:
(s) introducing a first impurity of a conductivity type opposite to that of said semiconductor substrate through said second insulative film into the part of said surface of said semiconductor substrate which is located in said second position to form a first impurity region, said step (s) being performed between said steps (c) and (d); and
(t) introducing a second impurity of the conductivity type opposite to that of said semiconductor substrate into the part of said surface of said semiconductor substrate which is located in said second position to form a second impurity region, said step (t) being performed between said steps (y) and (z),
wherein said second impurity region has a wider area and a lower impurity concentration than said first impurity region.

6. The method of claim 4, further comprising the steps of:
(s) introducing a first impurity of a conductivity type opposite to that of said semiconductor substrate through said second insulative film into the parts of said surface of said semiconductor substrate which are located in said first and second positions to form first impurity regions, said step (s) being performed between said steps (c) and (d); and
(t) introducing a second impurity of the conductivity type opposite to that of said semiconductor substrate into the parts of said surface of said semiconductor substrate which are located in said first and second positions to form second impurity regions, said step (t) being performed between said steps (s) and (d),
wherein said second impurity regions have a wider area and a lower impurity concentration than said first impurity regions.

7. The method of claim 2, further comprising the steps of:
(y) selectively and individually etching said fourth insulative film, said third insulative film, and said second insulative film in this order to expose a part of said surface of said semiconductor substrate which is located in a second position where said first conductive film is not formed, said second position being different from said first position, said step (y) being performed after said step (g); and
(z) forming a third conductive film for electrically contacting said semiconductor substrate in said second position.

8. The method of claim 7, further comprising the steps of:
(s) introducing a first impurity of a conductivity type opposite to that of said semiconductor substrate through said second insulative film into the part of said surface of said semiconductor substrate which is located in said second position to form a first impurity region, said step (s) being performed between said steps (c) and (d); and
(t) introducing a second impurity of the conductivity type opposite to that of said semiconductor substrate into the part of said surface of said semiconductor substrate which is located in said second position to form a second impurity region, said step (t) being performed between said steps (y) and (z),
wherein said second impurity region has a wider area and a lower impurity concentration than said first impurity region.

9. The method of claim 7, further comprising the steps of:
(s) introducing a first impurity of a conductivity type opposite to that of said semiconductor substrate through said second insulative film into the parts of said surface of said semiconductor substrate which are located in said first and second positions to form first impurity regions, said step (s) being performed between said steps (c) and (d); and
(t) introducing a second impurity of the conductivity type opposite to that of said semiconductor substrate into the parts of said surface of said semiconductor substrate which are located in said first and second positions to form second impurity regions, said step (t) being performed between said steps (s) and (d),
wherein said second impurity regions have a wider area and a lower impurity concentration than said first impurity regions.

10. The method of claim 2,
wherein a part of said surface of said semiconductor substrate which is located in a second position where said first conductive film is not formed is exposed in said step (f), said second position being different from said first position, and
wherein a third conductive film for electrically contacting said semiconductor substrate in said second position is formed in said step (g),
said method further comprising the steps of:
(h) forming a fifth insulative film for covering said second and third conductive films and said fourth insulative film, said step (h) being performed after said step (g);
(i) selectively etching said fifth insulative film to form an opening over said third conductive film; and
(j) providing a fourth conductive film electrically connected to said third conductive film through said opening of said fifth insulative film.

11. The method of claim 10, further comprising the steps of:
(s) introducing a first impurity of a conductivity type opposite to that of said semiconductor substrate through said second insulative film into the part of said surface of said semiconductor substrate which is located in said second position to form a first impurity region, said step (s) being performed between said steps (c) and (d); and
(t) introducing a second impurity of the conductivity type opposite to that of said semiconductor substrate into the part of said surface of said semiconductor substrate which is located in said second position to form a second impurity region, said step (t) being performed between said steps (y) and (z),
wherein said second impurity region has a wider area and a lower impurity concentration than said first impurity region.

12. The method of claim 10, further comprising the steps of:
(s) introducing a first impurity of a conductivity type opposite to that of said semiconductor substrate through said second insulative film into the parts of said surface of said semiconductor substrate which are located in said first and second positions to form first impurity regions, said step (s) being performed between said steps (c) and (d); and (t) introducing a second impurity of the conductivity type opposite to that of said semiconductor substrate into the parts of said surface of said semiconductor substrate which are located in said first and second positions to form second impurity regions, said step (t) being performed between said steps (s) and (d), wherein said second impurity regions have a wider area and a lower impurity concentration than said first impurity regions.

13. A method of fabricating a semiconductor device, comprising the steps of:

(a) selectively forming a first conductive film on a surface of a semiconductor substrate;

(b) forming a first insulative film on said first conductive film;

(c) forming a second insulative film on a structure provided by said steps (a) and (b), wherein etching said second insulative film forms side walls on respective side surfaces of said first conductive film and said first insulative film;

(d) forming a third insulative film on said second insulative film;

(e) selectively and individually etching said third insulative film and said second insulative film in this order to expose a part of said surface of said semiconductor substrate which is located in a first position where said first conductive film is not formed;

(f) forming a second conductive film for electrically contacting said semiconductor substrate in said first position;

(g) forming a fourth insulative film on a structure provided by said steps (a) to (f);

(h) selectively etching said fourth insulative film, said third insulative films, and said second insulative film in this order to expose a part of said surface of said semiconductor substrate which is located in a second position where said first conductive film is not formed, said second position being different from said first position, wherein at least said third insulative film and said second insulative film are individually etched; and (i) forming a third conductive film for electrically contacting said semiconductor substrate in said second position, wherein the etching rate of said second insulative film is lower than that of said third insulative film, wherein said second insulative film is present in a first region located on side walls of said first conductive film and said first insulative film, and in a second region located on said surface of said semiconductor substrate except where said first conductive film is formed, and wherein the width of said second insulative film in said first region is greater than the thickness of said second insulative film in said second region.

14. The method of claim 13, further comprising the steps of:

(s) introducing a first impurity of a conductivity type opposite to that of said semiconductor substrate through said second insulative film into the part of said surface of said semiconductor substrate which is located in said second position to form a first impurity region, said step (s) being performed between said steps (c) and (d); and (t) introducing a second impurity of the conductivity type opposite to that of said semiconductor substrate into the part of said surface of said semiconductor substrate which is located in said second position to form a second impurity region, said step (t) being performed between said steps (y) and (z), wherein said second impurity region has a wider area and a lower impurity concentration than said first impurity region.

15. The method of claim 13, further comprising the steps of:

(s) introducing a first impurity of a conductivity type opposite to that of said semiconductor substrate through said second insulative film into the parts of said surface of said semiconductor substrate which are located in said first and second positions to form first impurity regions, said step (s) being performed between said steps (c) and (d); and (t) introducing a second impurity of the conductivity type opposite to that of said semiconductor substrate into the parts of said surface of said semiconductor substrate which are located in said first and second positions to form second impurity regions, said step (t) being performed between said steps (s) and (d), wherein said second impurity regions have a wider area and a lower impurity concentration than said first impurity regions.

16. A method of fabricating a semiconductor device, comprising the steps of:

(a) selectively forming a first conductive film on a surface of a semiconductor substrate;

(b) forming a first insulative film on said first conductive film;

(c) forming a second insulative film on a structure provided by said steps (a) and (b), wherein etching said second insulative film forms side walls on respective side surfaces of said first conductive film and said first insulative film;

(d) forming a third insulative film on said second insulative film;

(e) selectively and individually etching said third insulative film and said second insulative film in this order to expose a part of said surface of said semiconductor substrate which is located in a first position where said first conductive film is not formed, wherein a part of said surface of said semiconductor substrate which is located in a second position where said first conductive film is not formed is exposed in said step (e), said second position being different from said first position;

(f) forming a second conductive film for electrically contacting said semiconductor substrate in said first position, wherein a third conductive film for electrically contacting said semiconductor substrate in said second position is formed in said step (f);

(g) forming a fourth insulative film for covering said second and third conductive films and said third insulative film, said step (g) being performed after said step (f);

(h) selectively etching said fourth insulative film to form an opening over said third conductive film; and (i) providing a fourth conductive film electrically connected to said third conductive film through said opening of said fourth insulative film, wherein the etching rate of said second insulative film is lower than that of said third insulative film, wherein said second insulative film is present in a first region located on side walls of said first conductive film and said first insulative film, and in a second region located on said surface of said semiconductor substrate except where said first conductive film is formed, wherein the width of said second insulative film in said first region is greater than the thickness of said second insulative film in said second region, and wherein the etching rate of said fourth insulative film is lower than that of said third insulative film.

17. The method of claim 16, further comprising the steps of:

(s) introducing a first impurity of a conductivity type opposite to that of said semiconductor substrate through said second insulative film into the part of said surface of said semiconductor substrate which is located in said second position to form a first impurity region, said step (s) being performed between said steps (c) and (d); and (t) introducing a second impurity of the conductivity type opposite to that of said semiconductor substrate into the part of said surface of said semiconductor substrate which is located in said second position to form a second impurity region, said step (t) being performed between said steps (y) and (z), wherein said second impurity region has a wider area and a lower impurity concentration than said first impurity region.

18. The method of claim 16, further comprising the steps of:

(s) introducing a first impurity of a conductivity type opposite to that of said semiconductor substrate through said second insulative film into the parts of said surface of said semiconductor substrate which are located in said first and second positions to form first impurity regions, said step (s) being performed between said steps (c) and (d); and (t) introducing a second impurity of the conductivity type opposite to that of said semiconductor substrate into the parts of said surface of said semiconductor substrate which are located in said first and second positions to form second impurity regions, said step (t) being performed between said steps (s) and (d), wherein said second impurity regions have a wider area and a lower impurity concentration than said first impurity regions.

* * * * *